United States Patent
Hayakawa et al.

(10) Patent No.: US 8,482,958 B2
(45) Date of Patent: Jul. 9, 2013

(54) CURRENT STEERING ELEMENT, MEMORY ELEMENT, MEMORY, AND METHOD OF MANUFACTURING CURRENT STEERING ELEMENT

(75) Inventors: Yukio Hayakawa, Kyoto (JP); Koji Arita, Osaka (JP); Takumi Mikawa, Shiga (JP); Takeki Ninomiya, Osaka (JP)

(73) Assignee: Panasonic Corporation, Osaka (JP)

( * ) Notice: Subject to any disclaimer, the term of this patent is extended or adjusted under 35 U.S.C. 154(b) by 78 days.

(21) Appl. No.: 13/321,018

(22) PCT Filed: Mar. 10, 2011

(86) PCT No.: PCT/JP2011/001401
§ 371 (c)(1),
(2), (4) Date: Nov. 17, 2011

(87) PCT Pub. No.: WO2011/114666
PCT Pub. Date: Sep. 22, 2011

(65) Prior Publication Data
US 2012/0069632 A1 Mar. 22, 2012

(30) Foreign Application Priority Data
Mar. 18, 2010 (JP) .................. 2010-063195

(51) Int. Cl.
*G11C 11/00* (2006.01)
(52) U.S. Cl.
USPC ............ 365/148; 365/46; 365/151; 365/174; 365/150
(58) Field of Classification Search
USPC ............ 365/148, 46, 151, 174, 150
See application file for complete search history.

(56) References Cited

U.S. PATENT DOCUMENTS

| | | | |
|---|---|---|---|
| 4,871,234 A | 10/1989 | Suzuki | |
| 5,048,930 A | 9/1991 | Kuroda | |
| 6,005,260 A | 12/1999 | Van Roosmalen et al. | |

(Continued)

FOREIGN PATENT DOCUMENTS

| | | |
|---|---|---|
| JP | 57-66818 | 4/1982 |
| JP | 61-260219 | 11/1986 |

(Continued)

OTHER PUBLICATIONS

International Search Report issued May 24, 2011 in corresponding International Application No. PCT/JP2011/001401.

(Continued)

*Primary Examiner* — Viet Q Nguyen
(74) *Attorney, Agent, or Firm* — Wenderoth, Lind & Ponack, L.L.P.

(57) ABSTRACT

Provided is a current steering element that can prevent write didturb even when an electrical pulse with different polarities is applied and that can cause a large current to flow through a variable resistance element. The current steering element includes a first electrode (32), a second electrode (31), and a current steering layer (33). The current steering layer (33) comprises $SiN_x$ (where $0 < x \leq 0.85$) added with hydrogen or fluorine. When D ($D = D_0 \times 10^{22}$ atoms/cm$^3$) represents a density of hydrogen or fluorine, d (nm) represents a thickness of the current steering layer (33), and $V_0$ (V) represents a maximum value applicable to between the first electrode (32) and the second electrode (31), D, x, d, and $V_0$ satisfy the following Formulae.

$$(\ln(10000(C \cdot \exp(\alpha \cdot d) \exp(\beta \cdot x))^{-1}) \gamma)^2 \leq V_0$$

$$(\ln(1000(C \cdot \exp(\alpha \cdot d) \exp(\beta \cdot x))^{-1}) \gamma)^2 - (\ln(10000(C \cdot \exp(\alpha \cdot d) \exp(\beta \cdot x))^{-1}) \gamma)^2 / 2 \geq 0$$

wherein $C = k1 \times D_0^{k2}$, and $\alpha$, $\beta$, $\gamma$, k1, and k2 are constants.

7 Claims, 27 Drawing Sheets

U.S. PATENT DOCUMENTS

| | | | |
|---|---|---|---|
| 7,629,198 B2 * | 12/2009 | Kumar et al. | 438/104 |
| 7,678,607 B2 * | 3/2010 | Chiang et al. | 438/104 |
| 8,062,918 B2 * | 11/2011 | Miller et al. | 438/45 |
| 8,274,066 B2 * | 9/2012 | Miller et al. | 257/4 |
| 8,288,297 B1 * | 10/2012 | Wang et al. | 438/785 |
| 8,351,244 B2 * | 1/2013 | Okada et al. | 365/148 |
| 2004/0202041 A1 | 10/2004 | Hidenori | |
| 2009/0027328 A1 | 1/2009 | Johnson et al. | |
| 2009/0052225 A1 | 2/2009 | Morimoto | |
| 2011/0002155 A1 | 1/2011 | Arita et al. | |

FOREIGN PATENT DOCUMENTS

| | | |
|---|---|---|
| JP | 2-193123 | 7/1990 |
| JP | 5-235040 | 9/1993 |
| JP | 7-175419 | 7/1995 |
| JP | 2004-319587 | 11/2004 |
| JP | 2006-203098 | 8/2006 |
| JP | 2008-511036 | 4/2008 |
| WO | 2010/004675 | 1/2010 |

OTHER PUBLICATIONS

Mitsumasa Iwamoto et al., Ohm-sha, EE Text, Denki denshi zairyo kogaku, Sep. 25, 2004, pp. 140-141 (with English translation).

R. Kärcher et al., "Electronic structure of Hydrogenated and unhydrogenated amorphous $SiN\chi(0 \leqq \chi\ 0 \leqq 1.6)$: A photoemission study", Physical Review B, vol. 30, No. 4, Aug. 15, 1984, pp. 1896-1910.

* cited by examiner

Current-Voltage Characteristics of Current Steering Element (Electrode Material: TaN)

Current-Voltage Characteristics of Current Steering Element
(Electrode Material: W)

Current-Voltage Characteristics of Current Steering Element
(Solid Line: Measured Value, Broken Line: Calculated Value)

Hydrogen Density : $1.0 \times 10^{+22}$ (atoms/cm$^3$) Addition

Hydrogen Density : $2.0 \times 10^{+22}$ (atoms/cm$^3$) Addition

CURRENT STEERING ELEMENT, MEMORY ELEMENT, MEMORY, AND METHOD OF MANUFACTURING CURRENT STEERING ELEMENT

TECHNICAL FIELD

The present invention relates to (a) current steering elements used in nonvolatile memory elements suitable for high integration and high speed, (b) the memory elements, (c) a memory in which the memory elements are arranged in a matrix, and (d) methods of manufacturing the current steering elements. More particularly, the present invention relates to (a) current steering elements used in nonvolatile memory elements to which data is written by pulsing with different polarities, (b) the memory elements, (c) a memory in which the memory elements are arranged in a matrix, and (d) a method of manufacturing the current steering elements.

BACKGROUND ART

In recent years, with the development of digital technologies, electronic devices such as portable information devices and information home appliances have further been sophisticated. As these electronic devices are sophisticated, nonvolatile memories used in the devices are rapidly developed to achieve size increase, higher integration, and higher speed. Furthermore, applications of the nonvolatile memories are dramatically increased.

An example of these applications is a memory in which nonvolatile variable resistance elements serving as memory elements are arranged in a matrix. The memory is expected to be a three-dimensional memory with still further size increase, higher integration, and higher speed.

Each of the nonvolatile variable resistance elements has a thin layer (film) made mainly of a metal oxide. By pulsing the thin layer, an electrical resistance value of the thin layer is changed and the thin layer keeps the resulting electrical resistance value. Therefore, if binary data represent a high resistance state and a low resistance state of the thin layer, for example, "1" represents the high resistance state and "0" represents the low resistance state, it is possible to write such binary data into the variable resistance element. Here, (a) a current density caused by pulsing the thin layer in the variable resistance element and (b) a size of an electrical field produced by the pulsing are set to be enough to change the physical state of the thin layer without damaging it.

Such a variable resistance element expressing binary values is classified into (a) a so-called unipolar variable resistance element having a resistance value that is changed by pulsing with one polarity and different voltages, or (b) a so-called bipolar variable resistance element having a resistance value that is changed by pulsing with different polarities. In general, the unipolar variable resistance element has characteristics of having a longer writing time in a so-called resetting process for changing the variable resistance element from a low resistance state to a high resistance state, than in a so-called setting process for changing the variable resistance element from a high resistance state to a low resistance state. On the other hand, the bipolar variable resistance element has a short writing time both in the setting process and in the resetting process.

In a so-called crosspoint memory, variable resistance elements are arranged on respective crosspoints between word lines and bit lines. The word lines and bit lines are at right angles to each other without contact. The crosspoint memory sometimes has a trouble (hereinafter, referred to as "write disturb") when data is written to a selected target variable resistance element. In the write didturb, sneak current is occurred to change electrical resistance values of other non-selected variable resistance elements. Therefore, it is necessary to provide a special structure in the cross point memory in order to prevent write didturb.

In the unipolar variable resistance element, resistance of the variable resistance element is changed by pulsing with one polarity. Therefore, write didturb can be prevented by arranging unipolar current steering elements in series in the variable resistance element. Examples of the unipolar current steering elements are p-n junction diodes and Schottky diodes. The unipolar current steering elements have non-linear voltage-current characteristics in which the unipolar current steering elements have a high resistance state and a low resistance state at a voltage ranging in the same polarity. In other words, the unipolar current steering elements have non-linear voltage-current characteristics which allow data to be read from or write into a selected target unipolar variable resistance element in a certain voltage range having voltage-current characteristics of a low resistance state.

There have been disclosed a memory that is capable of preventing write didturb, including series circuits in each of which a variable resistance element and a Schottky diode (current steering element) are connected in series with each other (see Patent Literature 1, for example).

Regarding the disclosed memory, the Schottky diode prevents sneak current from flowing into the variable resistance element in each of memory elements except a selected target memory element to which data is to be written. As a result, the crosspoint memory can prevent write didturb. Here, in the memory disclosed in Patent Literature 1, data is written to a target variable resistance element by pulsing with one polarity to the target variable resistance element. Therefore, the Schottky diode connected in series with the target variable resistance element prevents disturbance on the data writing.

On the other hand, regarding the bipolar variable resistance elements, a bipolar electrical pulse is applied to a target variable resistance element in order to write data into the target element. Therefore, it is a bipolar current steering element to be arranged in series with the target variable resistance element. The bipolar current steering elements have non-linear voltage-current characteristics in which the bipolar current steering elements have a high resistance state in a voltage range of a positive polarity and a low resistance state in a voltage range of a negative polarity. In general, the bipolar current steering elements is in a high resistance state in a voltage range where an absolute value of an applied voltage is smaller than a predetermined threshold value, and is in a low resistance state in a voltage range where the absolute value exceeds the threshold value. Examples of the bipolar current steering elements having such characteristics are two-terminal elements such as a Metal-Insulator-Metal (MIM) diode, a Metal-Semiconductor-Metal (MSM) diode, and a varistor.

FIGS. 39A and 39B are graphs schematically plotting current-voltage characteristics of a current steering element. FIG. 39A shows current-voltage characteristics of a bipolar current steering element such as a MIM diode, a MSM diode, or a varistor. FIG. 39B shows current-voltage characteristics of a Schottky diode.

As shown in FIG. 39B, a Schottky diode shows non-linear electrical resistance characteristics, but current-voltage characteristics regarding respective polarities of applied voltage are not symmetrical at all.

On the other hand, as shown in FIG. 39A, a two-terminal element, such as a MIM diode, a MSM diode, or a varistor, shows non-linear electrical resistance characteristics, and current-voltage characteristics regarding respective polarities of applied voltage are actually symmetrical. More specifically, the two-terminal element has characteristics in which current variation caused by positive voltage application and current variation caused by negative voltage application are symmetrical with respect to an origin 0. Moreover, the two-terminal element has very high electrical resistance in a voltage range (namely, range C) where an applied voltage is equal to or lower than a first critical voltage (lower-limit voltage in a range A) and equal to or higher than a second critical voltage (upper-limit voltage in a range B). On the other hand, if the applied voltage exceeds the first critical voltage or is lower than the second critical voltage, the electrical resistance of the two-terminal element is rapidly decreased. More specifically, the two-terminal element has non-linear electrical resistance characteristics in which large current flows through a selected variable resistance element when the applied voltage exceeds the first critical voltage or is lower than the second critical voltage.

Therefore, if such two-terminal elements are used as bipolar current steering elements, it is possible to prevent write didturb in a crosspoint nonvolatile memory including bipolar variable resistance elements capable of performing high-speed operation both in the setting process and in the resetting process.

Meanwhile, in the variable resistance memory, when data is to be written to a target variable resistance element, the variable resistance element is pulsed to change its electrical resistance value. Therefore, the variable resistance element becomes in a high resistance state or in a low resistance state. In general, it is necessary to allow relatively large current to flow through the variable resistance element to change the resistance state, although the current mount depends heavily on a material, structure, and the like of the variable resistance element. For example, regarding processing performed in a memory including variable resistance elements, there has been disclosed a technology of using a varistor to allow current of a current density of 30000 $A/cm^2$ or more to flow through variable resistance element to write data into the variable resistance element (see Patent Literature 2, for example). In recent years, various examinations have been conducted to reduce current required to write data into a variable resistance element. As a result, it is presently considered that a current density of current required to write data into a variable resistance element is not always 30000 $A/cm^2$ or more. However, it is common that a relatively large current in a range from 10000 $A/cm^2$ to tens of thousand of $A/cm^2$ is required to the data writing.

CONVENTIONAL TECHNOLOGIES

Patent Literatures

Patent Literature 1: Japanese Unexamined Patent Application Publication No. 2004-319587
Patent Literature 2: Japanese Unexamined Patent Application Publication No. 2006-203098

DISCLOSURE OF INVENTION

Problems that Invention is to Solve

As disclosed in Patent Literature 2, the above-described bipolar current steering elements are necessary to implement a crosspoint nonvolatile memory that uses bipolar variable resistance elements capable of high-speed processing. In general, it is necessary to allow large current (current of 30000 $A/cm^2$ or more in Patent Literature 2) to flow through the variable resistance elements.

However, the MIM diode has a structure in which an insulation film is provided between electrodes. Therefore, it is impossible to allow too large current to flow through the MIM diode having such a structure. The varistor also has a problem. The varistor has rectification characteristics due to characteristics of a crystal grain boundary of a material between the electrodes. Therefore, if the varistors are used as current steering elements in a multilayer memory or the like, characteristics of the current steering elements are varied. On the other hand, the MSM diode has a structure in which a semiconductor layer is provided between metal electrodes. Since the MSM diode has such a semiconductor layer having low resistance, it is expected that larger current can flow through the MSM diode than in the MIM diode. Furthermore, the MSM diode does not have characteristics of crystal grain boundary or the like as those in the varistor. The MSM diode therefore hardly depends on heat history or the like in manufacturing process. As a result, the MSM diodes are expected to serve as current steering elements that are not varied.

The MSM diode has electric characteristics that are varied depending on (a) a work function of the metal electrodes and (b) a composition or a thickness of the semiconductor current steering layer. For example, in the case of a MSM diode in which a $SiN_x$ layer is provided between electrodes, $SiN_x$ represents so-called silicon nitride and a value of x represents a degree of nitriding. Here, electrical conduction characteristics of $SiN_x$ are varied depending heavily on the value of x.

Moreover, a thickness of the $SiN_x$ layer influences the electric characteristics of the MSM diode. Results of evaluating preproduction MSM diode specimens show the following tendency. In the case where the same voltage is applied to both ends of each of MSM diode specimens, larger current can flow into a MSM diode having a thinner $SiN_x$ layer, if a value of x is the same among the specimens. A current steering element including the $SiN_x$ layer as a current steering layer is suitable to be used with a bipolar variable resistance element, because such a current steering element allows large current to flow through the bipolar variable resistance element.

Meanwhile, in a memory in which memory elements are arranged in a matrix, a total amount of sneak current flowing through non-selected memory elements in the memory is varied depending on the number of all memory elements arranged in the memory (in other words, depending on a memory capacity). For example, in the case of a memory in which M bit lines and M word lines are arranged in a matrix, the number of non-selected memory elements in the memory is (M−1) on a selected bit line and (M−1) on a selected word line. Therefore, a total amount of sneak current flowing through the memory is calculated by multiplying sneak current flowing through one non-selected memory element by about 2×(M−1). Therefore, as the memory device has more capacity, the total amount of sneak current flowing through non-selected memory elements in the memory is increased, and current available to flow through a variable resistance element in the selected memory element is reduced.

According to the voltage-current characteristics of a bipolar current steering element such a MIM diode, a MSM diode, or a varistor, which are shown in FIG. 39A, in reality, a slight amount of current flows even in a region of the voltage range C. It means that the current steering element fails to completely prevent sneak current. Therefore, the current steering element in the memory element is required to reduce current flowing in the region of the voltage range C in FIG. 39A.

Hereinafter, the current flowing in the region of the voltage range C is referred to as "leak current" or "OFF current".

As described above, the current steering element in the crosspoint nonvolatile memory has the following challenges. It is demanded to supply an enough amount of current to a variable resistance element in a selected memory element in order to change resistance of the variable resistance element. At the same time, it is demanded to minimize sneak current flowing through non-selected memory elements. In other words, an amount of current flowing in a region of the voltage ranges A and B in FIG. 39A (the current is referred also to "ON current") is required to increase enough to change resistance of the target variable resistance element. In addition, current flowing in the region of the voltage range C is required to be minimized. In other word, so-called on-off characteristics (namely, a ratio of ON current to OFF current) should be improved. The on-off characteristics improvement in the current steering element results in increase of the number of memory elements that are allowed to be arranged in one memory (namely, a memory capacity). As a result, it is possible to decrease a cost in manufacturing the memory.

Therefore, it is demanded to develop a current steering element (a) that includes a $SiN_x$ layer as a current steering layer so that large current can flow through the current steering element, and (b) that can prevent write didturb.

Thus, the present invention addresses to overcome the problems of the conventional techniques as described above. It is an object of the present invention to provide a current steering element or the like that is capable of preventing write didturb even when an electrical pulse with different polarities is applied, and that is capable of allowing large current to flow through a variable resistance element connected in series with the current steering element.

Means to Solve the Problems

In order to solve the above conventional problems, in a MSM diode in which a current steering layer is provided between electrodes, the current steering layer comprising $SiN_x$ (where $0<x\leq 0.85$) is added with high-concentrated hydrogen or fluorine, so that electric characteristics of the MSM diode are changed. For example, in the case where the same voltage is applied to both ends of the MSM diode under the conditions that a thickness of the $SiN_x$ current steering layer is the same and that a value of x is the same, greater density of the added hydrogen or fluorine can reduce more leak current, and can reduce more sneak current flowing through non-selected memory elements when data is written into a variable resistance element in a selected memory element.

More specifically, in accordance with an aspect of the present invention for solving the above problem, there is provided a current steering element that controls a current flowing when an electrical pulse with positive and negative polarities is applied, said current steering element comprising: a first electrode; a second electrode; and a current steering layer provided between said first electrode and said second electrode, wherein said current steering layer comprises: $SiN_x$ (where $0<x\leq 0.85$); and one of hydrogen and fluorine, and when D ($D=D_0\times 10^{22}$ atoms/cm$^3$) represents a density of the one of hydrogen and fluorine, d (nm) represents a thickness of said current steering layer, $V_0$ (V) represents a maximum value applicable to both of said first electrode and said second electrode, and x, D, d, and $V_0$ satisfy Formulae (1) and (2):

$$(\ln(10000(C\cdot\exp(\alpha\cdot d)\exp(\beta\cdot x))^{-1})\gamma)^2 \leq V_0 \tag{1}$$

$$(\ln(1000(C\cdot\exp(\alpha\cdot d)\exp(\beta\cdot x))^{-1})\gamma)^2 - (\ln(10000(C\cdot\exp(\alpha\cdot d)\exp(\beta\cdot x))^{-1})\gamma)^2/2 \geq 0 \tag{2}$$

wherein $C=k1\times D_0^{k2}$, $\alpha=-6.25\times 10^{-1}$, $\beta=-11.7$, $\gamma=9.76$, and k1 and k2 are constants. Here, $SiN_x$ represents so-called silicon nitride and a value of x represents a degree of nitriding.

With the above structure, the added hydrogen or fluorine having a predetermined density or more can terminate energy levels (so-called interface energy levels) existing on the interfaces between the first electrode and the current steering layer and between the second electrode and the current steering layer. As a result, a leak current caused by the interface energy level can be reduced. It is therefore possible to further reduce a sneak current flowing through non-selected memory elements when data is written into a variable resistance element in the selected memory element.

It is possible that said current steering layer comprises hydrogen, and $k1=5.23\times 10^{-4}$, and $k2=-5.26$. It is preferable that the density D of the hydrogen satisfies $0.75\times 10^{22}$ (atoms/cm$^3$) $\leq D \leq 2.0\times 10^{22}$ (atoms/cm$^3$). With the above structure, a density of the hydrogen added to the current steering layer is adjusted to be within the above-described range, so that the adjusted hydrogen can most efficiently terminate the energy level existing on the interfaces between the first electrode and the current steering layer and between the second electrode and the current steering layer and that a leak current caused by the interface energy level can be controlled. As a result, the current steering element according to the aspect of the present invention can prevent write didturb even when an electrical pulse with different polarities is applied. Furthermore, the current steering element can cause an enough current to flow through the selected variable resistance element to change its resistance. Moreover, the current steering element can cause non-selected variable resistance elements to have characteristics in which a leak current can be suppressed as much as possible.

It is also preferable that the thickness d is 5 nm or more. With the above structure, it is possible to adequately suppress a leak current caused by tunnel effects and therefore stabilize the characteristics of the current steering element.

It is further preferable that the thickness d ranges from 5 nm to 30 nm. It is still further preferable that the maximum $V_0$ of the voltage applicable between said first electrode and said second electrode is 5 V or less.

In accordance with another aspect of the present invention, there is provided a memory element comprising: a nonvolatile variable resistance element having an electrical resistance value varying when an electrical pulse with one of a positive polarity and a negative polarity is applied; and said current steering element according to any one of claims 1 to 6, said current steering element being connected in series to said nonvolatile variable resistance element to control a current flowing through said nonvolatile variable resistance element when the electrical pulse is applied to said nonvolatile variable resistance element. With the above structure, it is possible to further reduce a sneak current flowing through non-selected memory elements when data is written into a selected memory element. The structure prevents write didturb in the memory element according to the aspect of the present invention or in a memory including the memory elements. Therefore, the structure is further preferable in actual operations.

In accordance with still another aspect of the present invention, there is provided a method of manufacturing a current steering element that controls a current flowing when an electrical pulse with positive and negative polarities is applied, said method comprising: forming a first electrode above a semiconductor substrate; forming a current steering layer on said first electrode, the current steering layer comprising $SiN_x$ (where $0<x\leq 0.85$); adding one of hydrogen and fluorine to the current steering layer from a top surface of the current steering layer; and forming a second electrode on the current steering layer. By the method of manufacturing a current steering element according to the aspect of the present invention, the added hydrogen or fluorine can terminate the energy levels existing on the interfaces between the first electrode and the current steering layer and between the second electrode and the current steering layer. As a result, it is possible to provide a current steering element that can further reduce a leak current flowing through non-selected memory elements when data is written into a variable resistance element in a selected memory element.

It is preferable in the manufacturing method in accordance with the above aspect of the present invention that, in said adding, the one of hydrogen and fluorine is energized into plasma and irradiated on the current steering layer. By the method of manufacturing a current steering element according to the aspect of the present invention, it is possible to add a large amount of hydrogen or fluorine energized in a metastable state (so-called radical state) into the current steering layer from the top surface of the current steering layer. As a result, the energy level existing on the interfaces between the first electrode and the current steering layer and between the second electrode and the current steering layer can be terminated at a low temperature and for a short time. Therefore, it is possible to control a heat history in manufacturing processes of the current steering element.

In accordance with still another aspect of the present invention, there is provided a method of manufacturing a current steering element, the current steering element including: a first electrode; a second electrode; and a current steering layer comprising $SiN_x$ provided between the first electrode and the second electrode, the current steering element controlling a current flowing when an electrical pulse with a positive polarity and a negative polarity is applied, and said method comprising: determining (a) a thickness d (nm) of the current steering layer, (b) the nitrogen composition ratio x, and (c) a density D (where $D=D_0 \times 10^{22}$ atoms/cm$^3$) of one of hydrogen and fluorine added to the current steering layer; and manufacturing the current steering element according to the thickness d, the nitrogen composition ratio x, and the density D which are determined in said determining, wherein said determining includes: determining (d) a minimum current density $J_{min}$ (A/cm$^2$) of a current to be flown through the current steering element, (e) a maximum current density $J_{off}$ (A/cm$^2$) of a current allowed to flow through the current steering element in a blocking state, and (f) a maximum value $V_0$ (V) of a voltage applicable between the first electrode and the second electrode; and determining (a) the thickness d, (b) the nitrogen composition ratio x, and (c) the density D ($=D_0 \times 10^{22}$ atoms/cm$^3$) all of which satisfy Formulae (3) and (4), based on (d) the minimum current density $J_{min}$, (e) the maximum current density $J_{off}$, and (f) the maximum value $V_0$ (V) of the voltage:

$$(\ln(J_{min}(C \cdot \exp(\alpha \cdot d)\exp(\beta \cdot x))^{-1})\gamma)^2 \leq V_0 \quad (3)$$

$$(\ln(J_{off}(C \cdot \exp(\alpha \cdot d)\exp(\beta \cdot x))^{-1})\gamma)^2 - (\ln(J_{min}(C \cdot \exp(\alpha \cdot d)\exp(\beta \cdot x))^{-1})\gamma)^2/2 \geq 0 \quad (4)$$

where $C=k1 \times D_0^{k2}$, $\alpha=-6.25 \times 10^{-1}$, $\beta=-11.7$, $\gamma=9.76$, and k1 and k2 are constants.

With the above structure, the current steering element according to the aspect of the present invention can produce rectification by potential barriers between the first electrode and the current steering layer and between the second electrode and the current steering layer. In addition, the current steering element can prevent write didturb even when an electrical pulse with different polarities is applied. Furthermore, the current steering element can gain characteristics in which the current steering element can (i) allow an enough amount of current to flow through a selected variable resistance element to change resistance of the selected variable resistance element, and (ii) prevent a current from flowing into non-selected variable resistance elements to change their resistance.

Moreover, the present invention can be implemented also as a memory including a plurality of the above-described memory elements.

Effects of the Invention

The current steering element, the memory element, the memory, and the method of manufacturing the current steering element according to the present invention are capable of preventing write didturb even when an electrical pulse with different polarities is applied, and also capable of allowing large current to flow through the variable resistance element. As a result, the present invention can provide the current steering element, the memory element, the memory, and the method of manufacturing the current steering element which make it possible to perform data writing without any problems.

BEST MODE FOR CARRYING OUT THE INVENTION

Figure 1:
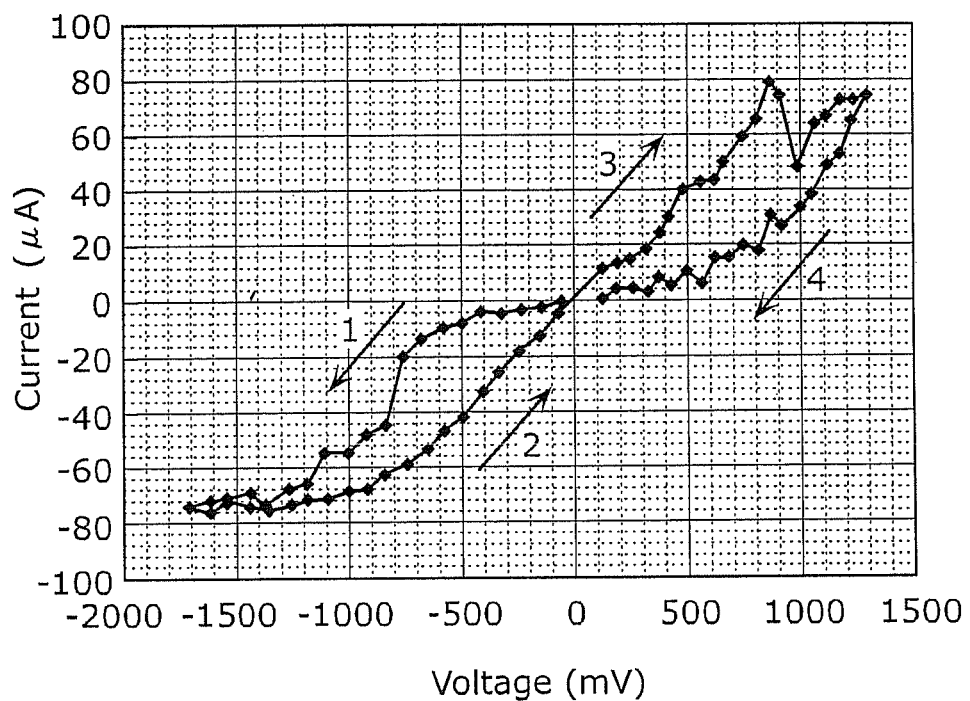
FIG. 1 is a graph plotting results of measuring current-voltage characteristics of a variable resistance element comprising a tantalum oxide as a variable resistance material.

First, the detailed description is given for a structure of each of variable resistance elements included in a memory according to an embodiment of the present invention.

Each of the variable resistance elements has a structure in which a thin layer (hereinafter, referred to as a "variable resistance thin layer") mainly made of a variable resistance material is provided between a pair of electrodes facing each other. When a predetermined electrical pulse is applied to the variable resistance thin layer, a state of the variable resistance thin layer is changed between a predetermined low resistance state (hereinafter, referred to simply as a "low resistance state") and a predetermined high resistance state (hereinafter, referred to simply as a "high resistance state"). Here, the variable resistance thin layer is kept in the resulting changed state until a predetermined electrical pulse is applied. In the present embodiment, each of the low resistance state and the high resistance state is assigned with binary data "0" or "1". In order to change the variable resistance thin layer between the low resistance state and the high resistance state, the variable resistance thin layer is pulsed with different polarities. A variable resistance material used for the variable resistance thin layer may be perovskite metal oxide, representative metal oxide, transition metal oxide, or the like.

More specifically, examples of the variable resistance material used for the variable resistance thin layer are $Pr_{(1-x)}Ca_xMnO_3$ (where $0<x<1$), $TiO_2$, $NiO_x$ (where $0<x<1$), $ZrO_x$ (where $0<x<2$), $FeO_x$ ($0<x<1.5$), $CuO_x$ (where $0<x<1$), $AlO_x$ (where $0<x<1.5$), $TaO_x$ (where $0<x<2.5$), and the like. Moreover, other examples of the variable resistance material are a substitution of each of the above materials, a mixture from the above materials, a multilayer structure from the above materials, and the like. Of course, the variable resistance material is not limited to the above examples.

Next, the description is given for a method of manufacturing the variable resistance element included in the memory element according to the present embodiment of the present invention.

In order to manufacture the variable resistance element, on a principal surface of a predetermined substrate, sequentially formed are an electrode (hereinafter, referred to as a "lower electrode"), then the variable resistance thin layer, and then an electrode (hereinafter, referred to as an "upper electrode") to face the lower electrode. First, a method of forming the lower electrode is described. Conditions for forming the lower electrode depend on a material and the like of the lower electrode. For example, in the case of the lower electrode comprising platinum (Pt), the lower electrode is formed by DC magnetron sputtering in which platinum is utilized as target, at a pressure of 0.5 Pa, a DC power of 200 W, and a flow rate of argon (Ar) of 6 sccm, and for a time period adjusted to result in a platinum layer having a thickness ranging from 20 nm to 100 nm. Here, the method of forming the lower electrode is not limited to sputtering. The method may be so-called Chemical Vapor Deposition (CVD) method, a spin coat method, or the like.

Next, the variable resistance thin layer is formed on a principal surface of the lower electrode. The method of forming the variable resistance thin layer also depends on a material and the like of the variable resistance thin layer. For example, in the case of the variable resistance thin layer comprising a tantalum oxide ($TaO_x$, where $0<x<2.5$), the variable resistance thin layer is formed by DC magnetron sputtering. In more detail, a $TaO_x$ thin layer is formed by reactive sputtering on a tantalum (Ta) target under an atmosphere of mixture of argon and oxygen. More specifically, the $TaO_x$ thin layer is formed at a pressure ranging from 0.2 Pa to 5 Pa, a substrate temperature ranging from 20° C. to 400° C., a flow rate ratio of oxygen ranging from 0.1% to 10%, and a RF power ranging from 150 W to 300 W, and for a time period adjusted to result in a layer thickness ranging from 1 nm to 300 nm. Here, the method of forming the variable resistance thin layer is not limited to sputtering, but may be so-called CVD method, a spin coat method, or the like.

Finally, on a principal surface of the variable resistance thin layer, the upper electrode is formed by sputtering. Conditions for forming the upper electrode depend on a material and the like of the upper electrode. For example, in the case of the upper electrode comprising platinum, the upper electrode is formed in the same manner as described for the lower electrode. More specifically, the upper electrode is formed by DC magnetron sputtering in which platinum is utilized as target, at a pressure of 0.5 Pa, a DC power of 200 W, and a flow rate of Ar of 6 sccm, and for a time period adjusted to result in a platinum layer having a thickness ranging from 20 nm to 100 nm. Here, the method of forming the upper electrode is not limited to sputtering, but may be so-called CVD method, a spin coat method, or the like.

FIG. 1 shows current-voltage characteristics of a variable resistance element that includes a variable resistance material of TaO, having a thickness of 50 nm and that has a design electron area of 1 $\mu m^2$. In this experiment, a tantalum nitride (TaN) layer, a $TaO_x$ layer, and a Pt layer are sequentially formed by sputtering on a principal surface of a substrate by sputtering. Then, common lithography and dry etching are applied to the structure to manufacture a variable resistance element. The resulting variable resistance element is evaluated in the experiment. In the evaluation shown in FIG. 1, a voltage applied to the variable resistance element is varied, first from 0 V to −1.8 V, then from −1.8 V to 0 V, then from 0 V to +1.3 V, and from +1.3 V to 0V. At the voltage varying from 0 V to −1.8 V, the current-voltage characteristics of the variable resistance element are as shown by a curve indicated by an arrow 1. At the voltage varying from −1.8 V to 0 V, the current-voltage characteristics are as shown by a curve indicated by an arrow 2. At the voltage varying from 0 V to +1.3 V, the current-voltage characteristics are as shown by a curve indicated by an arrow 3. At the voltage varying from +1.3 V to 0 V, the current-voltage characteristics are as shown by a curve indicated by an arrow 4. It is seen in FIG. 1 that, as resistance of the variable resistance element is varied, a value of a current is also varied at a voltage of approximately −0.8 V and at a voltage of approximately +0.9 V. At the voltage of approximately −0.8 V, the current-voltage characteristics are as shown by the curve indicated by the arrow 1. At the voltage of approximately +0.9 V, the current-voltage characteristics are as shown by the curve indicated by the arrow 3. In reality, however, a current flowing through the variable resistance element with varying resistance is approximately 80 μA at maximum. Assuming that an electrode area of the variable resistance element is 1 $\mu m^2$, the current of approximately 80 μA is equivalent to a current of 8000 $A/cm^2$. Therefore, regarding a current density ($J_{min}(A/cm^2)$), a current of at least 10000 A/cm$^2$ is supposed to be required to write data into the variable resistance element. In other words, regarding a minimum current density $J_{min}$(A/cm$^2$) of a current flowing through a current steering element connected with the variable resistance element, a current of at least 10000 A/cm$^2$ is necessary to flow through the current steering element.

The following describes in detail the characteristic structure of the current steering element according to the present embodiment of the present invention.

According to the present embodiment, the current steering element has a structure in which a current steering layer is provided between a pair of electrodes facing each other. This structure is the same as the previously-described structure of a MIM diode or a MSM diode. Moreover, the current steering element according to the present embodiment has non-linear electrical resistance characteristics. The current steering element may have current-voltage characteristics that are substantially symmetrical with respect to a polarity of an applied voltage. Therefore, in the case of the current steering element according to the present embodiment, even if bipolar variable resistance elements are adopted and pulsed with different polarities, bias condition is set to turn off current steering elements connected with non-selected variable resistance elements. As a result, it is possible to prevent write didturb in the non-selected variable resistance elements.

Furthermore, the current-voltage characteristics of the current steering element according to the present embodiment heavily depend on a potential barrier and an interface energy level between each of the electrodes and the current steering layer adjacent to the electrodes. The potential barrier and the interface energy level produce rectification. As a result, the current steering element has non-linear electrical resistance characteristics. The present embodiment efficiently utilizes the above characteristics of the current steering element. More specifically, a current steering layer comprising SiN$_x$ (where 0<x≦0.85) is added with hydrogen or fluorine. Therefore, the added hydrogen or fluorine terminates the energy level existing on the interfaces between each of the electrodes and the current steering layer. As a result, it is possible to reduce leak current caused by the interface energy levels. Therefore, the current steering element has good current-voltage characteristics. The following describes the structure of such a current steering element having good current-voltage characteristics.

The following describes the structure of the current steering element according to the present embodiment in more detail with reference to the related figures.

Figure 2:
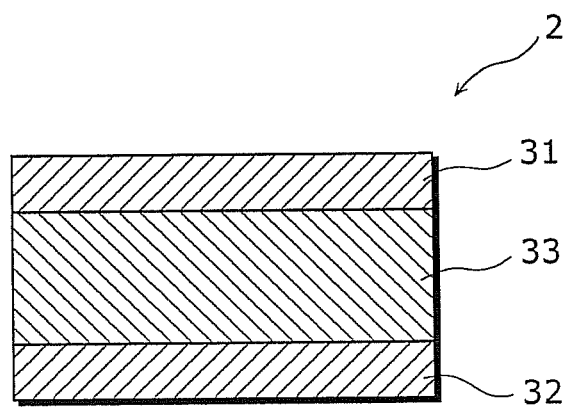
FIG. 2 is a cross-sectional view schematically showing a structure of a current steering element according to the embodiment of the present invention.

FIG. 2 is a cross-sectional view schematically showing a structure of a current steering element 2 according to the present embodiment of the present invention.

As shown in FIG. 2, the current steering element 2 includes a first electrode 32, a second electrode 31, and a current steering layer 33 provided between the first electrode 32 and the second electrode 31. Here, each of the first electrode 32 and the second electrode 31 is made of a metal such as Al, Cu, Ti, W, Pt, Ir, Cr, Ni, or Nb, a mixture (alloy) from the metals, or a multilayer structure from the metals, or the like.

It is also possible that each of the first electrode 32 and the second electrode 31 is made of a conductor compound such as TiN, TiW, TaN, TaSi$_2$, TaSiN, TiAlN, NbN, WN, WSi$_2$, WSiN, RuO$_2$, In$_2$O$_3$, SnO$_2$, or IrO$_2$, or a mixture or multilayer structure from the conductor compounds. Of course, the material of the first electrode 32 and the second electrode 31 is not limited to the above. Any material can be used as long as the material causes rectification due to a potential barrier between each of the electrodes and the current steering layer.

According to the present embodiment, the current steering layer 33 comprising SiN$_x$ (where 0<x≦0.85) added with a predetermined amount or more of hydrogen or fluorine. Silicon compound such as SiN$_x$ forms a tetrahedral amorphous semiconductor that forms tetrahedrally coordinated bonds. The tetrahedral amorphous semiconductor basically has a structure similar to a structure of monocrystal silicon or germanium. Therefore, physicality of the tetrahedral amorphous semiconductor is likely to be influenced by a structural difference between addition of element except silicon and non-addition of such element. Therefore, if the current steering layer 33 is made of silicon compound, structural control of the silicon compound results in easy control of physicality of the current steering layer 33. As a result, potential barriers between the first electrode 32 and the current steering layer 33 and between the second electrode 31 and the current steering layer 33 is more easily controlled.

Especially in the case where the current steering layer 33 comprises SiN$_x$, if a nitrogen composition in SiN$_x$ is varied, it is possible to continuously vary a forbidden band width. Therefore, by changing a value of x in SiN$_x$, it is possible to control a size of the potential barriers between the first electrode 32 and the current steering layer 33 and between the second electrode 31 and the current steering layer 33. For the above reason, the current steering layer 33 comprising SiN$_x$ is further preferable.

Furthermore, SiN$_x$ includes silicon and nitrogen which are generally used in manufacturing semiconductor devices, and is therefore widely used in current semiconductor manufacturing. Therefore, the use of SiN$_x$ does not occur any new impurity contamination, which is convenient for maintenance of semiconductor manufacturing lines. Moreover, the existing manufacturing equipment can be easily used in processing for SiN$_x$, such as layer forming and etching for SiN$_x$. In addition, the existing conditions for layer forming or etching can be applied for processing SiN$_x$.

Here, the following requirements are to be satisfied to implement a crosspoint memory to which data is surely written by pulsing with different polarities. One of the requirements is that "the current steering elements in the crosspoint memory have (a) non-linear electrical resistance characteristics and (b) current-voltage characteristics that are actually symmetrical with respect to a polarity of an applied voltage". The other requirement is that "the current steering elements allow a current having an enough current density to flow through a selected variable resistance element in data writing." In terms of miniaturization and high integration of memory elements, it is desirable that the current steering elements can be miniaturized and hardly have a dispersion in the characteristics.

In consideration of the above, an appropriate element to serve as a current steering element is examined from among two-terminal elements such as a MIM diode, a MSM diode, and a varistor. The MIM diodes have a structure in which an insulator is provided between metals. The MIM diodes are therefore basically considered as not being suitable to cause a steady large current. The varistors are known as having the characteristics caused by a crystal grain boundary. However, in principal, the varistors have a problem that the characteristics vary depending on differences in crystal grain size distribution. Therefore, when the varistors are miniaturized, it is inevitable that their operation characteristics vary accordingly. For the above reason, the varistors are not considered as being preferable as the current steering elements. On the other hand, in principal, the MSM diodes made of amorphous semiconductor are considered as being unlikely to have a variety in their characteristics caused by the semiconductor structure.

Therefore, even if the MSM diodes are miniaturized, their operation characteristics do not vary. However, there is no report that the MSM diodes have been used to cause a steady large current.

Figure 39A:
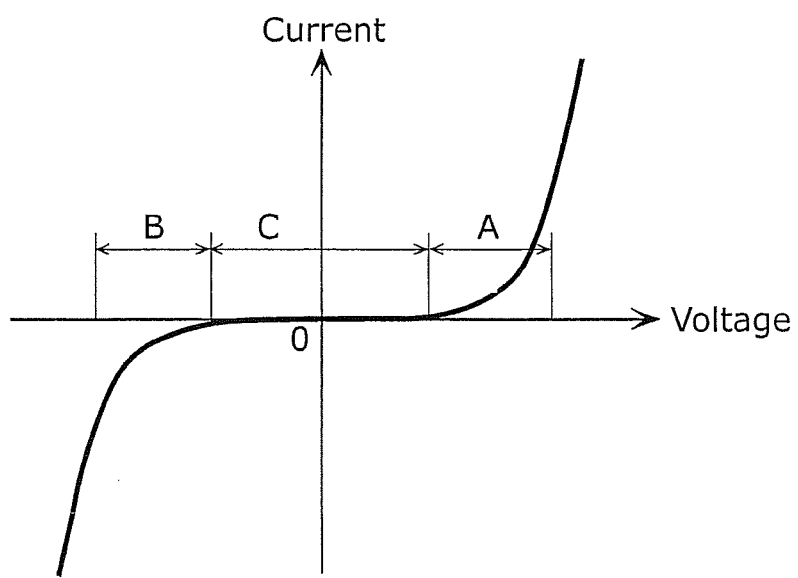
FIG. 39A is a graph schematically plotting current-voltage characteristics of a current steering element, in the case where the current steering element is a two-terminal element such as a varistor.
Figure 39B:
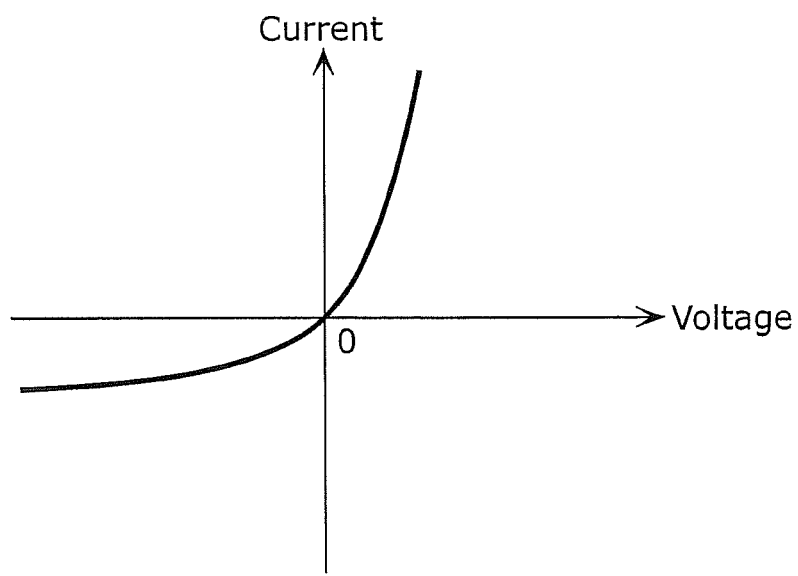
FIG. 39B is a graph schematically plotting current-voltage characteristics of a current steering element, in the case where the current steering element is a Schottky diode.

If the current steering layer 33 comprises $SiN_x$, the electrical conduction characteristics of the current steering layer 33 significantly vary depending on the nitrogen composition ratio x as described earlier. For example, in the case of a so-called stoichiometric composition (where x=1.33, namely, $Si_3N_4$), $SiN_x$ is insulator. However, as the nitrogen ratio is smaller than the stoichiometric composition (in other words, as the nitrogen composition ratio x is decreased), $SiN_x$ gradually becomes semiconductor. Therefore, appropriately control of the nitrogen composition ratio x enables the current steering element 2 including the current steering layer 33 to serve as a MSM diode. It is also possible that $SiN_x$ is doped with a p-type or n-type dopant to adjust a resistivity. The p-type dopant may be boron (B), antimony (Sb), or the like. The n-type dopant may be phosphorus (P), arsenic (As), or the like. The MSM diodes have a very high electrical resistance in a voltage range (namely, the range C in FIG. 39A) where an applied voltage is equal to or lower than a first critical voltage (the lower-limit voltage in the range A in FIG. 39A) and is equal or higher than a second critical voltage (the upper-limit voltage in the range B in FIG. 39A). On the other hand, the electrical resistance is rapidly decreased at an applied voltage higher than the first critical voltage or lower than the second critical voltage. In other words, the MSM diodes have nonlinear electrical resistance characteristics in which a large current flows at a voltage that is higher than the first critical voltage or lower than the second critical voltage. Hereinafter, the state of causing a large current is referred to as a "conduction state". According to the present embodiment, the current steering element 2 having such electrical resistance characteristics of the MSM diode is connected in series with the above-described variable resistance element in order to surely prevent sneak current.

The present invention can provide the following techniques. Regarding the current steering layer 33 comprising $SiN_x$ where x is a nitrogen composition ratio, the nitrogen composition ratio x is controlled to be within a predetermined range, and a thickness of the current steering layer 33 is also controlled to be within a predetermined range. In addition, the current steering layer 33 is added with hydrogen or fluorine having a predetermined density or more. As a result, the current steering element 2 having such a current steering layer 33 can increase a current density enough to cause a required current in the conduction state as that of the MSM diode, and decrease the current density enough in non-conduction state. Here, (a) an appropriate value of the nitrogen composition ratio x in $SiN_x$, (b) an appropriate thickness of the current steering layer 33 comprising $SiN_x$, and (c) an appropriate density of hydrogen or fluorine added to the current steering layer 33 will be described in more detail later.

When a value of x is small, $SiN_x$ in the current steering layer 33 serves as semiconductor and dangling bonds (namely, defects) in $SiN_x$ are increased. The dangling bonds at the interfaces between the first electrode 32 and the current steering layer 33 and between the second electrode 31 and the current steering layer 33 are called interface energy levels. The dangling bonds affect potential barriers between the first electrode 32 and the current steering layer 33 and between the second electrode 31 and the current steering layer 33. Therefore, in order to stabilize the rectification of the current steering element 2, the current steering layer 33 comprising $SiN_x$ is added with hydrogen or fluorine having a predetermined density or more. As a result, the dangling bonds in the current steering layer 33 are terminated by the added hydrogen or fluorine.

Next, the description is given for a method of manufacturing the current steering element 2 according to the present embodiment of the present invention.

In the manufacturing of the current steering element 2, first, the first electrode 32 is formed on a principal surface of a predetermined substrate. Conditions for forming the first electrode 32 depend on a material or the like of the first electrode 32. For example, in the case of the first electrode 32 comprising tantalum nitride (TaN), the first electrode 32 is formed by DC magnetron sputtering under the following conditions. That is, reactive sputtering is performed on a tantalum (Ta) target under an atmosphere of mixture of argon (Ar) and nitrogen (N) for a time period adjusted to result in a layer having a thickness ranging from 20 nm to 100 nm.

Next, a $SiN_x$ layer serving as the current steering layer 33 is formed on a principal surface of the first electrode 32. For example, sputtering (so-called reactive sputtering) is performed on a polysilicon target under an atmosphere of mixed gas of argon and nitrogen. Under typical layer forming conditions, the current steering layer 33 is formed at a pressure ranging from 0.08 Pa to 2 Pa, a substrate temperature ranging from 20° C. to 300° C., a nitrogen gas flow rate ratio (a ratio of a flow rate of nitrogen to a total flow rate of argon and nitrogen) ranging from 0% to 40%, and a DC power ranging from 100 W to 1300 W, and for a time period adjusted to result in a $SiN_x$ layer having a thickness ranging from 3 nm to 30 nm.

Finally, the second electrode 31 is formed on a principal surface of the current steering layer 33. For example, the second electrode 31 comprises W. A W layer is formed by DC magnetron sputtering, at a substrate temperature ranging from 20° C. to 25° C., an argon flow rate of 50 sccm, a DC power ranging from 200 W to 300 W, and a pressure ranging from 0.4 Pa to 0.8 Pa, and for a time period adjusted to result in a layer having a thickness ranging from 20 nm to 100 nm.

According to the present embodiment, it is possible to appropriately change a value of x in the $SiN_x$ layer, by changing the conditions (for example, a ratio of a gas flow rate regarding argon and nitrogen) in the sputtering on the polysilicon target.

Figure 3:
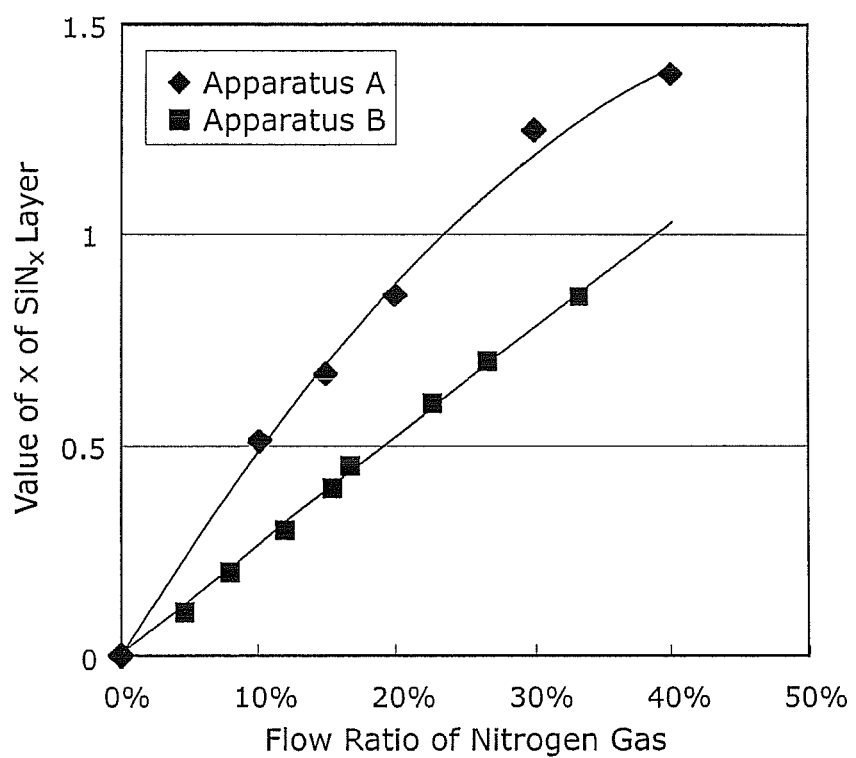
FIG. 3 is a correlation graph plotting results of measuring, by Rutherford Backscattering Spectrometry (RBS), a value of x in a plurality of $SiN_x$ layers formed by varying a flow rate ratio of nitrogen gas.

FIG. 3 is a correlation graph plotting results of measuring, by Rutherford Backscattering Spectrometry (RBS), each value of x in a plurality of $SiN_x$ layers formed by varying a flow rate ratio of nitrogen gas. FIG. 3 shows a flow rate ratio of nitrogen gas (a ratio of a flow rate of nitrogen to a total flow rate of argon and nitrogen) on the horizontal axis, and a value of x in each of the $SiN_x$ layers on the vertical axis. FIG. 3 shows data regarding $SiN_x$ layers manufactured by two different apparatuses for forming layers by DC sputtering (hereinafter, referred to as an "apparatus A" and an "apparatus B"). Here, the apparatus A manufactures a $SiN_x$ layer by performing sputtering on a polysilicon target having a diameter of 150 mm, at a pressure of 0.4 Pa, a substrate temperature of 20° C., and a DC power of 300 W. The resulting $SiN_x$ layer specimen is examined. On the other hand, the apparatus B manufactures another $SiN_x$ layer by performing sputtering on a plolysilicon target having a diameter of 300 mm, at a total gas flow rate of 15 sccm, a pressure ranging approximately from 0.08 Pa to 0.1 Pa, a substrate temperature of 20° C., and a DC power ranging from 1000 W to 1300 W. The resulting $SiN_x$ layer specimen is examined.

As shown in FIG. 3, whichever the layer manufacturing apparatus A or B is used, it is possible to continuously vary a value of x in the $SiN_x$ layer by continuously varying a flow rate ratio of nitrogen gas from 0% to 40%. As described above, if a nitrogen composition in the $SiN_x$ layer is varied depending on a flow rate ratio of nitrogen gas, a forbidden band width is continuously varied. As a result, it is possible to appropriately control the size of potential barriers between the first electrode 32 and the current steering layer 33 and between the second electrode 31 and the current steering layer 33. In the above-described manner, the current steering element 2 has the same electrical resistance characteristics as those of the MSM diode to increase a current density enough to cause a current to flow in conduction state.

The following describes examination of an appropriate value of the nitrogen composition ratio x in $SiN_x$.

Figure 4:
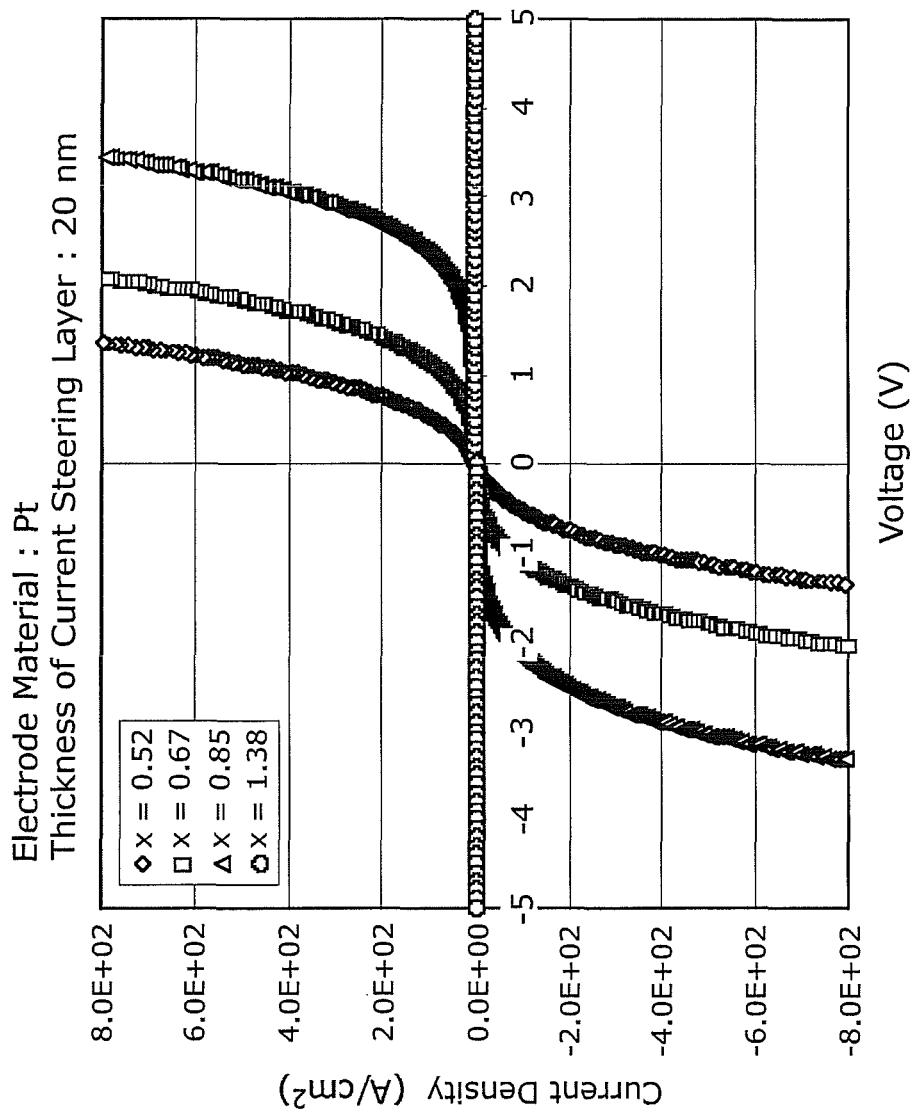
FIG. 4 is a characteristics graph plotting results of measuring current-voltage characteristics of a current steering element including: a current steering layer comprising $SiN_x$ having a thickness of 20 nm; and a pair of electrodes comprising platinum (Pt).

FIG. 4 is a characteristics graph plotting results of measuring current (strictly, current density)-voltage characteristics of the current steering element 2. Here, the current steering element 2 includes: the current steering layer 33 comprising $SiN_x$ having a thickness of 20 nm; and a pair of electrodes comprising platinum (Pt). FIG. 4 shows a voltage applied to the current steering element 2 on the horizontal axis, and a current density of a current flowing through the current steering element 2 on the vertical axis.

In this experiment, a Pt thin layer and a $SiN_x$ thin layer are sequentially formed on a principal surface of a substrate by sputtering. Then, another Pt thin layer is formed by sputtering via a metal mask having a circular hole with a diameter of 100 μm. As a result, the current steering element 2 is manufactured. Here, the $SiN_x$ thin layer is formed by performing sputtering on a polysilicon target under an atmosphere of mixed gas of argon and nitrogen. The nitrogen composition ratio x in the $SiN_x$ thin layer is varied by varying the sputtering conditions (for example, a ratio of a gas flow rate regarding argon and nitrogen). The nitrogen composition ratio x in the $SiN_x$ thin layer is determined by Rutherford Backscattering Spectrometry (RBS). As shown in FIG. 4, in this experiment, by varying the sputtering conditions, four various kinds of $SiN_x$ thin layers are formed to have different nitrogen composition ratios x. In more detail, the four various kinds of $SiN_x$ thin layers have the nitrogen composition ratios x of 0.52, 0.67, 0.85, and 1.38, respectively. As described earlier, in the experiment, a size of the electrode included in the current steering element 2 is varied depending on the metal mask having the circular hole with a diameter of 100 μm. Therefore, a current of approximately several amperes is actually required to result in a current density of approximately 10000 $A/cm^2$. General measurement systems (measurement systems generally used in measurement) cannot measure such current. In consideration of the above, the pieces of experimental data are compared to one another under the assumption that the current density is 500 $A/cm^2$.

As shown in FIG. 4, the current steering element 2, which includes the first electrode 32 comprising Pt, the second electrode 31 comprising Pt, and the current steering layer 33 comprising $SiN_x$, has (a) non-linear electrical resistance characteristics, and (b) the current-voltage characteristics that are substantially symmetrical with respect to a polarity of an applied voltage. FIG. 4 also reveals the following. In the case where the current steering layer 33 comprises $SiN_x$, a greater nitrogen composition ratio x results in greater potential barriers between the first electrode 32 and the current steering layer 33 and between the second electrode 31 and the current steering layer 33. The greater the potential barriers are, a voltage required to cause the conduction state is increased. In the case of the nitrogen composition ratio x of 0.85 or less, a current density easily exceeds 500 $A/cm^2$ even if a voltage applied between the first electrode 32 and the second electrode 31 is less than 4 V. Therefore, it is expected from FIG. 4 that a higher voltage results in a greater current density. However, in the case of the nitrogen composition ratio x of 1.38, application of a voltage of 5 V does not cause the conduction state. If the applied voltage is further increased, the current steering element 2 itself is broken before reaching the conduction state. The breakdown occurs because the increase of the nitrogen composition ratio x significantly expands the forbidden band width of the current steering layer 33, which causes the current steering layer 33 to change to an insulator. In consideration of the above results, it is preferable that the nitrogen composition ratio x is in a range from 0 to 0.85 in the case where the current steering layer 33 comprises $SiN_x$. With the above structure, the current steering layer 33 serves as a semiconductor and the current steering element 2 serves as a MSM diode.

The voltage-current characteristics of the current steering element 2 including the current steering layer 33 comprising $SiN_x$, which is shown in FIG. 4, has the same characteristics as those in the case where the electrodes comprise of Pt, regardless of the material of the electrodes.

Figure 5:
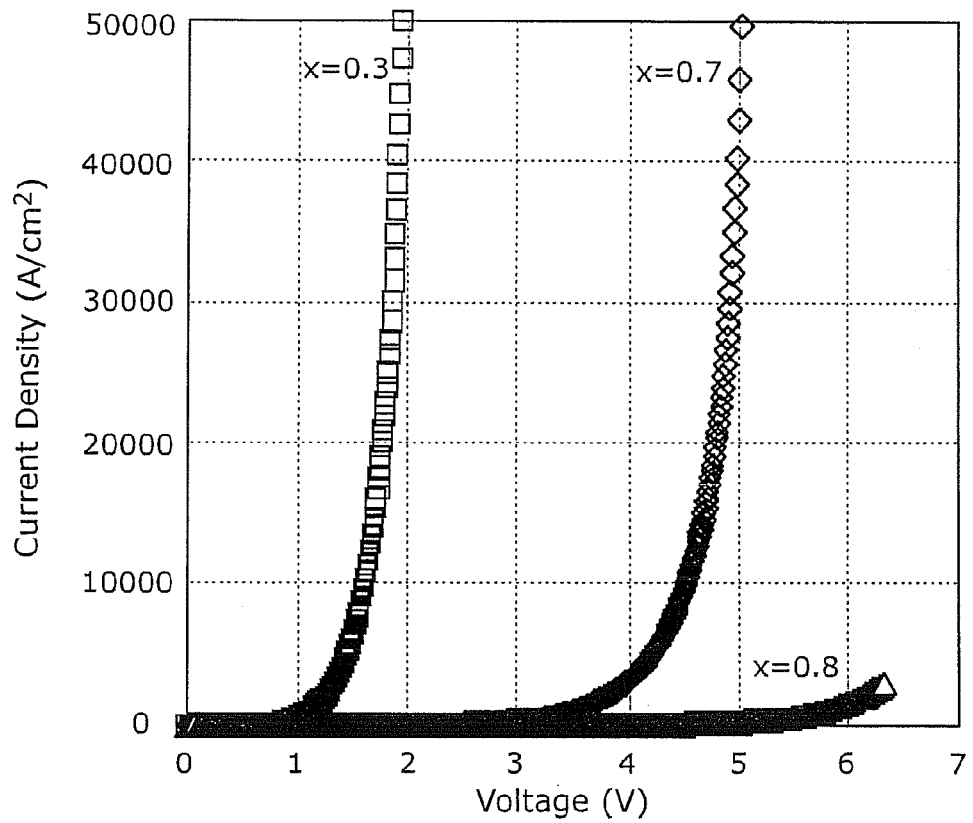
FIG. 5 is a graph plotting results of measuring current-voltage characteristics of a current steering element including: a current steering layer comprising $SiN_x$ having a thickness of 10 nm; and a pair of electrodes comprising tantalum nitride (TaN).

FIG. 5 is a graph plotting results of measuring current (strictly, current density)-voltage characteristics of the current steering element 2. Here, the current steering element 2 includes: the current steering layer 33 comprising $SiN_x$ having a thickness of 10 nm; and a pair of electrodes comprising tantalum nitride (TaN). FIG. 5 shows the current-voltage characteristics in the various cases where the nitrogen composition ratio x in $SiN_x$ is varied as 0.3, 0.7, and 0.8. For the sake of simplicity of the explanation, current-voltage characteristics in the case where an applied voltage has a negative polarity is not shown in FIG. 5.

In this experiment, a TaN layer, a $SiN_x$ layer, and a TaN layer are sequentially formed by sputtering on a principal surface of a substrate to manufacture a multilayered structure. Then, common lithography and dry etching are applied to the multilayered structure. As a result, the current steering element 2 having an electrode area of 1 $\mu m^2$ is manufactured. The resulting current steering element 2 is evaluated in the experiment.

As shown in FIG. 5, in the case where the nitrogen composition ratio x in $SiN_x$ is in a range from 0.3 to 0.7, the current steering element 2 can (a) increase a voltage by approximately 3 V to cause conduction state, (b) cause a current having a great current density exceeding 10000 $A/cm^2$ (an example of the above-described minimum current density $J_{min}$ ($A/cm^2$)), while the current steering element 2 has the same electrical resistance characteristics as those of the MSM diode. Comparison to the current-voltage characteristics of the current steering element 2 including the Pt electrodes, which is shown in FIG. 4, shows that the current steering element 2 including the TaN electrodes can cause a current of a current density that is much greater than that in the case of the current steering element 2 including the Pt electrodes. Therefore, TaN is one of preferable materials of the current steering element 2 including the current steering layer 33 comprising $SiN_x$.

On the other hand, as shown in FIG. 5, in the case where the nitrogen composition ratio x of $SiN_x$ is 0.8, a current having a great current density of approximately 3000 $A/cm^2$ can flow at a voltage of approximately 6.3 V. However, a higher voltage causes breakdown (i.e. short) of the current steering element 2. Basically, $SiN_x$ is an insulator as known stoichiometric composition. Such insulator characteristics of $SiN_x$ are considered as causing the above phenomenon. If a current having a greater current density is necessary, it is preferable that the nitrogen composition ratio x is less than 0.8. Therefore, in the case of the current steering element 2 including a pair of electrodes comprising tantalum nitride (TaN), it is preferable that the nitrogen composition ratio x is 0.7 or less to achieve a great current density exceeding, for example, 10000 A/cm$^2$.

Subsequently, hydrogen or fluorine is added to the current steering layer 33 from the top surface of the current steering layer 33 in order to terminate dangling bonds at (a) the surfaces of the current steering layer 33 comprising SiN$_x$ and at (b) the interface between the current steering layer 33 and the first electrode 32. In order to add the hydrogen or fluorine to the current steering layer 33, hydrogen (H$_2$) or fluorine (F$_2$) is energized into plasma in a metastable state (so-called radical state), and the plasma is irradiated to the top surface of the current steering layer 33. The hydrogen or fluorine addition terminates (i) the state existing at (i-1) the top surface of the current steering layer 33 comprising SiN$_x$ and (i-2) the interface between the first electrode 32 and the current steering layer 33, and (ii) dangling bonds at the top surface of the current steering layer 33. As a result, the current-voltage characteristics of the current steering element 2 are improved. Under the typical conditions, the hydrogen or fluorine addition is performed at a pressure ranging $1.0 \times 10^{-4}$ Pa to 30 Pa, a substrate temperature ranging 300° C. to 500° C., a RF power ranging 200 W to 900 W, and an addition density D (a density of the added hydrogen or fluorine included in the current steering layer 33) in a range where $0.75 \times 10^{22}$ (atoms/cm$^3$)$\leq D \leq 2.0 \times 10^{22}$ (atoms/cm$^3$).

Figure 6:
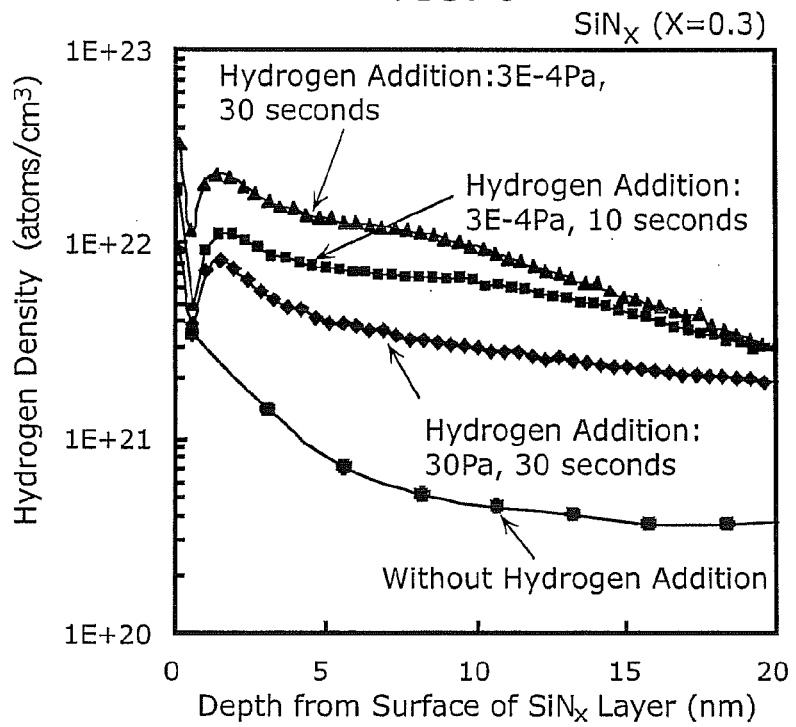
FIG. 6 is a graph plotting results of SIMS analysis of a $SiN_x$ layer in the case where hydrogen is added to a current steering layer comprising $SiN_x$.

FIG. 6 shows results of SIMS analysis in the case where hydrogen is added to the current steering layer 33 comprising SiN$_x$ (where x=0.3). As shown in FIG. 6, in the case of hydrogen plasma irradiation at a pressure of $3 \times 10^{-4}$ Pa and for a time period of 30 seconds, the hydrogen included in the surface of the SiN$_x$ (where x=0.3) has a density of $2.0 \times 10^{22}$ (atoms/cm$^3$). If the hydrogen plasma irradiation is performed at the same pressure but for a time period of 10 seconds, the hydrogen included in the surface has a density of $1.0 \times 10^{22}$ (atoms/cm$^3$) that is smaller than the above case. If the hydrogen plasma irradiation is performed at a pressure of 30 Pa and for the same time period of 30 seconds, the hydrogen at the surface has a density of $0.75 \times 10^{22}$ (atoms/cm$^3$). A higher voltage causes (a) a shorter mean free path of hydrogen energized into plasma, (b) decrease in the number of hydrogen radicals reaching the surface of the SiN$_x$ layer, and (c) decrease of the hydrogen density at the surface. Therefore, by adjusting the number of the hydrogen radicals reaching the surface (for example, adjusting the conditions or time period for the plasma energizing), the density of the hydrogen added to the SiN$_x$ layer varies in a range from $0.75 \times 10^{22}$ (atoms/cm$^3$) to $2.0 \times 10^{22}$ (atoms/cm$^3$).

Figure 7:
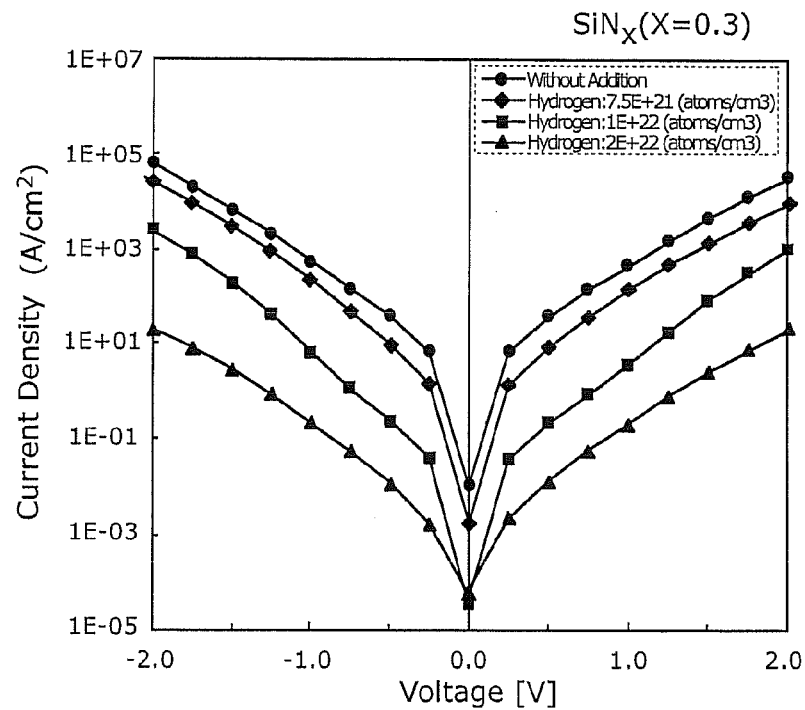
FIG. 7 is a graph plotting current-voltage characteristics of a current steering element in the case where hydrogen is added to a current steering layer comprising $SiN_x$.

FIG. 7 shows the current (strictly, current density)-voltage characteristics of the current steering element 2 comprising SiN$_x$ (where x=0.3) in the case where hydrogen is added to the current steering layer 2. The first electrode 32 and the second electrode 31 comprises tantalum nitride, and the current steering layer 33 comprises a SiN$_x$ layer (where x=0.3) having a thickness of 15 nm. As shown in FIG. 7, assuming that the same voltage is applied, a current flowing through the current steering element 2 including the SiN$_x$ layer added with hydrogen is less than a current flowing through the current steering element 2 including a SiN$_x$ layer without hydrogen by digits from two digits to four digits. This is because the added hydrogen terminates the interface energy level between the first electrode 32 and the current steering layer 33 comprising SiN$_x$ (where x=0.3) and between the second electrode 31 and the current steering layer 33, so that potential barriers between the first electrode 32 and the current steering layer 33 and between the second electrode 31 and the current steering layer 33 are increased. FIGS. 6 and 7 show the results of the hydrogen addition. Hydrogen is bound with silicon and nitrogen which are dangling bonds in SiN$_x$ so that silicon-hydrogen bonds (Si—H bonds) and nitrogen-hydrogen bonds (N—H bonds) are formed. Especially, bond energy of N—H bonds is 4.0 eV that is greater than bond energy 3.1 eV for Si—H bonds. Therefore, N—H bonds can offer stable bond state. Therefore, N—H bonds are not dissociated due to a heat history in the manufacturing process. As a result, the dangling bonds can be terminated. Fluorine is also bound with silicon that is dangling bonds in SiN$_x$ so that silicon-fluorine bonds (Si—F bonds) is formed. The bond energy of the Si—F bonds is 5.6 eV that is greater than the bond energy of N—H bonds. Therefore, fluorine can offer more stable bonds (termination of the interface energy level).

Finally, the second electrode 31 is formed on a principal surface of the current steering layer 33. In the case where the second electrode 31 comprises tantalum nitride (TaN), DC magnetron sputtering is adopted. More specifically, reactive sputtering is performed on a tantalum (Ta) target under an atmosphere of mixture of argon (Ar) and nitrogen (N) for a time period adjusted to result in a thickness ranging from 20 nm to 100 nm.

Figure 8:
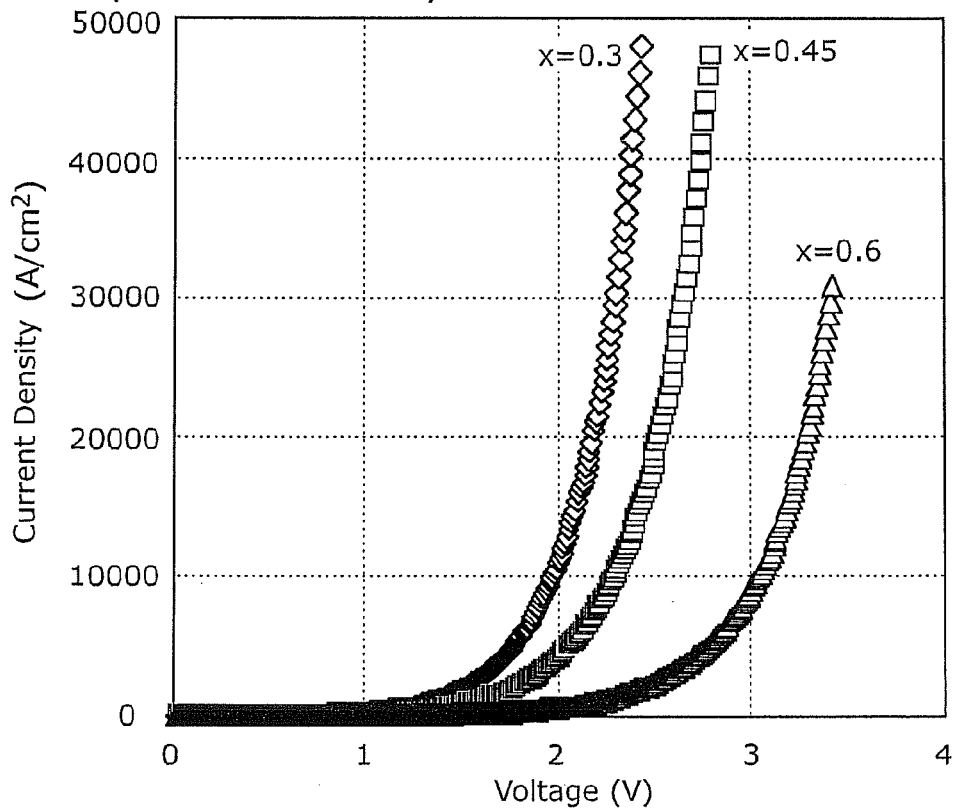
FIG. 8 is a graph plotting results of measuring current-voltage characteristics of a current steering element including: a current steering layer comprising $SiN_x$ having a thickness of 10 nm; and a pair of electrodes comprising tungsten (W).

FIG. 8 is a graph plotting results of measuring current (strictly, current density)-voltage characteristics of the current steering element 2. The current steering element 2 includes: a current steering layer 33 comprising SiN$_x$ having a thickness of 10 nm; and a pair of electrodes comprising tungsten (W). FIG. 8 shows the current-voltage characteristics in the various cases where the nitrogen composition ratio x in SiN$_x$ is varied as 0.3, 0.45, and 0.6. For the sake of simplicity of the explanation, current-voltage characteristics in the case where an applied voltage has a negative polarity is not shown in FIG. 8.

In this experiment, a W layer, a SiN$_x$ layer, and a W layer are sequentially formed by sputtering on a principal surface of a substrate to manufacture a multilayered structure. Then, typical photo lithography and dry etching are applied to the multilayered structure. As a result, the current steering element 2 having an electrode area of 1 μm$^2$ is manufactured. The resulting current steering element 2 is evaluated in the experiment.

As shown in FIG. 8, the current steering element 2 including the electrodes comprising W shows the results similar to those of the current steering element 2 including the electrodes comprising TaN. In the case where the nitrogen composition ratio x in SiN$_x$ is in a range from 0.3 to 0.6, the current steering element 2 including the electrodes comprising W can (a) increase a voltage by approximately 1.2 V to cause the conduction state, (b) cause a current having a great current density exceeding 10000 A/cm$^2$ (an example of the above-described minimum current density J$_{min}$ (A/cm$^2$)), while the current steering element 2 has the same electrical resistance characteristics as those of the MSM diode. In comparing (a) the current-voltage characteristics of the current steering element 2 including the electrodes comprising W to (b) the current-voltage characteristics of the current steering element 2 including the electrodes comprising TaN, the current steering element 2 including the electrodes comprising TaN has a slightly greater current value than that of the current steering element 2 including the electrodes comprising W, if the nitrogen composition ratio x in SiN$_x$ is the same. However, the current-voltage characteristics are hardly different between them. Therefore, likewise the current steering element 2 including electrodes comprising TaN, even in the case of the current steering element 2 including a pair of electrodes comprising tungsten (W), it is preferable that the nitrogen composition ratio x is 0.7 or less to achieve a great current density exceeding 10000 A/cm$^2$.

The following describes how the characteristics of the current steering element 2 depend on material of the electrodes, in the case where the electrode material is tungsten.

Figure 9:
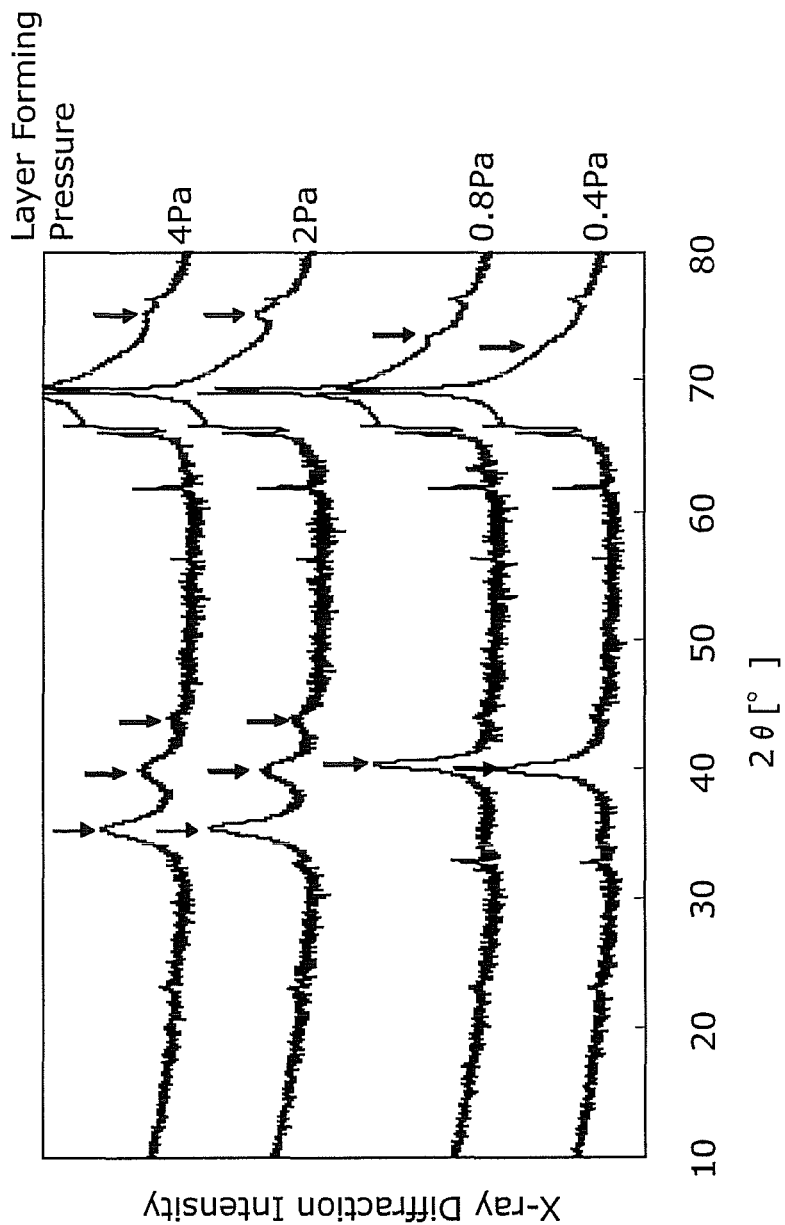
FIG. 9 is a graph plotting an X-ray diffraction pattern of tungsten (W) formed by DC magnetron sputtering.
Figure 10A:
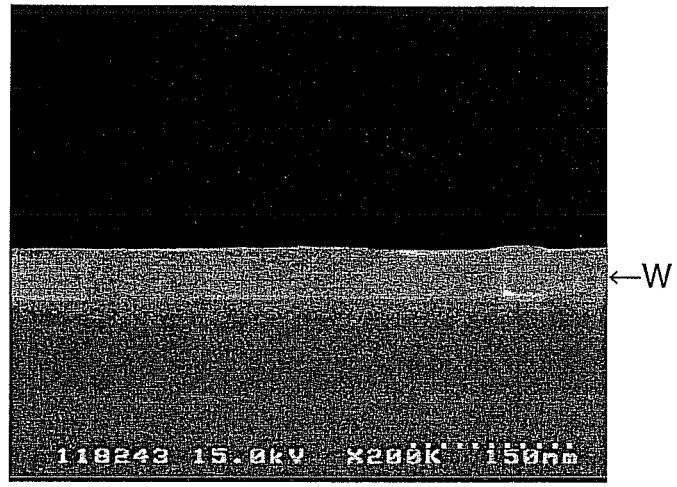
FIG. 10A is a SEM photograph of a cross-sectional view of a tungsten (W) layer.
Figure 10B:
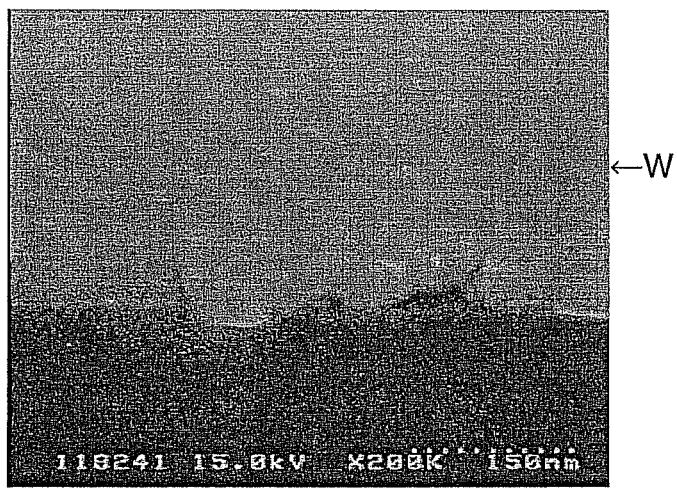
FIG. 10B is a SEM photograph of an oblique overhead view of the tungsten (W) layer.
Figure 11A:
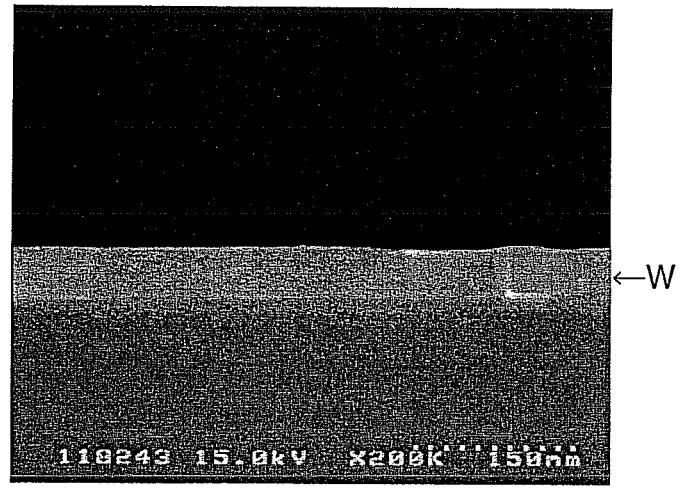
FIG. 11A is a SEM photograph of a cross-sectional view of a tungsten (W) layer.
Figure 11B:
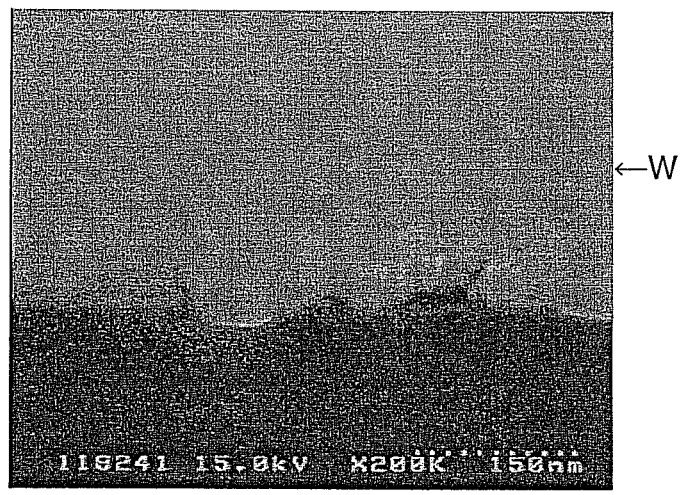
FIG. 11B is a SEM photograph of an oblique overhead view of the tungsten (W) layer.
Figure 12A:
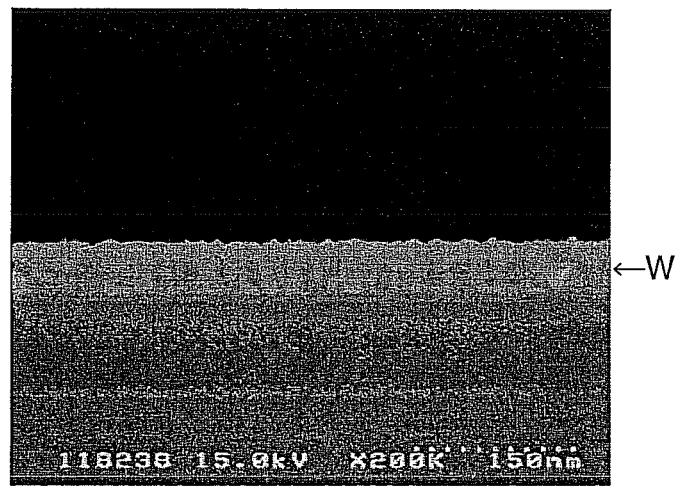
FIG. 12A is a SEM photograph of a cross-sectional view of a tungsten (W) layer.
Figure 12B:
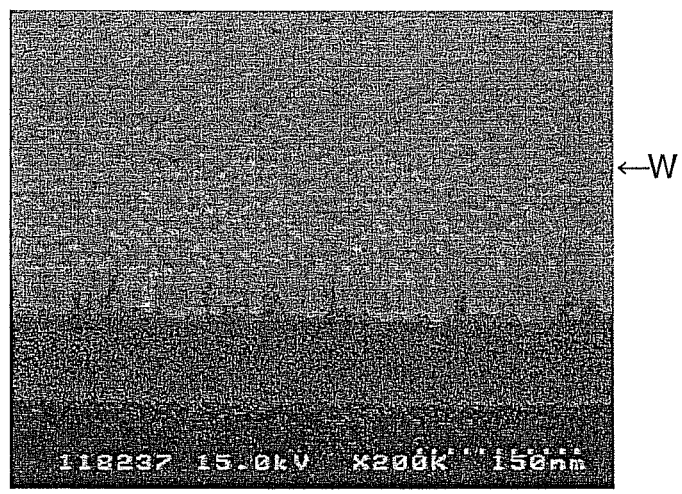
FIG. 12B is a SEM photograph of an oblique overhead view of the tungsten (W) layer.
Figure 13A:
FIG. 13A is a SEM photograph of a cross-sectional view of a tungsten (W) layer.
Figure 13B:
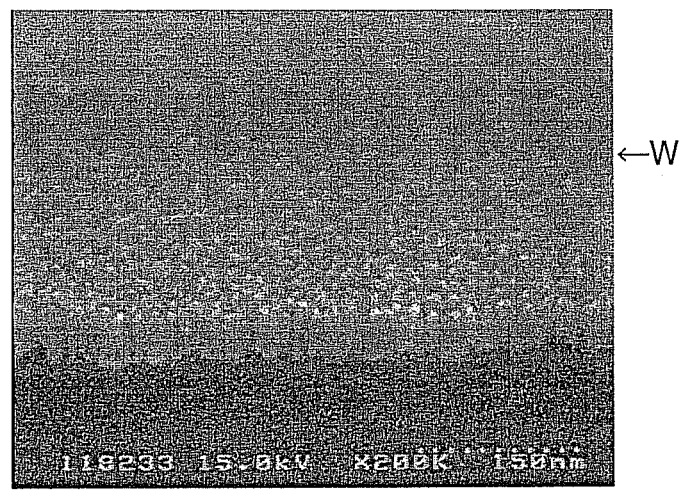
FIG. 13B is a SEM photograph of an oblique overhead view of the tungsten (W) layer.

FIG. 9 shows various X-ray diffraction patterns of a tungsten (W) layer formed by DC magnetron sputtering. FIG. 9 shows each X-ray diffraction strength when X-ray is irradiated to the tungsten thin layer specimen by an irradiation angle of 1 degree and an detector angle (an angle from an lined extended from the irradiated X-ray to the detector) is varied. Sputtering is performed on a W target under an atmosphere of Argon gas to form the W layer specimen. The forming is performed at a substrate temperature ranging from 20° C. to 25° C., an argon flow rate of 50 sccm, and a DC power ranging from 200 W to 300 W. Under the above conditions, a pressure is varied 0.4 Pa, 0.8 Pa, 2 Pa, and 4 Pa to form different layer specimens.

As shown in FIG. 9, variation of the pressure in forming the W layer results in variation of the structure of the W layer. At a pressure of 0.4 Pa or 0.8 Pa, peak groups caused by α-tungsten (α-W) are seen in an X-ray diffraction pattern. The peak groups mean two peaks at 40.3 degrees and 73.2 degrees shown by downward arrows in FIG. 9. The results reveal that the W layer is a thin layer comprising α-W having a Body-Centered Cubic lattice (BCC) structure. On the other hand, at a pressure of 2 Pa or 4 Pa, peak groups caused by α-W is small or disappears in an X-ray diffraction pattern, but peak groups caused by β-tungsten (β-W) appear. The peak groups caused by β-W mean four peaks at 35.5 degrees, 39.9 degrees, 43.9 degrees, and 75.2 degrees shown by downward arrows in FIG. 9. Since the peak groups caused by β-W are increased, it is considered that W layer is a thin layer comprising β-W.

In the above experiment, the existence of a-W and β-W are analyzed by X-ray diffraction analysis. However, it is also possible to perform the analysis by electron diffraction patterns using a transmission electron microscope.

FIGS. 10A, 10B, 11A, 11B, 12A, 12B, 13A, and 13B are SEM photographs of various W layers each having a thickness of approximately 50 nm. The W layers are formed under the four conditions described earlier. FIGS. 10A, 11A, 12A, and 13A are SEM observation photographs of cross-sectional views of the W layers formed at a pressure of 0.4 Pa, 0.8 Pa, 2 Pa, and 4 Pa, respectively. FIGS. 10B, 11B, 12B, and 13B are SEM observation photographs of an oblique overhead views of the W layers formed at a pressure of 0.4 Pa, 0.8 Pa, 2 Pa, and 4 Pa, respectively. In FIGS. 10A, 10B, 11A, 11B, 12A, 12B, 13A, and 13B, the target W layer is indicated by an arrow W. Likewise FIG. 9, these photographs show that variation of the pressure in forming the W layer results in variation of the structure of the W layer. At a pressure of 0.4 Pa (FIG. 10) or 0.8 Pa (FIG. 11) (in other words, in the case of α-W), the W layer has a dense layer structure and a smooth surface. On the other hand, at a pressure of 2 Pa (FIG. 12) or 4 Pa (FIG. 13), the W layer has a prismatic structure and an uneven surface.

Figure 14:
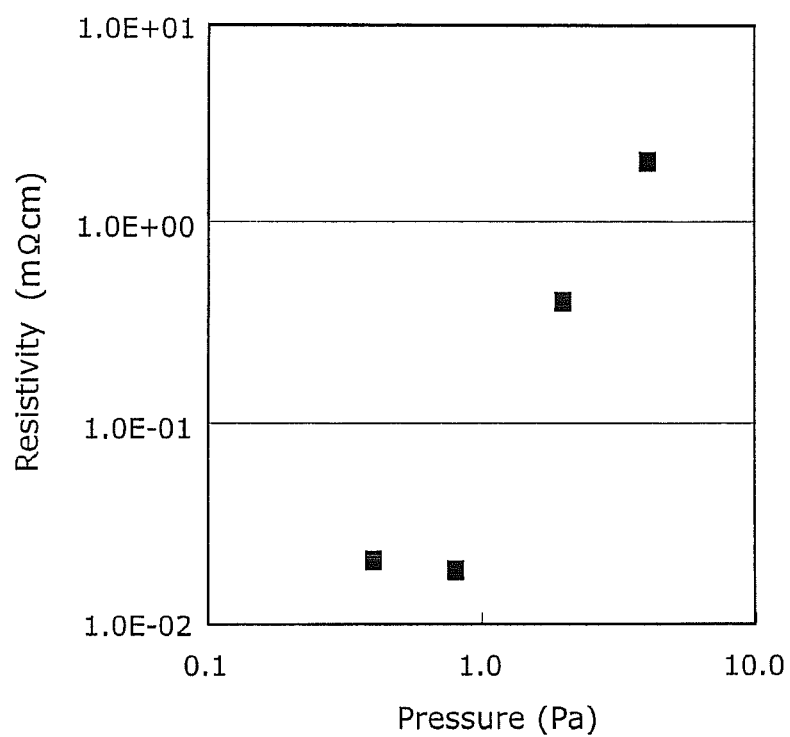
FIG. 14 is a characteristics graph plotting results of measuring resistivity of various four tungsten (W) layers.

FIG. 14 shows results of measuring resistivity of the various four W layers. The resistivity of the W layer varies depending on a pressure in the forming process, as being influenced by the structural variation seen in FIG. 9 or FIGS. 10A, 10B, 11A, 11B, 12A, 12B, 13A, and 13B. More specifically, FIG. 14 shows the following. At a pressure of 0.4 Pa or 0.8 Pa (in other words, in the case of α-W), a resistivity is approximately $2 \times 10^{-2}$ mΩcm. At a pressure of 2 Pa, a resistivity is approximately $4 \times 10^{-1}$ mΩcm. At a pressure of 4 Pa, a resistivity is approximately 2 mΩcm.

Figure 15A:
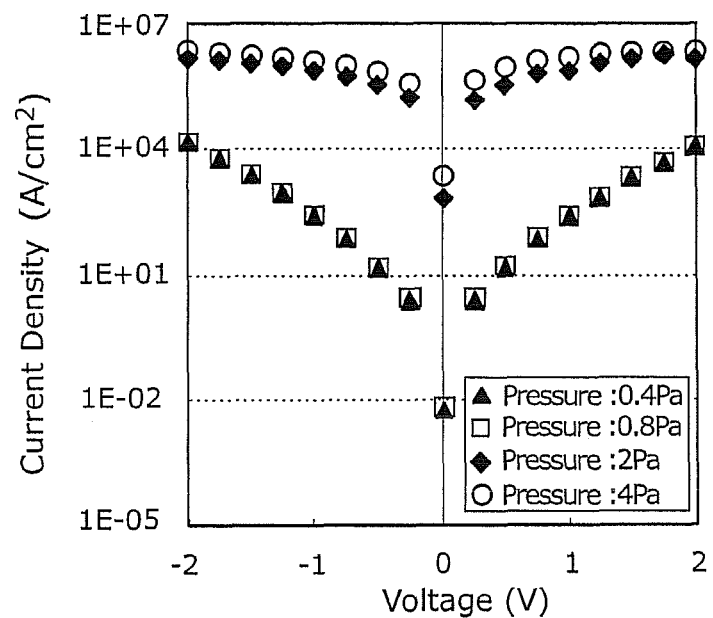
FIG. 15A is a graph plotting results of measuring current-voltage characteristics of a current steering element including: a current steering layer comprising $SiN_x$ having a thickness of 10 nm; and a pair of electrodes comprising tungsten (W), in the case where x=0.3.
Figure 15B:
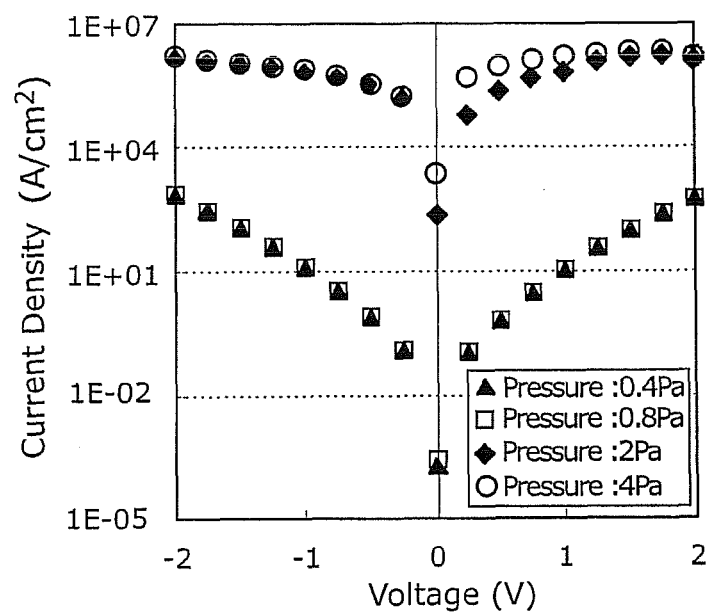
FIG. 15B is a graph plotting results of measuring current-voltage characteristics of a current steering element including: a current steering layer comprising $SiN_x$ having a thickness of 10 nm; and a pair of electrodes comprising tungsten (W), in the case where x=0.6.

Each of FIGS. 15A and 15B is a graph plotting results of measuring current (strictly, current density)-voltage characteristics of the current steering element 2, every 0.25 V. The current steering element 2 includes: the current steering layer 33 comprising $SiN_x$ having a thickness of 10 nm; and a pair of electrodes comprising W. Each of FIGS. 15A and 15B shows a voltage applied to the current steering element 2 on the horizontal axis, and an absolute value of a current density of a current flowing through the current steering element 2 on the vertical axis. FIG. 15A shows current-voltage characteristics in the case where the nitrogen composition ratio x of $SiN_x$ is 0.3, while FIG. 15B shows current-voltage characteristics in the case where the nitrogen composition ratio x of $SiN_x$ is 0.6. The W layers are formed under the above-described four conditions, namely, at a pressure of 0.4 Pa, 0.8 Pa, 2 Pa, and 4 Pa, respectively. Here, the method of forming the current steering element 2 is the same as that adopted in the measurement of FIG. 8. The pressure of 0.8 Pa in forming the W electrode results in almost the same current-voltage characteristics as those in the case of a pressure of 0.4 Pa. Therefore, at the pressure of 0.8 Pa, the current steering element 2 including electrodes comprising α-W has good current-voltage characteristics to serve as a current steering element, and also causes a current having a great current density exceeding 10000 A/cm² as seen in FIG. 8. On the other hand, at a pressure of 2 Pa or 4 Pa (in other words, the electrodes are made mainly of β-W), a significantly large current is flowing through the current steering element 2 at a voltage of ±0.5 V regardless of the nitrogen composition ratio x in $SiN_x$ of the current steering layer. Therefore, whichever the applied voltage is positive or negative, the current steering element causes an extremely large leak current between the electrodes. The current steering element 2 including such current steering element does not have the same current-voltage characteristics as those in the case of a pressure of 0.4 Pa or 0.8 Pa. This is because the following occurs due to difference or the like of the surface state among the W layers seen in FIGS. 10A, 10B, 11A, 11B, 12A, 12B, 13A, and 13B. At a pressure of 2 Pa or 4 Pa (in other words, the electrodes are made mainly of β-W), potential barriers are not formed between each of the W electrodes and the current steering layer 33 comprising $SiN_x$, regardless of the nitrogen composition ratio x. Therefore, if the electrodes comprise W, it is preferable to adopt W as their material in order to (i) decrease a resistivity of the electrode material, (ii) have good current-voltage characteristics suitable to serve as a current steering element, and (iii) causes a current having a great current density exceeding 10000 A/cm² (an example of the above-described minimum current density $J_{min}$ (A/cm²)). In short, α-W is one of materials preferable to be used for electrodes in the current steering element 2 having the current steering layer 33 comprising $SiN_x$.

In a view of thermodynamics, α-W is more stable than β-W. At a high temperature, β-W is converted to α-W with a volume change (volumetric shrinkage). Therefore, if the electrodes comprise of W, it is preferable to adopt α-W for reliability of the current steering element 2.

The α-W layer may be formed by the above-described sputtering. However, the method of forming the α-W layer is not limited to the sputtering, but may be so-called CVD method or the like. When the α-W layer is formed by the sputtering, it is preferable according to the above-described experimental results that the sputtering is performed on W target under an atmosphere of argon gas at a pressure of 0.8 Pa or less.

The following describes a relationship among (a) the characteristics of the current steering element 2, (b) a thickness of the $SiN_x$ layer serving as the current steering layer 33, and (c) a value of x in the $SiN_x$ layer. First, regarding a current steering layer without addition of hydrogen or fluorine, a relational expression for determining a relationship between a value of x in $SiN_x$ and a thickness is presented. Then, in the case of the current steering layer added with hydrogen according to the present embodiment, a relationship among a value of x, a thickness, and an added hydrogen density regarding the $SiN_x$ layer is described.

First, regarding a current steering layer without addition of hydrogen or fluorine, the description is given for a relationship between (a) characteristics of a current steering element including the current steering layer, (b) a thickness of a $SiN_x$ layer serving as the current steering layer, and (c) a value of x in $SiN_x$.

A current steering element is considered to have electrical conduction mechanism by which a current (known as thermionic emission current or Schottky current) flows from an electrode (comprising TaN, W, or the like) to a current steering layer (comprising $SiN_x$). The Schottky current depends on a work function of a material of the electrode. When potential barriers are formed against electrons emitted from the metal, the potential barriers are influenced by the emitted electrons (with negative charges) and coulomb electrostatic attraction (also known as image force). The image force is caused by positive charges left in the metal. The positive charges have the same amount as that of the negative charges. In consideration of the image force, a relationship between a voltage (hereinafter, denoted as V) applied to both ends of the current steering element and a current (hereinafter, denoted as J) flowing through the current steering element is determined. As a result, a relationship in which $\ln(J)$ is proportional to $(V)^{1/2}$ is derived (the expression derivation is disclosed in more detail in, for example, Non-Patent Reference 1 "Denki Denshi Zairyo Kougaku (EE Text)" by Mitsumasa Iwamoto, Ohmsha, Ltd., 2004).

Figure 16A:
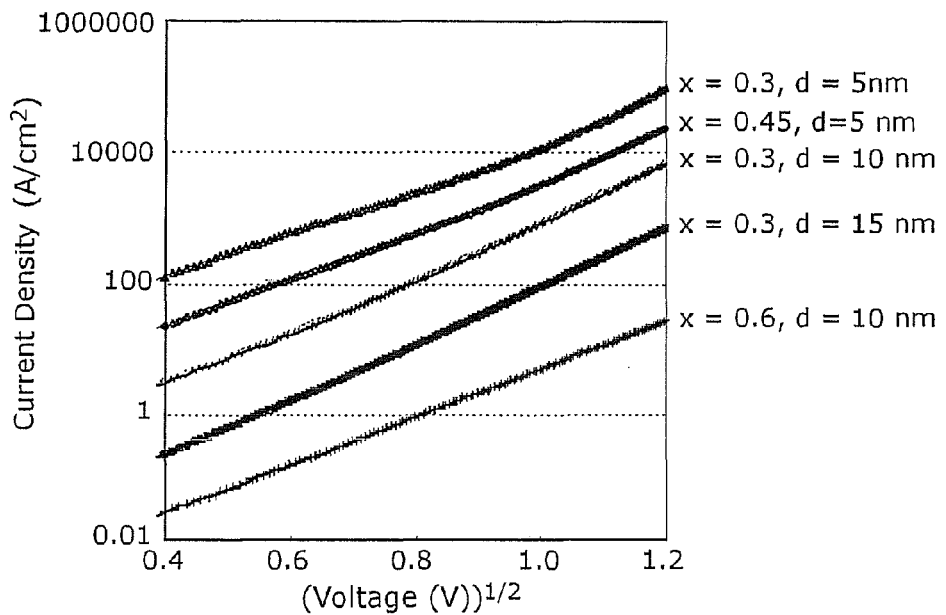
FIG. 16A is a characteristics graph plotting results of measuring current-voltage characteristics of a current steering element including: a current steering layer comprising $SiN_x$ having a thickness of 10 nm; and a pair of electrodes comprising tantalum nitride (TaN) or tungsten (W), in the case where, as an specimen, the electrodes comprise tantalum nitride (TaN) and the current steering layer has $SiN_x$ nitrogen composition ratio x and the thickness d which are changed.
Figure 16B:
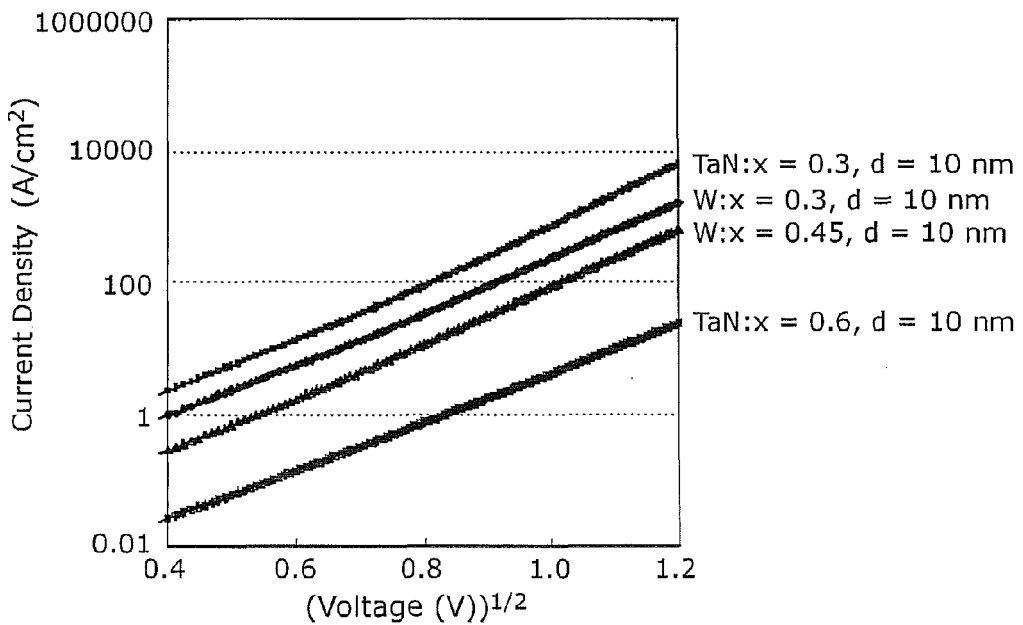
FIG. 16B is a characteristics graph plotting results of measuring current-voltage characteristics of a current steering element including: a current steering layer comprising $SiN_x$ having a thickness of 10 nm; and a pair of electrodes comprising tantalum nitride (TaN) or tungsten (W), in the case where, as an specimen, the electrodes comprise tantalum nitride (TaN) or tungsten (W) and the current steering layer has $SiN_x$ nitrogen composition ratio x that is changed.

Actually, FIGS. 16A and 16B show single logarithmic charts of current (strictly, current density)-voltage characteristics of various MSM diodes including electrodes comprising TaN or W. Each of the figures shows a current density of a current flowing through the current steering element on the vertical axis, and a square root of a voltage applied to both ends of the current steering element on the horizontal axis. FIG. 16A shows data of specimens of the current steering element including the current steering layer 33 comprising $SiN_x$ and the electrodes comprising TaN, in which a nitrogen composition ratio x in $SiN_x$ and a thickness of the current steering layer 33 are varied. Each nitrogen composition ratio x and each thickness d are indicated at the right side of the graph in FIG. 16A. FIG. 16B shows data of specimens of the current steering element including the current steering layer 33 comprising $SiN_x$ and the electrodes comprising TaN or W, in which a nitrogen composition ratio x in $SiN_x$ is varied. Each electrode material and the nitrogen composition ratio x are indicated at the right side of the graph in FIG. 16B. In FIG. 16B, the thickness d of the current steering layer 33 is fixed to be 10 nm.

It is seen from the graphs in FIGS. 16A and 16B that results are straight lines with the almost same slope, which suggests the above-described relationship in which $\ln(J)$ is proportional to $(V)^{1/2}$. Based on the above results, it is possible to express the current J flowing through the current steering element 2 by the following Formula (5).

$$J = A \cdot \exp(\gamma(V)^{1/2}) \quad (5)$$

where $\gamma$ is a constant not depending on a value of x in $SiN_x$ and a thickness of the current steering layer 33, and the coefficient A is a constant not depending on the voltage V applied to both ends of the current steering element.

Next, the consideration is made for a thickness (hereinafter, denoted as d) of the current steering layer 33. Schottky current depends on a height of a barrier (known as Schottky barrier) at a junction between the electrode and the current steering layer 33. For the barrier height, (a) a work function of a material of the electrode, (b) electron affinity of the current steering layer 33, (c) an interface energy level at the interface between the electrode and the current steering layer 33, and the like are generally dominant. A relationship between a thickness d of the current steering layer 33 and Schottky current is not obvious. According to Formula (5), a term except the constant A in the right-hand side depends on V of the current-voltage characteristics of MSM diodes. Therefore, it appears that the thickness d is influenced by the constant A. Therefore, a relationship between Schottky current and the thickness d of the current steering layer 33 is determined by the following experiments. More specifically, there are formed current steering elements (having either of two kinds of values of x, 0.3 or 0.45) each including the current steering layer 33 comprising $SiN_x$ with a thickness of 5 nm, 10 nm, or 15 nm. Under assumption that current-voltage characteristics of these current steering elements can be approximated by Formula (5), the constants A and $\gamma$ are determined by a least-square method to express a relationship between the thickness d and the constant A. The relationship is shown in FIG. 17.

Figure 17:
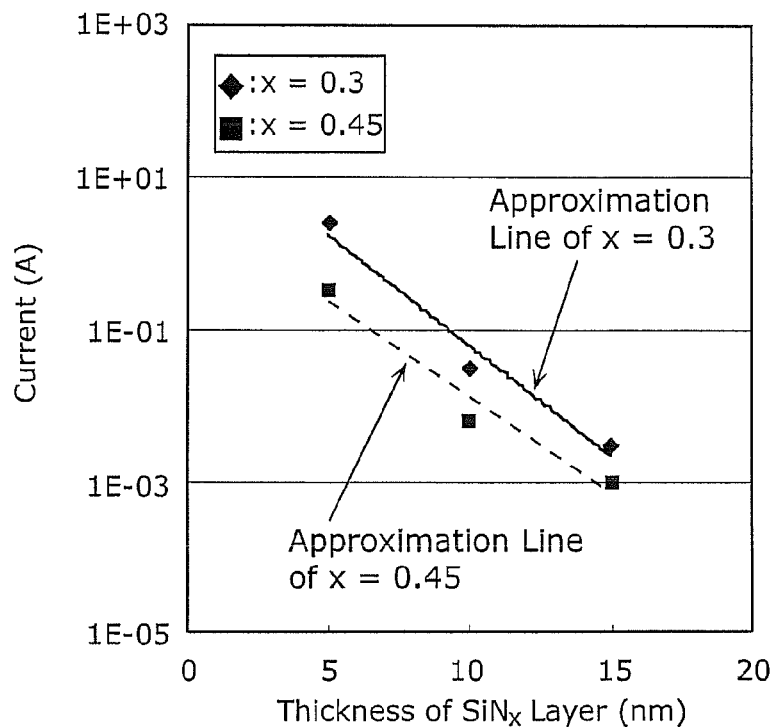
FIG. 17 is a characteristics graph plotting a relationship between A in Formula (5) and a thickness d of a current steering layer comprising $SiN_x$.

As shown in FIG. 7, $\ln(A)$ is proportional to the thickness d, and variation of a value of x in $SiN_x$ hardly vary the inclinations of the straight lines in FIG. 17. Therefore, it is possible rewrite Formula (5) expressing the current J flowing through the current steering element 2 to the following Formula (6).

$$J = B \cdot \exp(\alpha \cdot d) \exp(\gamma(V)^{1/2}) \quad (6)$$

where $\alpha$ is a constant not depending on a value of x in $SiN_x$ and the thickness d of the $SiN_x$ layer serving as the current steering layer 33, and B is a constant not depending on the voltage V applied to both ends of the current steering element 2 and the thickness d of the $SiN_x$ layer.

According to the present embodiment, the current steering layer 33 comprises $SiN_x$. Therefore, as described previously, variation of a value of x in $SiN_x$ can continuously vary a forbidden band width, thereby controlling a size of the potential barrier. Regarding dependency of potential barrier caused by $SiN_x$ on the nitrogen composition ratio x, an optical bandgap of $SiN_x$ is almost proportional to a value of x (see Non-Patent Reference 2 that is R. Karcher et al, Physical Review B, vol. 30, page 1896-1910, 1984, for example). It is therefore considered that potential barrier caused by $SiN_x$ is almost proportional to a value of x. This means that the flowing current is considered to be proportional to an exponential function of x.

From the above examination results, the following Formula (7) can express the current J flowing through the current steering element.

$$J = C \cdot \exp(\alpha \cdot d) \exp(\beta \cdot x) \exp(\gamma(V)^{1/2}) \quad (7)$$

where C, $\alpha$, $\beta$, and $\gamma$ are constants.

By using the measured values of the current-voltage characteristics of the current steering element 2 shown in FIGS. 16A and 16B, C, $\alpha$, $\beta$, and $\gamma$ in Formula (7) are determined by a least-square method. As a result, $C = 7.46 \times 10^{-2}$, $\alpha = -6.25 \times 10^{-1}$, $\beta = -11.7$, and $\gamma = 9.76$. By using these values, it is possible to calculate the current-voltage characteristics of the current steering element 2. In Formula (7), the unit of the thickness d is nanometer (nm), the unit of the voltage V is V, and the units of the current J is $A/cm^2$.

Figure 18:
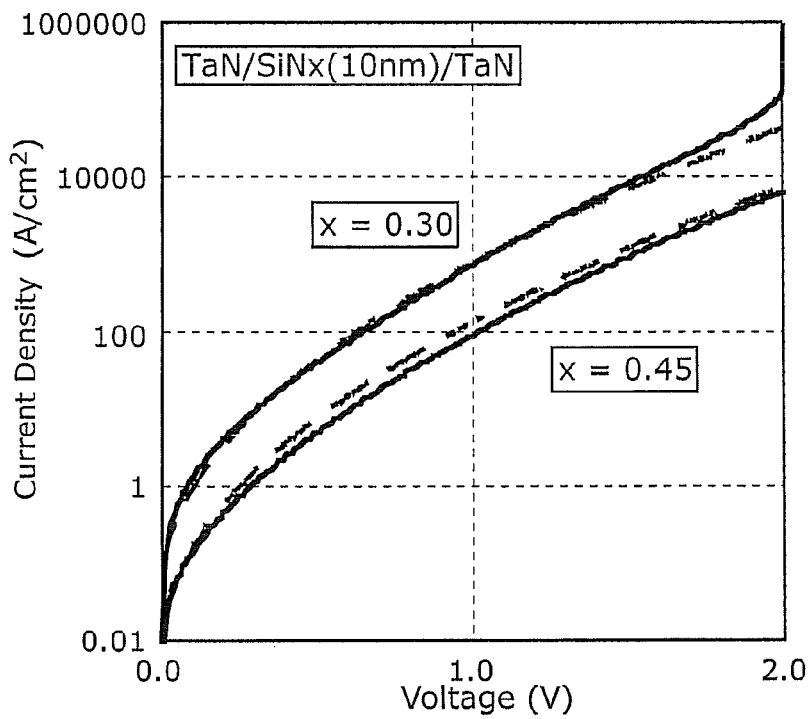
FIG. 18 is a characteristics graph plotting (a) values of measuring current-voltage characteristics and (b) values of calculating Formula (7), regarding a current steering element including a current steering layer comprising $SiN_x$ and electrodes comprising TaN.

FIG. 18 shows some of the measured values of the current (strictly, current density)-voltage characteristics of the current steering element 2 shown in FIG. 16, along with the calculated values of Formula (7). However, FIG. 18 shows a voltage on the horizontal axis not a square root of the voltage. The current-voltage characteristics in FIG. 18 are almost the same. It is therefore considered that Formula (7) expresses current-voltage characteristics of the current steering element 2.

As shown in the figures, the current-voltage characteristics of the current steering element 2 including the current steering layer 33 comprising $SiN_x$ depend on (a) a nitrogen composition ratio x and (b) a thickness of the current steering layer 33. Appropriate adjustment of (a) the nitrogen composition ratio x and (b) the thickness of the current steering layer 33 can provide desired (more preferable) current-voltage characteristics. In terms of the characteristics required to write data into the variable resistance element, it is more preferable that a current of a current density of 10000 A/cm$^2$ (an example of the minimum current density $J_{min}$ (A/cm$^2$)) or more can be flow in the data writing. Assuming that $V_0$ denotes a maximum value of a voltage applicable to both ends of the variable resistance element (more strictly, a voltage applicable between the first electrode 32 and the second electrode 31), a relationship between the nitrogen composition ratio x and the thickness d is expressed by the following Formulae based on Formula (7).

$$(\ln(10000(C \cdot \exp(\alpha \cdot d) \exp(\beta \cdot x))^{-1}/\gamma)^2 \leq V_0 \quad (8)$$

$$(\ln(30000(C \cdot \exp(\alpha \cdot d) \exp(\beta \cdot x))^{-1}/\gamma)^2 \leq V_0 \quad (9)$$

$$(\ln(50000(C \cdot \exp(\alpha \cdot d) \exp(\beta \cdot x))^{-1}/\gamma)^2 \leq V_0 \quad (10)$$

Formula (8) expresses a relational expression in the case where a current flowing through the current steering element 2 has a current density of 10000 A/cm$^2$. Here, the left-hand side of Formula (8) expresses a value determined regarding the voltage V in Formula (7). More specifically, the left-hand side of Formula (8) expresses a voltage to be applied to both ends of the current steering element 2 to cause a current having a current density $J_{min}$(A/cm$^2$) of 10000 A/cm$^2$ to flow through the current steering element 2. Therefore, the inequality of Formula (8) expresses conditions under which a voltage to be applied to both ends of the current steering element 2 is a maximum voltage $V_0$ or less, in order to cause a current having a current density of 10000 A/cm$^2$ to flow through the current steering element 2. In other words, the inequality of Formula (8) expresses the conditions under which, even if a voltage applied to both ends of the current steering element 2 is the maximum voltage $V_0$ or less, a current having a current density $J_{min}$(A/cm$^2$) of 10000 A/cm$^2$ surely flows through the current steering element 2. In short, the inequality of Formula (8) expresses a relationship to be satisfied between the thickness d and the nitrogen composition ratio x.

Formula (9) expresses a relational expression in the case where a current flowing through the current steering element 2 has a current density of 30000 A/cm$^2$ (the relational expression corresponds to the conditions disclosed in Patent Reference 2). In other words, the inequality of Formula (9) expresses the conditions under which, even if a voltage applied to both ends of the current steering element 2 is the maximum voltage $V_0$ or less, a current having a current density $J_{min}$ (A/cm$^2$) of 30000 A/cm$^2$ surely flows through the current steering element 2. In short, the inequality of Formula (9) expresses a relationship to be satisfied between the thickness d and the nitrogen composition ratio x.

Formula (10) expresses a relational expression in the case where a current flowing through the current steering element 2 has a current density of 50000 A/cm$^2$. In other words, the inequality of Formula (10) expresses the conditions under which, even if a voltage applied to both ends of the current steering element 2 is the maximum voltage $V_0$ or less, a current having a current density $J_{min}$ (A/cm$^2$) of 50000 A/cm$^2$ surely flows through the current steering element 2. In short, the inequality of Formula (10) expresses a relationship to be satisfied between the thickness d and the nitrogen composition ratio x.

Figure 19:
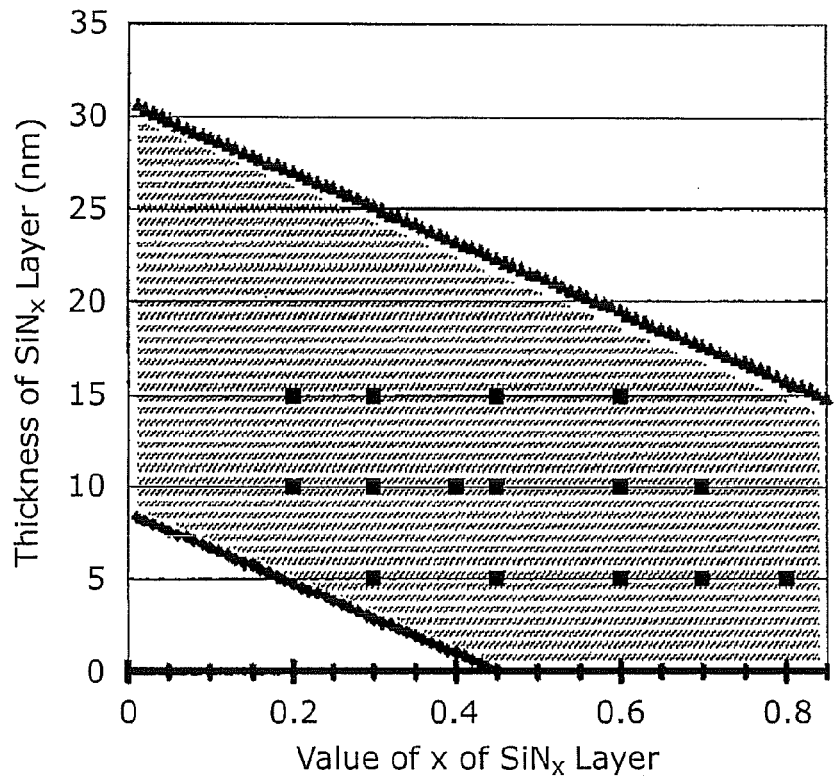
FIG. 19 is a characteristics graph plotting a combination of a thickness d and a nitrogen composition ratio x which satisfies Formulae (8) and (11) at the same time, regarding a current steering layer comprising $SiN_x$.
Figure 20:
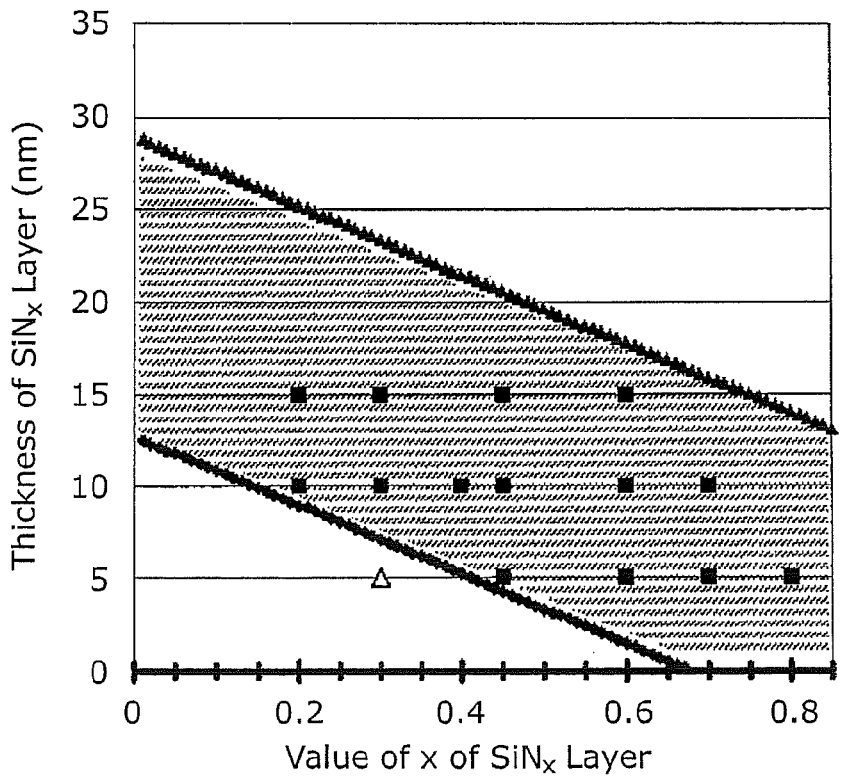
FIG. 20 is a characteristics graph plotting a combination of a thickness d and a nitrogen composition ratio x which satisfies Formula (9) and (12) at the same time, regarding the current steering layer comprising $SiN_x$.
Figure 21:
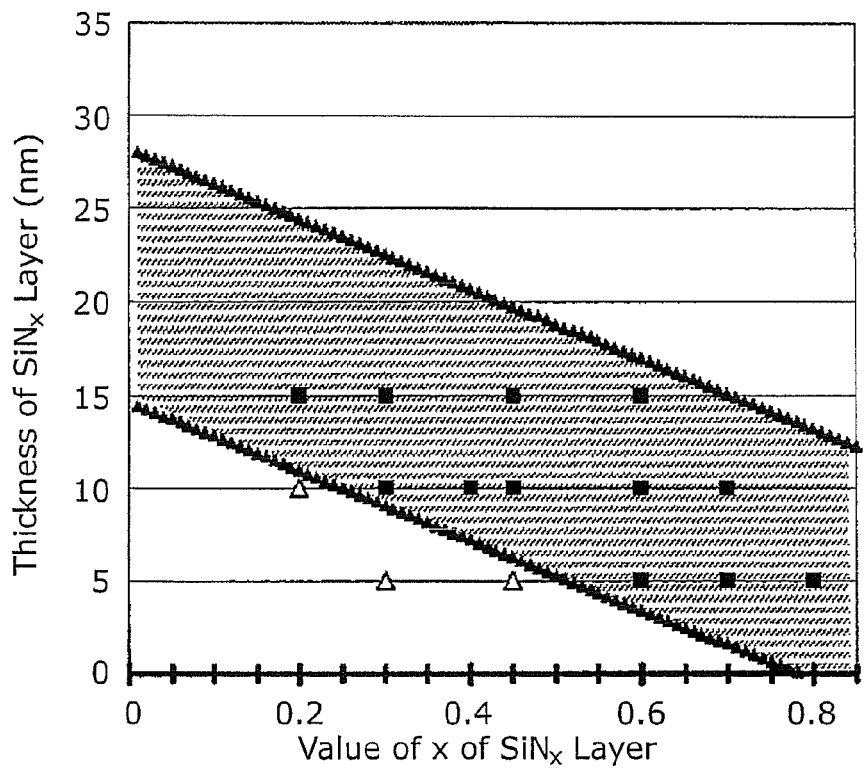
FIG. 21 is a characteristics graph plotting a combination of a thickness d and a nitrogen composition ratio x which satisfies Formula (10) and (13) at the same time, regarding the current steering layer comprising $SiN_x$.

FIGS. 19, 20, 21 plot Formulae (8), (9), and (10), respectively, in the case of $V_0$=5 V. In each of the figures, an upper-limit line in a direction of a thickness of a $SiN_x$ layer is a line at an equal sign of a corresponding Formula.

As shifting from Formula (8) to Formula (9), or from Formula (9) to Formula (10), a current density of a current flowing through the current steering element 2 is increased. In a view of design flexibility of a memory circuit structure, the above conditions are preferable with enough allowance. However, in a view of design flexibility of memory manufacturing process, the above conditions are harder. Whatever the case, it is necessary to set an appropriate nitrogen composition ratio x and an appropriate thickness d depending on characteristics, operation conditions, and the like of a target variable resistance element.

In a view of non-linearity of the electrical resistance characteristics of the current steering element 2, in data writing and reading, the current steering element 2 become in a blocking state (state where a current flowing through the current steering element 2 is very small) when a memory element including the current steering element 2 is applied with a voltage that is equal to or lower than a voltage applied to non-selected memory elements except a selected memory element. A maximum value of the voltage applied to non-selected memory elements except the selected memory element is a half of a voltage applied to the selected memory element in data writing. Therefore, if the maximum voltage is applied to a target memory element, the current steering element 2 connected to the target memory element becomes in the blocking state. In the blocking state, it is desirable that the current flowing through the current steering element 2 is small. (In other words, it is desirable that a difference between (a) the current flowing through the current steering element 2 in the blocking state and (b) a current flowing through the current steering element 2 in the conduction state is great.) Furthermore, it is necessary that (a) the current flowing through the current steering element 2 in the blocking state is at least equal to or smaller than (c) a current flowing through the current steering element 2 connected to a variable resistance element in a high resistance state, in order to distinguish between a high resistance state and a low resistance state in data reading.

With referring back to FIG. 1, a current flowing through the current steering element 2 connected to the variable resistance element in a high resistance state is seen, for example, at a voltage (a) ranging from 0 V to approximately −0.8 V, which appears as a curve indicated by the arrow 1 and (b) ranging from 0 V to approximately +0.5 V, which appears as a curve indicated by the arrow 4. On the other hand, a current flowing through the current steering element 2 connected to the variable resistance element in a low resistance state is seen, for example, at a voltage (a) ranging from 0 V to approximately +0.9 V, which appears as a curve indicated by the arrow 3, and (b) ranging from approximately −0.6 V to 0 V, which appears as a curve indicated by the arrow 2. Based on the above observation, a difference between the current in the high resistance state and the current in the low resistance state is examined at a voltage of ±0.5 V. (This is because the current-voltage characteristics both in the high resistance state and in the low resistance state are almost linear at a voltage ranging from −0.5 V to +0.5 V). As a result, the current in the high resistance state is approximately in a range from one fourth to one fifth of the current in the low resistance state. Therefore, the current flowing through the current steering element 2 in the blocking state should be approximately at least in a range from one fourth to one fifth of the current in the current steering element 2 connected to the variable resistance element in the low resistance state. In consideration of variation of the current steering elements 2, the current flowing through the current steering element 2 in the blocking state is desirably equal to or smaller than one tenth, further desirably equal to or smaller than one thirtieth, and still further desirably equal to or smaller than one fiftieth of the current flowing through the variable resistance element 2 included in the variable resistance element in the low resistance state.

In consideration of above, a current flowing through the current steering element 2 at a voltage applied to non-selected memory elements except a selected memory element in data writing (here, the voltage is a half of a voltage applied to the selected memory element in data writing, and the current steering element 2 is in a blocking state) is demanded to be smaller by one or more digits than a current flowing through the current steering element 2 at a voltage applied to the selected memory element in data writing (here, the current flows in data writing and is larger than the current flowing through the memory element when the variable resistance element is in a low resistance state). More specifically, a possible maximum current density $J_{off}$ (A/cm$^2$) of a current flowing through the current steering element 2 in the blocking state is preferably one tenth, further preferably one thirtieth, and still further preferably one fiftieth of the minimum current density $J_{min}$ (A/cm$^2$) of a current to flow through the current steering element 2.

Base on the above, the relationship between the nitrogen composition ratio x and the thickness d is expressed by Formula (7) as follows.

$$(\ln(1000(C \cdot \exp(\alpha \cdot d)\exp(\beta \cdot x))^{-1})\gamma)^2 - (\ln(10000(C \cdot \exp(\alpha \cdot d)\exp(\beta \cdot x))^{-1})\gamma)^2/2 \geq 0 \quad (11)$$

$$(\ln(1000(C \cdot \exp(\alpha \cdot d)\exp(\beta \cdot x))^{-1})\gamma)^2 - (\ln(30000(C \cdot \exp(\alpha \cdot d)\exp(\beta \cdot x))^{-1})\gamma)^2/2 \geq 0 \quad (12)$$

$$(\ln(1000(C \cdot \exp(\alpha \cdot d)\exp(\beta \cdot x))^{-1})\gamma)^2 - (\ln(50000(C \cdot \exp(\alpha \cdot d)\exp(\beta \cdot x))^{-1})\gamma)^2/2 \geq 0 \quad (13)$$

Formula (II) expresses that (a) a voltage applied to non-selected memory elements (in other words, a voltage that is a half of a voltage applied to a selected memory element in data writing) is equal to or lower than (b) a voltage applied to both ends of the current steering element 2 in which a current flowing through the current steering element 2 has a current density of 1000 A/cm$^2$. The current density of 1000 A/cm$^2$ is smaller by one digit than a current density of 10000 A/cm$^2$ of a current flowing through the current steering element 2 when a voltage applied to the selected memory element in data writing is applied. In other words, Formula (II) expresses the conditions (a relationship to be satisfied between the thickness d and the nitrogen composition ratio x) under which the maximum current density $J_{off}$ (A/cm$^2$) of a current flowing through the current steering element 2 in a non-selected state is equal to or smaller than one tenth of the minimum current density $J_{min}$ (A/cm$^2$) of a current flowing through the current steering element in a selection state.

Formula (12) is a relational expression in the case where (i) a current density of a current flowing through the current steering element 2 is 30000 A/cm$^2$ (if the current density of 30000 A/cm$^2$ is required to change resistance of the variable resistance element) and (ii) a current density of a current flowing through the current steering element 2 at a voltage that is a half of a voltage applied to a selected memory element in data writing is 1000 A/cm$^2$ or less. In other words, Formula (12) expresses the conditions (a relationship to be satisfied between the thickness d and the nitrogen composition ratio x) under which the current density $J_{off}$ (A/cm$^2$) of a current flowing through the current steering element 2 in a non-selected state is equal to or smaller than one thirtieth of the current density $J_{min}$ (A/cm$^2$) of a current flowing through the current steering element 2 in a selection state.

Formula (13) is a relational expression in the case where (i) a current density of a current flowing through the current steering element 2 is 50000 A/cm$^2$ and (ii) a current density of a current flowing through the current steering element 2 at a voltage that is a half of a voltage applied to a selected memory element in data writing is 1000 A/cm$^2$ or less. In other words, Formula (13) expresses the conditions (a relationship to be satisfied between the thickness d and the nitrogen composition ratio x) under which the current density $J_{off}$ (A/cm$^2$) of a current flowing through the current steering element 2 in a non-selected state is equal to or smaller than one fiftieth of the current density $J_{min}$ (A/cm$^2$) of a current flowing through the current steering element 2 in a selection state.

FIGS. 19, 20, 21 plot Formulae (11), (12), and (13), respectively. In each of the figures, a lower-limit line in a direction of a thickness of a $SiN_x$ layer is a line at an equal sign of a corresponding Formula.

As shifting from Formula (11) to Formula (12), or from Formula (12) to Formula (13), a current density of a current flowing through the current steering element 2 is increased, and a difference between a current flowing through the current steering element 2 in a blocking state and a current flowing through the current steering element 2 in a conduction state is also increased. In a view of design flexibility of a memory circuit structure, the above conditions are preferable with enough allowance. However, in a view of design flexibility of memory manufacturing process, the above conditions are harder. Whatever the case, it is necessary to set an appropriate nitrogen composition ratio x and an appropriate thickness d depending on characteristics, operation conditions, and the like of a target variable resistance element.

FIG. 19 shows a range of combinations between the thickness d and the nitrogen composition ratio x which satisfy Formula (8) and (11). In FIG. 19, dots in a region (seen as a hatched region) surrounded by two diagonal lines satisfy Formula (8) and (11). In FIG. 19, a voltage ($V_0$) applied to the current steering element 2 is 5 V. A range of $SiN_x$ is $0 < x \leq 0.85$, and a range of the thickness d is $0 < d$. Under the above conditions, specimens of the current steering element 2 are actually manufactured to be evaluated in experiments. The small black squares in FIG. 19 represent combinations between the thickness d and the nitrogen composition ratio x which can satisfy Formula (8) and (11) in the experiments.

FIG. 20 shows a range of combinations between the thickness d and the nitrogen composition ratio x which satisfy Formula (9) and (12). In FIG. 20, dots in a region (seen as a hatched region) surrounded by two diagonal lines satisfy Formula (9) and (12), where $0 < x \leq 0.85$ and $0 < d$. In FIG. 20, a voltage ($V_0$) applied to the current steering element 2 is 5 V. Under the above conditions, specimens of the current steering element 2 are actually manufactured to be evaluated in experiments. The small black squares in FIG. 20 represent combinations between the thickness d and the nitrogen composition ratio x which can satisfy Formula (9) and (12) in the experiments. On the other hand, the small white triangles in FIG. 20 represent combinations between the thickness d and the nitrogen composition ratio x which do not satisfy both Formula (9) and (12) in the evaluation results of the actually manufactured current steering element 2 specimens.

Likewise, FIG. 21 shows a range of combinations between the thickness d and the nitrogen composition ratio x which satisfy Formula (10) and (13). In FIG. 21, dots in a region (seen as a hatched region) surrounded by two diagonal lines satisfy Formula (10) and (13), where $0<x\leq0.85$ and $0<d$. In FIG. 21, a voltage ($V_0$) applied to the current steering element 2 is 5 V. Under the above conditions, specimens of the current steering element 2 are actually manufactured to be evaluated in experiments. The small black squares in FIG. 21 represent combinations between the thickness d and the nitrogen composition ratio x which can satisfy Formula (10) and (13) in the experiments. On the other hand, the small white triangles in FIG. 21 represent combinations between the thickness d and the nitrogen composition ratio x which do not satisfy both Formula (10) and (13) in the evaluation results of the actually manufactured current steering element 2 specimens.

FIG. 20 shows a range of appropriate combinations between the thickness d and the nitrogen composition ratio x of the current steering element 2 according to Formula (9) and (12) based on Formula (7). FIG. 21 shows a range of appropriate combinations between the thickness d and the nitrogen composition ratio x of the current steering element 2 according to Formula (10) and (13) based on Formula (7). The evaluation results of the various current steering element 2 specimens are the same between FIGS. 20 and 21. Such results are considered as proving a reasonability of Formula (7) and a reasonability of Formulae (8) and (13) derived from Formula (7).

Figure 22:
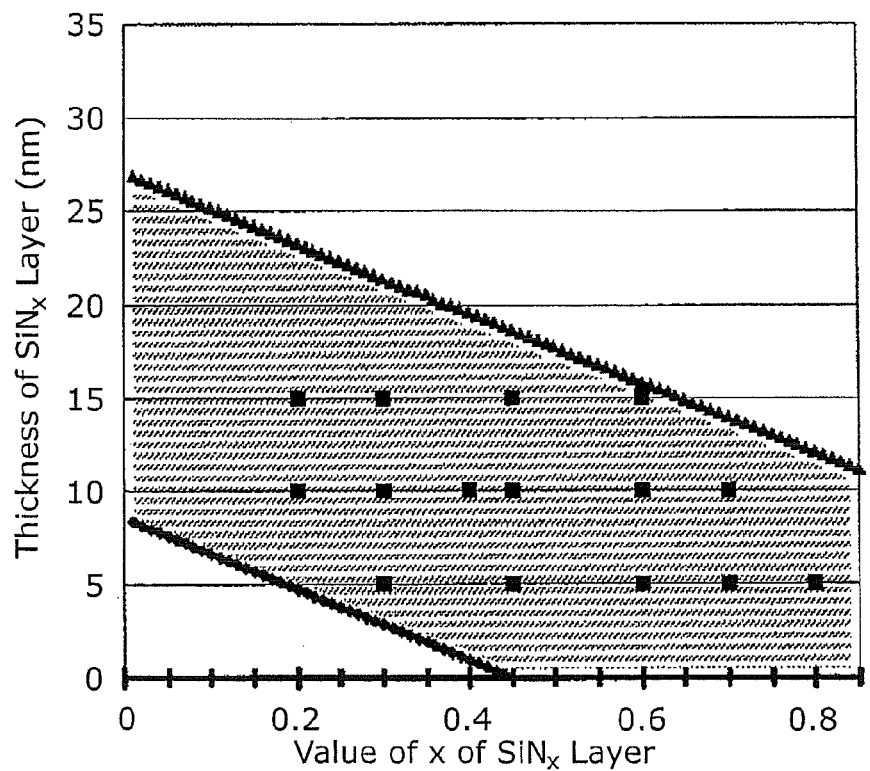
FIG. 22 is a characteristics graph plotting a combination of a thickness d and a nitrogen composition ratio x which satisfies Formula (8) and (11) at the same time, regarding the current steering layer comprising $SiN_x$.

FIG. 22 shows a range of combinations between the thickness d and the nitrogen composition ratio x which satisfy Formula (8) and (11). In FIG. 22, a voltage ($V_0$) applied to the current steering element 2 is 4V. In FIG. 22, dots in a region (seen as a hatched region) surrounded by two diagonal lines satisfy Formula (8) and (11). Under the above conditions, specimens of the current steering element 2 are actually manufactured to be evaluated in experiments. The small black squares in FIG. 22 represent combinations between the thickness d and the nitrogen composition ratio x which can satisfy Formula (8) and (11) in the experiments.

Figure 23:
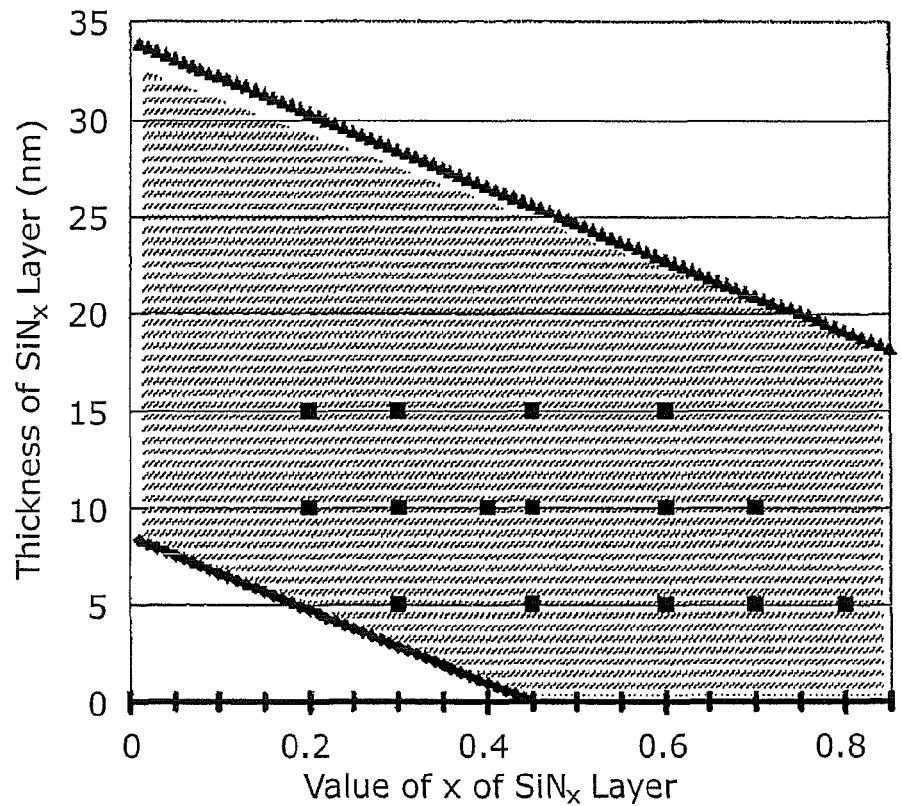
FIG. 23 is a characteristics graph plotting a combination of a thickness d and a nitrogen composition ratio x which satisfies Formula (8) and (11) at the same time, regarding the current steering layer comprising $SiN_x$.

FIG. 23 shows a range of combinations between the thickness d and the nitrogen composition ratio x which satisfy Formula (8) and (11). In FIG. 23, a voltage ($V_0$) applied to the current steering element 2 is 6V. In FIG. 23, dots in a region (seen as a hatched region) surrounded by two diagonal lines satisfy Formula (8) and (11). Under the above conditions, specimens of the current steering element 2 are actually manufactured to be evaluated in experiments. The small black squares in FIG. 23 represent combinations between the thickness d and the nitrogen composition ratio x which can satisfy Formula (8) and (11) in the experiments.

The combinations between the thickness d and the nitrogen composition ratio x which are shown in FIGS. 19 to 23 are applied to the current steering layer 33. Thereby, it is possible to provide the current steering element 2 including the above current steering layer 33, a memory element including the above current steering element 2 and a variable resistance element, and a memory including the above memory elements. The current steering element, the memory element, and the memory can (i) prevent write didturb even when an electrical pulse with different polarities is applied, (ii) cause a large current to flow through the variable resistance element, and (iii) write data without any problems.

Furthermore, it is also possible to limit the thickness d to 5 nm or more in the combinations between the thickness d and the nitrogen composition ratio x which are shown in FIGS. 19 to 23. With the structure, a leak current caused by tunnel effects can be surely prevented from flowing through the current steering element 2. As a result, it is possible to provide a memory element and a memory in which the current steering element 2 has stable characteristics.

As obvious from the most preferred range in FIG. 19, an upper limit of the thickness d of a $SiN_x$ layer serving as the current steering layer 33 is preferably 30 nm.

Furthermore, as shown in the relationship between the thickness d and the nitrogen composition ratio x of a $SiN_x$ layer in the case of $V_0=5$ V, a maximum value $V_0$ of a voltage applicable to both ends of the current steering element 2 (namely, a voltage applicable between the first electrode 32 and the second electrode 31) is preferably 5 V, and more preferably 5 V or less.

Next, in the case of the current steering layer 33 added with hydrogen according to the present embodiment, a relationship among a value of x, a thickness, and an added hydrogen density regarding the $SiN_x$ layer is described.

As described above, the current-voltage characteristics of the current steering element 2 including the current steering layer 33 comprising $SiN_x$ without hydrogen is expressed by Formula (7). Here, Formula (7) is examined based on experimental results of the current steering layer 33 comprising $SiN_x$ added with hydrogen or fluorine according to the present embodiment. Thereby, each of the constants in Formula (7) is calculated to determine effects of the hydrogen added in the current steering layer 33 to the current-voltage characteristics.

Figure 24:
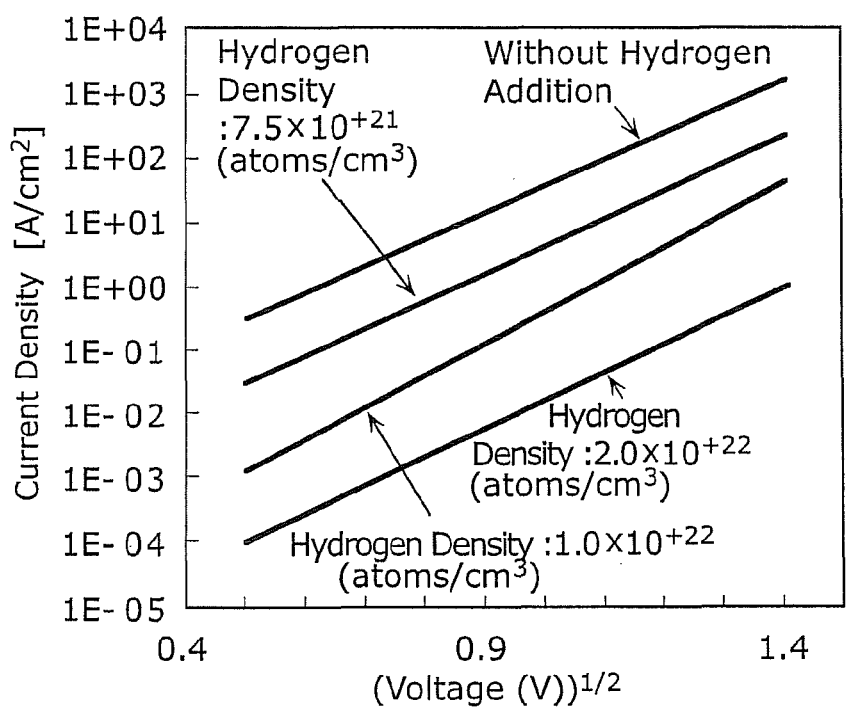
FIG. 24 is a single logarithmic chart where a vertical axis indicates a current density (A/cm$^2$) of a current flowing through the current steering element including the current steering layer comprising $SiN_x$ added with hydrogen shown in FIG. 7, and a horizontal axis indicates a square root ($V^{1/2}$) of a voltage applied to both ends of the current steering element.

FIG. 24 is a single logarithmic chart where a vertical axis indicates a current density ($A/cm^2$) of a current flowing through the current steering element 2 including the current steering layer 33 comprising $SiN_x$ added with hydrogen shown in FIG. 7, and a horizontal axis indicates a square root ($V^{1/2}$) of a voltage applied to both ends of the current steering element 2. As seen in FIG. 24, the characteristics of the current steering layer 33 comprising $SiN_x$ added with hydrogen is represented by a straight line with the almost same inclination as that of the case where hydrogen is not added. This means that the hydrogen addition does not influence γ in Formula (5).

Figure 25:
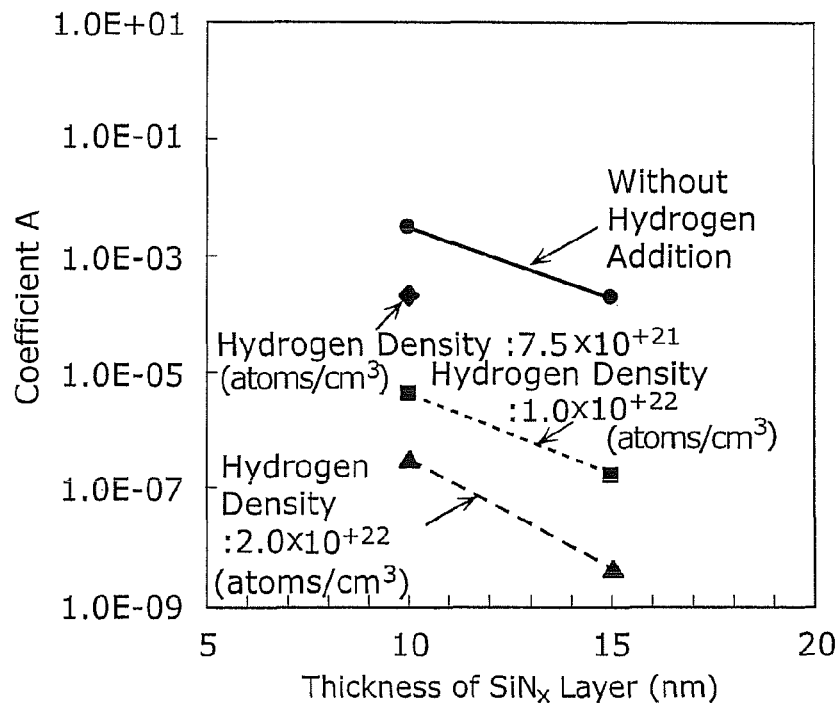
FIG. 25 is a characteristics graph plotting a relationship between a thickness d and a constant A, in the case where the thickness d of the current steering layer comprising $SiN_x$ added with hydrogen is varied and A and γ in Formula (5) are determined by a least-square method.

FIG. 25 is a graph plotting a relationship between a thickness d and a constant A, in the case where the thickness d of the current steering layer 33 comprising $SiN_x$ added with hydrogen is varied as 10 nm and 15 nm, and A and γ in Formula (5) are determined by a least-square method. As seen in FIG. 25, the line representing characteristics of the current steering layer 33 comprising $SiN_x$ added with hydrogen has the almost same inclination as that of the case where hydrogen is not added. This means that the hydrogen addition hardly influences a in Formula (6).

Figure 26:
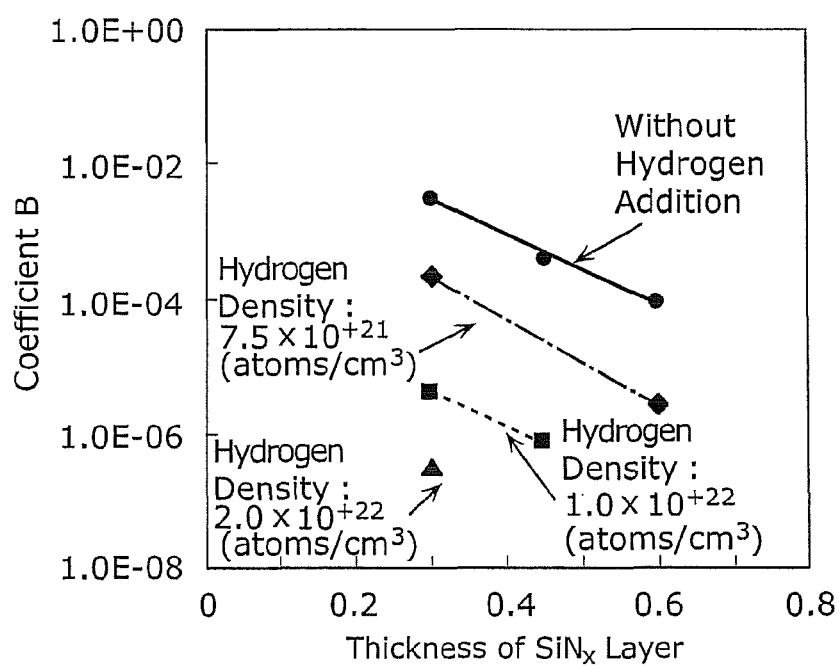
FIG. 26 is a characteristics graph plotting a relationship between a value of the nitrogen composition ratio x and a constant B, in the case where the nitrogen composition ratio x of the current steering layer comprising $SiN_x$ added with hydrogen is varied and B and β in Formula (6) are determined by a least-square method.

FIG. 26 is a graph plotting a relationship between a value of x and a constant B, in the case where a value of x in the current steering layer 33 comprising $SiN_x$ added with hydrogen is varied as x=0.3, x=0.45, and x=0.6, and B and β in Formula (6) are determined by a least-square method. As seen in FIG. 26, the result of the current steering layer 33 comprising $SiN_x$ added with hydrogen has the almost same inclination as that of the case where hydrogen is not added. This means that the hydrogen addition does not influence β in Formula (7).

Figure 27:
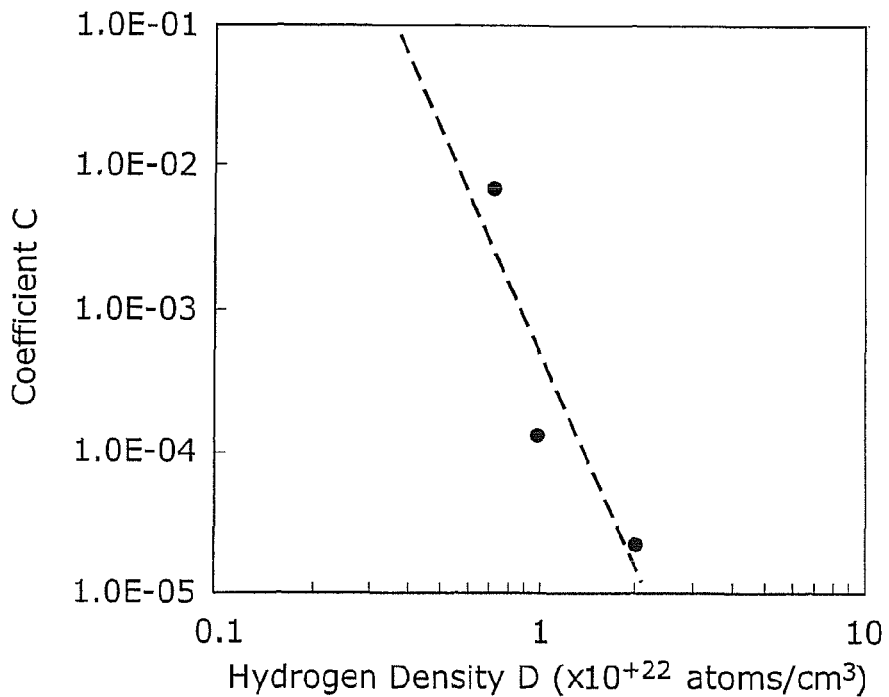
FIG. 27 is a characteristics graph plotting a relationship between a hydrogen density included in the current steering layer comprising $SiN_x$ and a constant C in Formula (7).

FIG. 27 is a graph plotting a relationship between a hydrogen density included in the current steering layer 33 comprising $SiN_x$ and a constant C in Formula (7). As seen in FIG. 27, the constant C in Formula (7) varies depending on the hydrogen density in the current steering layer comprising $SiN_x$. FIG. 27 shows that log (C) is almost proportional to log (D).

Based on the above experimental results, Formula (7) is examined in the case of the current steering layer 33 comprising $SiN_x$ added with hydrogen. As a result, it is learned that only the constant C in Formula (7) varies heavily depending on the added hydrogen density.

The current steering element 2 including the current steering layer 33 comprising $SiN_x$ added with hydrogen can terminate the state existing on the interfaces between the first electrode 32 and the current steering layer 33 and between the second electrode 31 and the current steering layer 33. As a result, the above current steering element 2 can reduce a leak current caused by the interface energy level. In addition, the above current steering element 2 can further reduce a sneak current in non-selected memory elements when data is written into a variable resistance element in a selected memory element.

Next, in the case of the current steering element 2 that is included in a nonvolatile memory element and includes the current steering layer 33 comprising $SiN_x$ added with hydrogen according to the present embodiment, an optimum relationship among a value of x, a thickness, and an added hydrogen density regarding the $SiN_x$ layer in the current steering layer 33 is described.

As described previously in the present embodiment, the current steering element 2 including the current steering layer 33 comprising $SiN_x$ has current-voltage characteristics that are varied depending on a value of x, a thickness, and an density of added hydrogen or fluorine regarding the $SiN_x$ layer. Appropriate adjustment of these conditions can provide the optimum current steering layer 33 serving in the current steering element 2 in the nonvolatile memory element.

Figure 28:
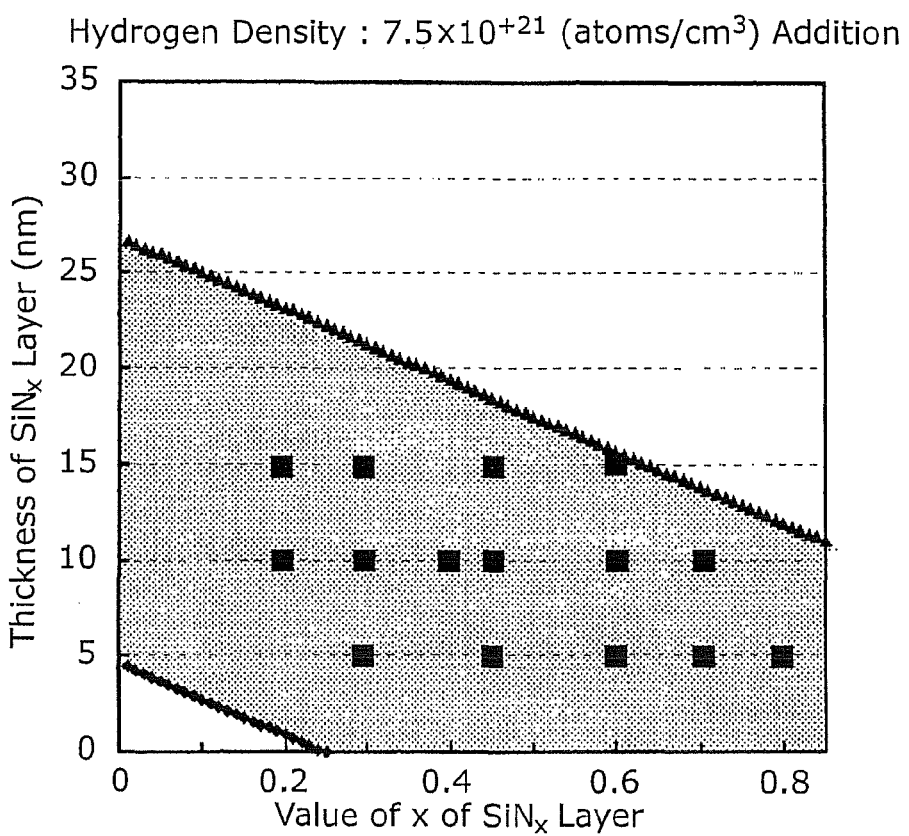
FIG. 28 is a characteristics graph plotting a combination of a thickness d and a nitrogen composition ratio x which satisfies Formula (8) and (11) at the same time, regarding the current steering layer comprising $SiN_x$ including hydrogen having a density of $0.75 \times 10^{22}$ (atoms/cm$^3$).
Figure 29:
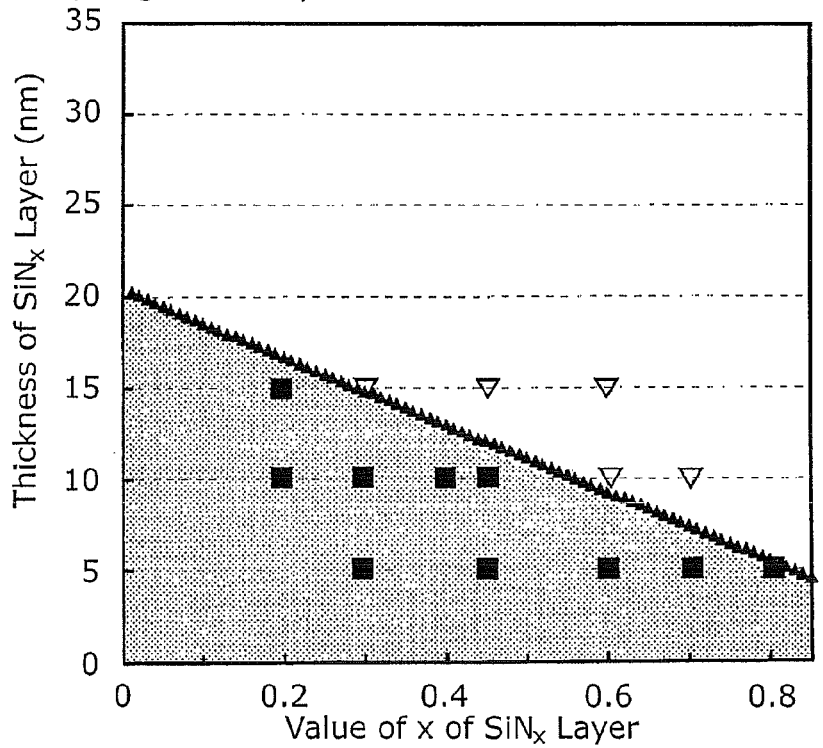
FIG. 29 is a characteristics graph plotting a combination of a thickness d and a nitrogen composition ratio x which satisfies Formula (8) and (11) at the same time, regarding the current steering layer comprising $SiN_x$ including hydrogen having a density of $1.0 \times 10^{22}$ (atoms/cm$^3$).
Figure 30:
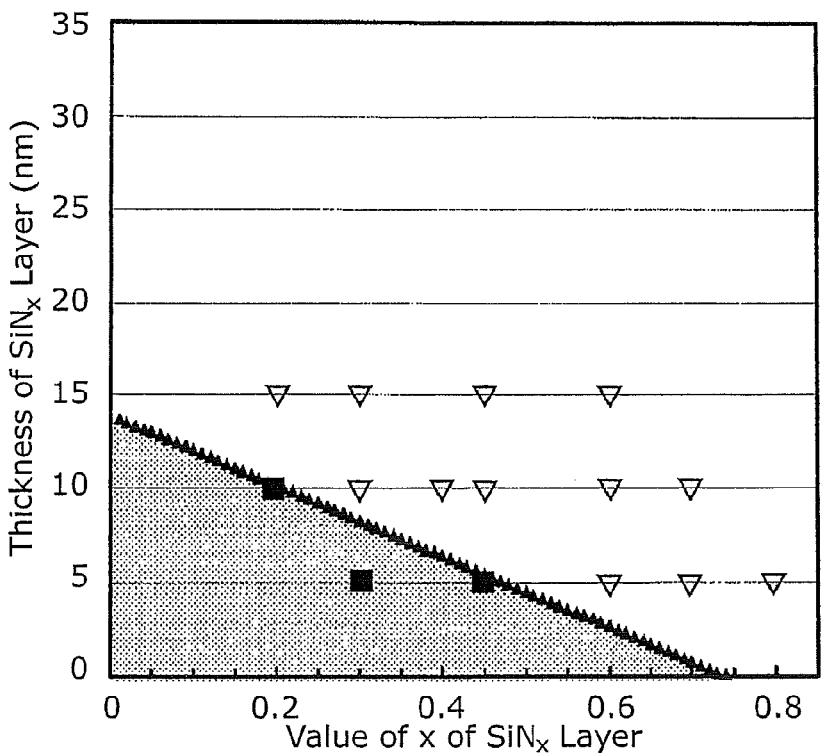
FIG. 30 is a characteristics graph plotting a combination of a thickness d and a nitrogen composition ratio x which satisfies Formula (8) and (11) at the same time, regarding the current steering layer comprising $SiN_x$ including hydrogen having a density of $2.0 \times 10^{22}$ (atoms/cm$^3$).

FIGS. 28, 29, and 30 are characteristics graphs plotting Formula (8) and (11) in the case of the current steering layer 33 comprising $SiN_x$ added with hydrogen according to the present embodiment. FIG. 28 is a graph in the case of the current steering layer 33 comprising $SiN_x$ added with hydrogen having a density of $0.75 \times 10^{22}$ (atoms/$cm^3$). FIG. 29 is a graph in the case of the current steering layer 33 comprising $SiN_x$ added with hydrogen having a density of $1.0 \times 10^{22}$ (atoms/$cm^3$). FIG. 30 is a graph in the case of the current steering layer 33 comprising $SiN_x$ added with hydrogen having a density of $2.0 \times 10^{22}$ (atoms/$cm^3$). As seen in FIGS. 28, 29, and 30, a range (range of combinations between a value of x and a thickness of a $SiN_x$ layer) of the optimum current steering layer 33 serving as the current steering element 2 in the nonvolatile memory element is varied depending on a density of hydrogen added in the current steering layer 33 comprising $SiN_x$.

Especially, when a density of the added hydrogen in FIG. 30 is $2.0 \times 10^{22}$ (atoms/$cm^3$), an appropriate range of combinations between a value of x and a thickness regarding a $SiN_x$ layer is reduced. However, the reduced range includes a range where the thickness of the $SiN_x$ layer is 5 nm or more and a value of x in $SiN_x$ is 0.2 or more. Therefore, it is determined that a density of the hydrogen included in the current steering layer 33 comprising $SiN_x$ should be $2.0 \times 10^{22}$ (atoms/$cm^3$) or less.

As described above, the present embodiment presents an optimum range of combinations between a value of x and a thickness regarding the current steering layer 33 serving in the current steering element 2 in a nonvolatile memory element. As a result, a density D of hydrogen added to the current steering layer 33 is desirably in a range of $0.75 \times 10^{22}$ (atoms/$cm^3$)$\leq D \leq 2.0 \times 10^{22}$ (atoms/$cm^3$).

Within the above limited range of the hydrogen density, a relational expression indicating a relationship between the constant C in Formula (7) and the hydrogen density D is determined based on the results of FIG. 27 by using a least-square method. As a result, the following relationship is established.

$$C = 5.23 \times 10^{-4} \times D_0^{-5.26} \quad (14)$$

where $D = D_0 \times 10^{22}$ atoms/$cm^3$

Moreover, fluorine has chemical characteristics similar to those of hydrogen. Therefore, it is considered that a relational expression that is the same as or similar to the above Formula (14) is established between the constant C in Formula (7) and a density D of fluorine. Therefore, whichever hydrogen or fluorine is added, it is considered that the following relational expression is established at least between the density D ($=D_0 \times 10^{22}$ atoms/$cm^3$) and the constant C in Formula (7).

$$C = k1 \times D_0^{k2} \quad (14\text{-}1)$$

However, k1 and k2 are constants determined depending on whether addition in the current steering layer 33 is hydrogen or fluorine. If hydrogen is added to the current steering layer 33, $k1 = 5.23 \times 10^{-4}$, and $k2 = -5.26$ as determined in Formula (14).

Furthermore, in order to eliminate influence of tunnel effects, the thickness of the $SiN_x$ layer may be restricted to be 5 nm or more. As a result, it is possible to offer a memory element and a memory in which the current steering element 2 has stable characteristics.

For conventional current steering elements, a value of x and a thickness of a current steering layer comprising $SiN_x$ are controlled to be within an appropriate range, in order to achieve desired current-voltage characteristics. On the other hand, the present invention is perceived based on the observation that addition of hydrogen or fluorine to the current steering layer 33 comprising $SiN_x$ varies the current-voltage characteristics of the current steering element 2. The current steering element 2 having the characteristics is applied to a nonvolatile memory element, and a memory including the nonvolatile memory elements. Then, for example, a value of x and a thickness of the current steering layer 33 comprising $SiN_x$ are measured in manufacturing process. Depending on variations of the value of x and the thickness which are caused in the manufacturing process, an appropriate density of hydrogen is added to the current steering layer 33. As a result, the manufactured current-voltage characteristics of the current steering elements 2 are homogenized, and stable provision of the current steering elements 2 is achieved.

Figure 31:
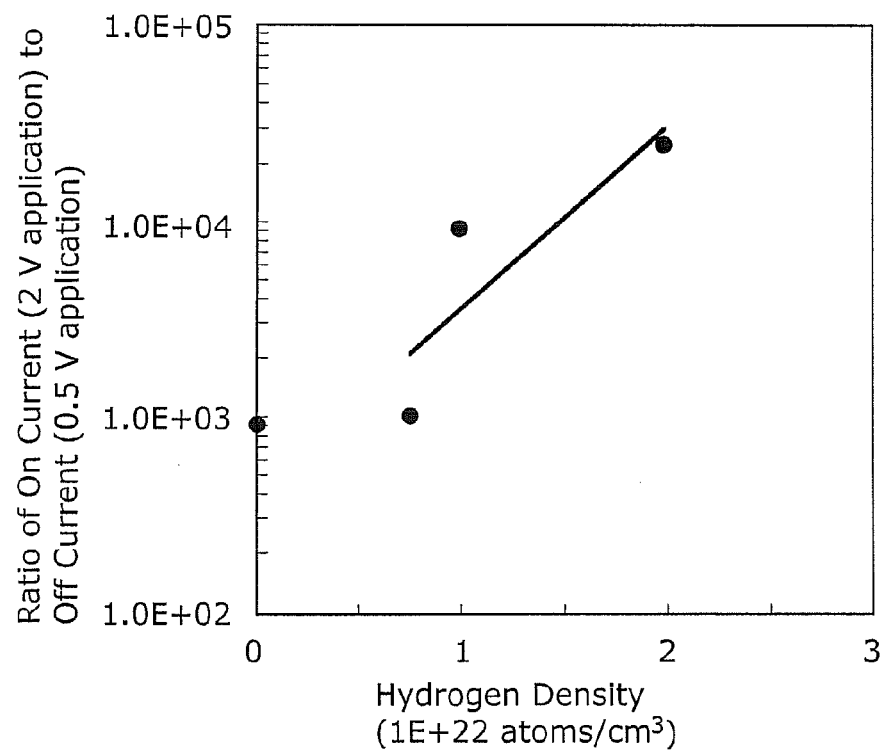
FIG. 31 is a graph plotting on-off characteristics of a current steering element according to the embodiment of the present invention.

FIG. 31 is a graph plotting on-off characteristics of the current steering element 2 according to the present embodiment. In FIG. 31, the vertical axis indicates a ratio of a current (ON current) flowing through the current steering element 2 at a voltage of 2V to a current (OFF current) flowing through the current steering element 2 at a voltage of 0.5 V, while the horizontal axis indicates a density of hydrogen added in the current steering layer 33. FIG. 31 plots experimental results of three kinds of the current steering elements 2: (a) a current steering element including a current steering layer comprising $SiN_x$ added with hydrogen having a density of $0.75 \times 10^{22}$ (atoms/$cm^3$), (b) a current steering element including a current steering layer comprising $SiN_x$ added with hydrogen having a density of $1.0 \times 10^{22}$ (atoms/$cm^3$), and (c) a current steering element including a current steering layer comprising $SiN_x$ added with hydrogen having a density of $2.0 \times 10^{22}$ (atoms/$cm^3$).

As obvious from the experimental data in FIG. 31, any current steering elements 2 satisfying the conditions where the hydrogen density D is $0.75 \times 10^{22}$ (atoms/cm$^3$)$\leq$D$\leq$$2.0 \times 10^{22}$ (atoms/cm$^3$) have significantly high on-off characteristics. Here, a higher hydrogen density results in higher on-off characteristics. Even when an electrical pulse with different polarities is applied, the current steering element 2 according to the present embodiment can prevent write didturb.

Figure 32:
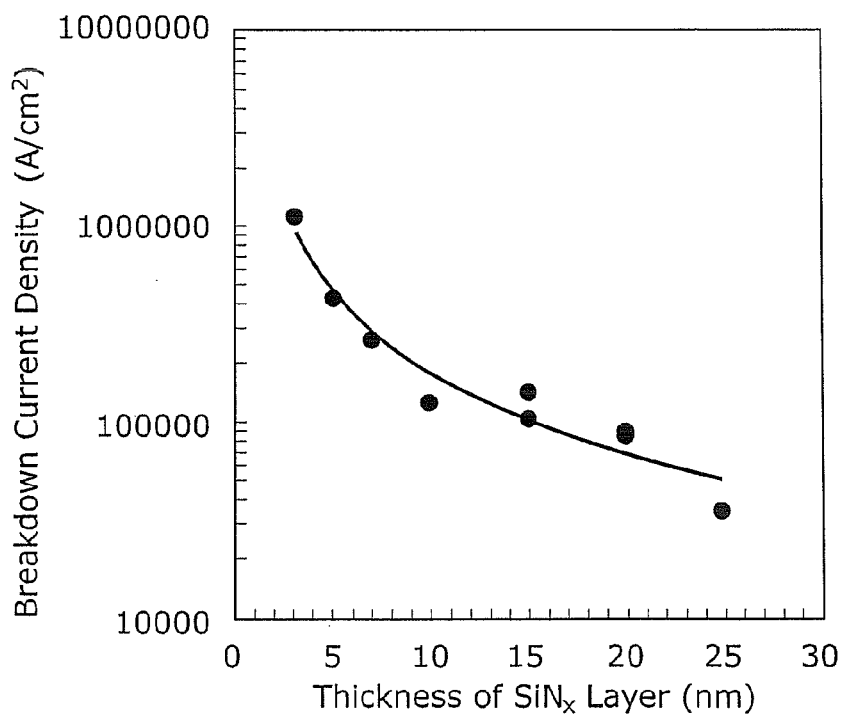
FIG. 32 is a graph plotting a relationship between (a) a breakdown current density (A/cm$^2$) of the current steering element and (b) a thickness (nm) of the current steering layer comprising $SiN_x$ according to the embodiment of the present invention.

FIG. 32 is a graph plotting a relationship between (a) a breakdown current density (A/cm$^2$) of the current steering element 2 and (b) a thickness (nm) of the current steering layer 33 comprising SiN$_x$ according to the present embodiment. The breakdown current density refers to a current density enough to cause breakdown of the current steering element 2 when a current flowing through the current steering element 2 is increased. As obvious from the experimental data in FIG. 32, as the current steering layer 33 comprising SiN$_x$ is thinner, the current density causing breakdown of the current steering element 2 is significantly increased to greatly enhance resistance to breakdown. This is because the thinner current steering layer 33 comprising SiN$_x$ can more easily diffuse Joule heat occurred in the current steering layer 33 into the first electrode 32 and the second electrode 31 and therefore further reduce heat accumulation in the current steering layer 33.

As described above, the present invention is conceived based on the observation that addition of hydrogen to the current steering layer 33 comprising SiN$_x$ varies an optimum range (hereinafter, referred to also simply as an "optimum range") of combinations between a value of x and a thickness regarding the SiN$_x$ layer of the current steering element 2 in a nonvolatile memory element. For example, the optimum range is as shown in FIG. 19 when the current steering layer 33 comprises SiN$_x$ without hydrogen addition. However, the optimum range is as shown in FIG. 28 when the current steering layer 33 comprises SiN$_x$ added with hydrogen having a density of $0.75 \times 10^{22}$ (atom/cm$^3$). Likewise, the optimum range is as shown in FIG. 29 when the current steering layer 33 comprises SiN$_x$ added with hydrogen having a density of $1.0 \times 10^{22}$ (atom/cm$^3$). Furthermore, when the current steering layer 33 comprises SiN$_x$ added with hydrogen having a density of $2.0 \times 10^{22}$ (atom/cm$^3$), the optimum range is as shown in FIG. 30. The current steering layers 33 comprising SiN$_x$ added with hydrogen of any density are within the optimum range in which a thickness of the SiN$_x$ layer is smaller than that of the current steering layer 33 without hydrogen addition. Therefore, addition of hydrogen to the current steering layer 33 comprising SiN$_x$ can decrease a thickness in the optimum range of the current steering layer 33. Thereby, a current density causing breakdown is increased to greatly enhance resistance to breakdown.

Figure 33A:
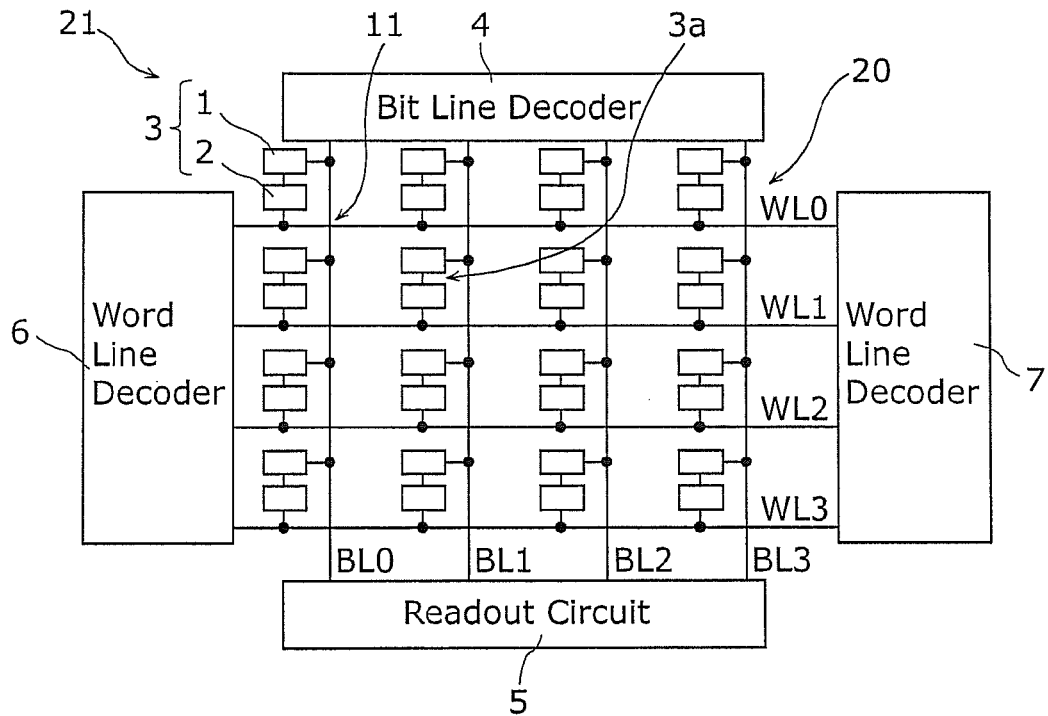
FIG. 33A is a block diagram schematically showing a structure of a memory including the current steering element according to the embodiment of the present invention.

The following describes the memory element and the memory according to the present embodiment. FIG. 33A is a block diagram schematically showing a structure of a memory 21 including memory elements 3 according to the present embodiment. Here, only structural elements necessary to explain the present embodiment are shown in FIG. 33A, and the other structural elements are not shown.

As shown in FIG. 33A, the memory 21 according to the present embodiment is a so-called crosspoint memory. The memory 21 includes a memory element array 20 and a peripheral circuit for driving the memory element array 20. The peripheral circuit includes, for example, a bit line decoder 4, a readout circuit 5, and word line decoders 6 and 7.

In general, the actual memory element array has a plurality of bit lines and a plurality of word lines. However, in order to more easily explain the structure of the memory element array, it is described hereinafter that the memory element array 20 includes four bit lines BL0 to BL3 and four word lines WL0 to WL3 as seen in FIG. 33A.

Figure 33B:
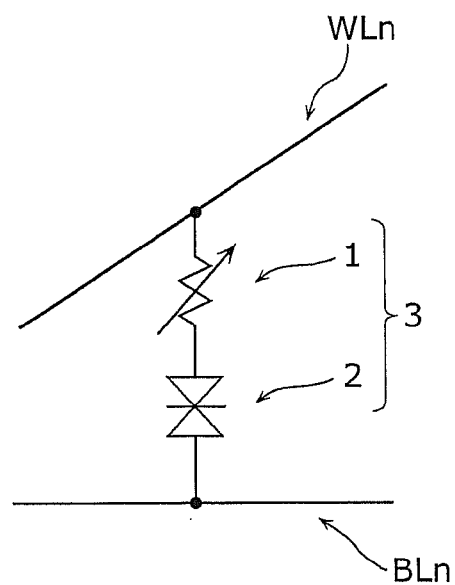
FIG. 33B is a diagram of an equivalent circuit of a memory element included in the memory according to the embodiment of the present invention.

In the memory element array 20 according to the present embodiment, the four bit lines BL0 to BL3 and four word lines WL0 to WL3 are arranged perpendicular to each other to be three-dimensionally crossed at respective crosspoints. A memory element (so-called memory cell) is provided at each of the crosspoints 11 of the four bit lines BL0 to BL3 and the four word lines WL0 to WL3. In other words, in the memory element array 20 according to the present embodiment, the memory elements 3 are arranged in a matrix by 4 columns and 4 rows. Here, as seen in an equivalent circuit of FIG. 33B, each of the memory elements 3 includes a series circuit in which a variable resistance element 1 and a current steering element 2 are connected in series to each other. The series circuit has one end connected to a bit line BLn (BL0 to BL3) at a corresponding one of the crosspoints 11, and the other end connected to a word line WLn (WL0 to WL3) at the corresponding one of the crosspoints 11.

Then, as shown in FIG. 33A, one end of each of the four bit lines BL0 to BL3 is connected to the bit line decoder 4. Furthermore, the other end of each of the bit lines BL0 to BL3 is connected to the readout circuit 5. On the other hand, one end of each of the four word lines WL0 to WL3 is connected to the word line decoder 6, and the other end of each of the four word lines WL0 to WL3 is connected to the word line decoder 7.

In the above-described memory 21, the bit line decoder 4 selects at least one of the bit lines BL0 to BL3 according to instructions from a controller (not shown). On the other hand, the word line decoders 6 and 7 select at least one of the word lines WL0 to WL3 according to the instructions from the controller. Then, the bit line decoder 4 and the word line decoders 6 and 7 apply an electrical pulse (correctly, voltage pulse) having a predetermined write voltage Vw or an electrical pulse (correctly, voltage pulse) having a predetermined read voltage Vr between the bit line(s) selected from the bit lines BL0 to BL3 and the word line(s) selected from the word lines WL0 to WL3, according to whether the instructions from the controller is data writing (hereinafter, referred to simply as "writing") or data reading (hereinafter, referred to simply as "reading"). In reading, the readout circuit 5 detects a current value of a current flowing through the bit line(s) selected from the bit lines BL0 to BL3. Then, the readout circuit 5 reads data from the selected memory element (selected memory element 3a) and provides the data to the controller. Here, the peripheral circuits including the bit line decoder 4, the readout circuit 5, the word line decoders 6 and 7 and the like shown in FIG. 33A may be configured by metal-oxide semiconductor field-effect transistors (MOSFET), for example. It should also be noted that the memory 21 is generally manufactured by semiconductor manufacturing process.

Each of the first electrode 32 and the second electrode 31 (shown in FIG. 2) included in the current steering element 2 according to the present embodiment is connected to one of electrodes (not shown) of the variable resistance element 1 and a corresponding one of the word lines WL0 to WL3. On the other hand, the other electrode (not shown) of the variable resistance element 1 is connected to a corresponding one of the bit lines BL0 to BL3. However, the memory element according to the present embodiment is not limited to the above structure. For example, it is also possible that the first electrode 32 (or the second electrode 31) in the current steering element 2 serves also as the other electrode of the variable resistance element 1.

The following described processing of the memory 21 according to the present embodiment in more detail with reference to corresponding figures.

Figure 34:
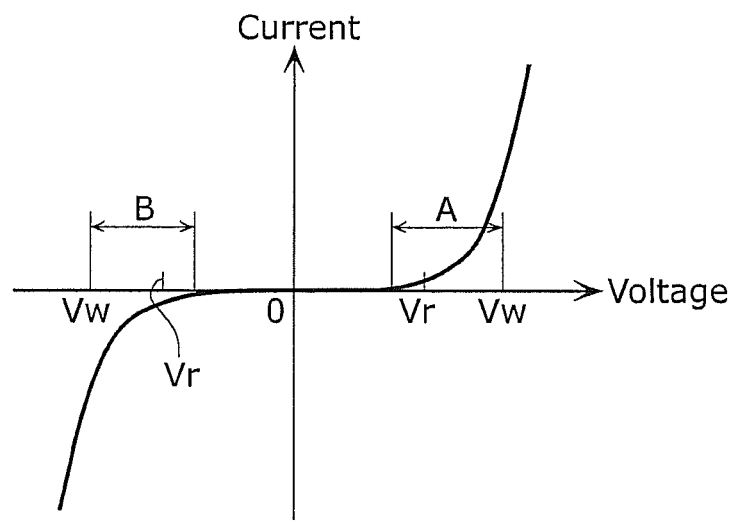
FIG. 34 is a graph schematically plotting current-voltage characteristics of a current steering element according to the embodiment of the present invention.

FIG. 34 is a graph schematically plotting current-voltage characteristics of the current steering element 2 according to the present embodiment of the present invention. In FIG. 34, Vw represents a write voltage, and Vr represents a read voltage.

According to the voltage-current characteristics of the current steering element 2 shown in FIG. 34, the write voltage Vw is set to have the following absolute value. The absolute value is equal to or higher than an absolute value of a critical voltage (a lower-limit voltage in a range A and an upper-limit voltage in a range B). In addition, the absolute value allows the write voltage Vw to change the variable resistance element 1 between a low resistance state and a high resistance state without breaking down the variable resistance element 1. According to the present embodiment, the write voltage Vw is the upper-limit voltage in the range A and the lower-limit voltage in the range B. Here, regarding the state of the variable resistance element 1, for example, application of a positive electrical pulse changes a low resistance state to a high resistance state, while application of a negative electrical pulse changes a high resistance state to a low resistance state.

On the other hand, according to the voltage-current characteristics of the current steering element 2 shown in FIG. 34, the read voltage Vr is set to have the following absolute value. The absolute value of the read voltage Vr is equal to or higher than the absolute value of the critical voltage. In addition, the absolute value prevents the read voltage Vr from changing the variable resistance element 1 between a low resistance state and a high resistance state. More specifically, according to the present embodiment, the read voltage Vr is set to be a predetermined voltage in the ranges A and B shown in FIG. 34.

The memory 21 shown in FIG. 33A is controlled by the controller (not shown). More specifically, when a writing instruction is issued from the controller to the memory 21, the bit line decoder 4 selects one of the bit lines BL0 to BL3 according to an address designated in the writing instruction. On the other hand, the word line decoders 6 and 7 select one of the word lines WL0 to WL3 according to an address designated in the writing instruction. As a result, a memory element 3 to which data is to be written is selected. Then, the bit line decoder 4 and the word line decoders 6 and 7 cooperate each other to apply an electrical pulse of the write voltage Vw corresponding to the data (here, "1" or "0") designated in the writing instruction, between the bit line selected from the bit lines BL0 to BL3 and the word line selected from the word lines WL0 to WL3. As a result, the designated data is written to the memory element 3 having the address designated in the writing instruction. The application of the write voltage Vw will be described in more detail later.

On the other hand, when a reading instruction is issued from the above-described controller to the memory 21, the bit line decoder 4 selects one of the bit lines BL0 to BL3 according to an address designated in the reading instruction. The word line decoders 6 and 7 select one of the word lines WL0 to WL3 according to an address designated in the reading instruction. As a result, a memory element 3 from which data is to be read is selected. Then, the bit line decoder 4 and the word line decoders 6 and 7 cooperate each other to apply an electrical pulse of the predetermined read voltage Vr between the bit line selected from the bit lines BL0 to BL3 and the word line selected from the word lines WL0 to WL3. Then, the readout circuit 5 detects a current flowing through the bit line selected from the bit lines BL0 to BL3. Based on the detected current, the readout circuit 5 determines whether or not data stored in the selected memory element 3 has a value of "1" or "0". The readout circuit 5 reads the detected data of "1" or "0" and provides the data to the controller. The application of the read voltage Vr will be described in more detail later.

The following describes application of the write voltage Vw and application of the read voltage Vr in more detail with reference to the corresponding figures.

Figure 35:
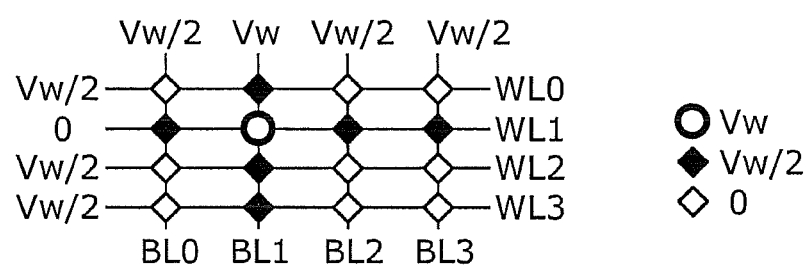
FIG. 35 is a diagram schematically showing application of a write voltage according to the embodiment of the present invention.

FIG. 35 is a diagram schematically showing details of application of the write voltage according to the present embodiment. It is assumed in the following description that a memory element 3 provided at a crosspoint 11 between the bit line BL1 and the word line WL1. Hereinafter, the selected memory element 3 is referred to as a "selected element". The following describes the processing in the case where data is written to the selected element (one of the memory elements 3 in FIG. 22A).

In FIG. 35, the vertical lines show the bit lines BL0, BL1, BL2, and BL3, sequentially from the left side. An upper end of each of the bit lines holds a voltage value of a voltage applied to the corresponding bit line. The horizontal lines show the word lines WL0, WL1, WL2, and WL3, sequentially from the top. A left end of each of the word lines holds a voltage value of a voltage applied to the corresponding word line.

FIG. 35 shows an absolute value of a potential difference between voltages applied to both ends of a corresponding memory element 3. The absolute value is shown as a graphic at a corresponding crosspoint between the vertical line and the horizontal line. Here, each of the memory elements 3 is provided at a corresponding one of the crosspoints 11 between the bit lines BL0 to BL3 and the word lines WL0 to WL3 included in the memory element array 20 in a matrix by 4 rows and 4 columns. It is obvious from FIG. 35 that all of absolute values of the potential difference between both ends of the respective other memory elements 3 except the selected memory element (the memory element 3 positioned at the crosspoint 11 between the bit line BL1 and the word line WL1) are Vw/2 or 0, so that data is not written to the memory elements except the selected memory elements when data is to be written to the selected memory element.

More specifically, according to the present embodiment, the bit line decoder 4 applies the write voltage Vw to the bit line BL1 connected to the selected memory element. In addition, the word line decoder 7 applies a voltage of 0 to the word line WL1 connected to the selected element. Thereby, the current steering element 2 in the selected memory element 3 is conducted. Then, an enough current flows through the variable resistance element 1 to change the resistance state of the variable resistance element 1. As a result, the resistance value of the variable resistance element 1 changes to the high resistance state or the low resistance state.

On the other hand, there are a set of memory elements 3 in a column direction where the memory elements 3 are connected to the same bit line BL1 but not connected to the same word line WL1. More specifically, these memory elements 3 are arranged at respective crosspoints 11 between the bit line BL1 and each of the word lines WL0, WL2, and WL3. For such memory elements, only a bit line among the bit lines and the word lines is selected. Therefore, these memory elements are called half-selected memory elements (BL selection). Then, like the selected element, the bit line decoder 4 applies the voltage Vw to the bit line BL1 connected to the half-selected elements (BL selection), while the word line decoders 6 and 7 apply a voltage of Vw/2 to the word line group (the word lines WL0, WL2, and WL3). Thereby, a potential difference between both ends of each of the half-selected elements (BL selection) is Vw/2.

On the other hand, there are a set of memory elements 3 in a row direction where the memory elements 3 are connected to the same word line WL1 but not connected to the same bit line BL1. More specifically, these memory elements 3 are arranged at respective crosspoints 11 between the word line WL1 and each of the bit lines BL0, BL2, and BL3. For such memory elements, only a word line among the bit lines and the word lines is selected. Therefore, these memory elements are called half-selected memory elements (WL selection). Then, like the selected element, the word line decoder 7 applies a voltage of 0 to the word line WL1 connected to the half-selected elements (WL selection), while the bit line decoder 4 applies a voltage of Vw/2 to the bit line group (the bit lines BL0, BL2, and BL3). Thereby, a potential difference between both ends of each of the half-selected elements (WL selection) is Vw/2.

According to the present embodiment, the current steering element 2 is designed so that a potential difference of Vw/2 between voltages applied to both ends of each of the half-selected memory elements causes the current steering element 2 to be in blocking state (state where a considerably small amount of current flows through the current steering element 2). Therefore, the current hardly flows in the variable resistance element 1 in each of the half-selected memory elements. As a result, data is not written to the variable resistance element 1 in each of the half-selected memory elements. In other words, according to the present embodiment, the write voltage Vw is set to cause a considerably small amount of current to flow through the variable resistance element 1 in each of the half-selected memory elements at the potential difference of Vw/2 between voltages applied to both ends of each of the half-selected memory elements. As a result, it is possible to prevent data from being written to the half-selected memory elements.

Meanwhile, a voltage of Vw/2 is applied to both ends of each of non-selected memory elements (memory elements 3 provided at crosspoints 11 between the bit lines BL0, BL2, and BL3 and the word lines WL0, WL2, and WL3). Therefore, there is no potential difference between both ends of each of non-selected memory elements 3. As a result, data is not written to the variable resistance element 1 in each of the non-selected memory elements. Thus, data is written only to a selected memory element, not to the half-selected and non-selected memory elements. This means that write didturb can be prevented.

In reading data, the read voltage Vr is applied to the bit line BL1 connected to the selected memory element, and a voltage of 0 is applied to the word line WL1 connected to the selected memory element. Here, a voltage of Vr/2 is applied to non-selected memory elements, likewise the situation of the data writing. In other words, the write voltage Vw in FIG. 34 is replaced by the read voltage Vr. As a result, data is read from the selected memory element 3.

As described above, a voltage of an electrical pulse is set in data writing to a target memory element 3, so that a voltage having a large absolute value is applied to a target variable resistance element and a voltage having a small absolute value is applied to the other variable resistance elements. As a result, a large current flows through the target variable resistance element to which data is to be written, and a current hardly flows through the other variable resistance elements. Therefore, even if the variable resistance elements comprise metallic oxide, data is surely written to the selected memory element and no data is written to the other memory elements.

Moreover, the current steering element 2 according to the present embodiment of the present invention has the same electrical resistance characteristics as those of MIM diodes, varistors, and the like, at a voltage having either a positive polarity or a negative polarity. Therefore, even if a write electrical pulse having different polarities is applied, a sneak current is surely prevented. It is therefore possible to surely prevent write didturb in the memory 21.

Moreover, according to the present invention, the current steering element 2 can be manufactured by semiconductor manufacturing process and semiconductor manufacturing facility. Therefore, it is possible to easily miniaturize the current steering element 2 and increase the quality of the current steering element 2. As a result, it is possible to achieve miniaturization and quality increase of the memory element, to which data is written by pulsing with different polarities, and the memory 21 in which the memory elements are arranged in a matrix.

The above has described the embodiment of the current steering element, the memory element, and the memory according to the present invention. However, the present invention is not limited to the above embodiment. For example, those skilled in the art will be readily appreciate that various modifications of the embodiment are intended to be included within the scope of the present invention.

The present invention can be implemented not only as the current steering element 2, the memory element 3, and the memory 21, but also as a method of manufacturing the current steering element 2, the memory element 3, and the memory 21.

Figure 36:
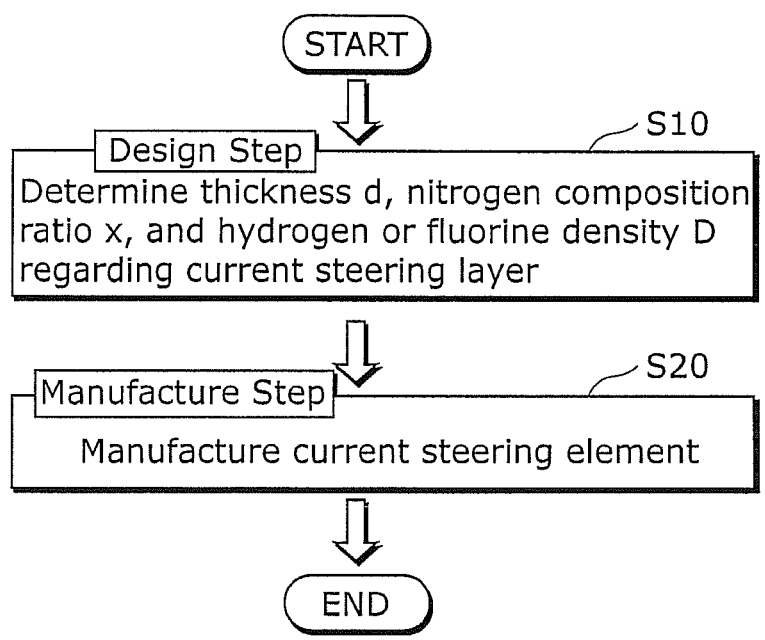
FIG. 36 is a flowchart of all steps in a method of manufacturing the current steering element according to the embodiment of the present invention.
Figure 37:
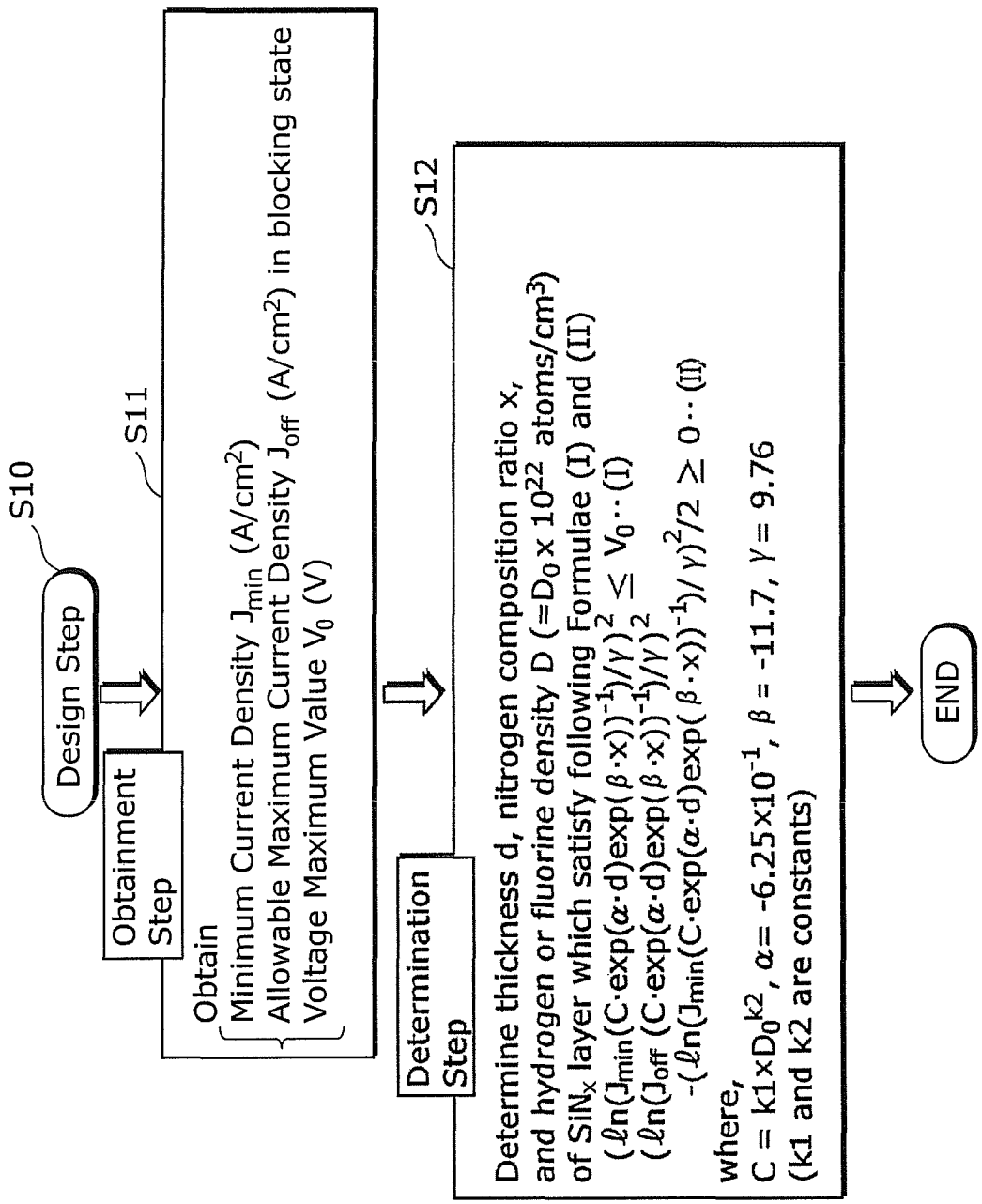
FIG. 37 is a flowchart of detailed steps in Design Step S10 in FIG. 36.
Figure 38:
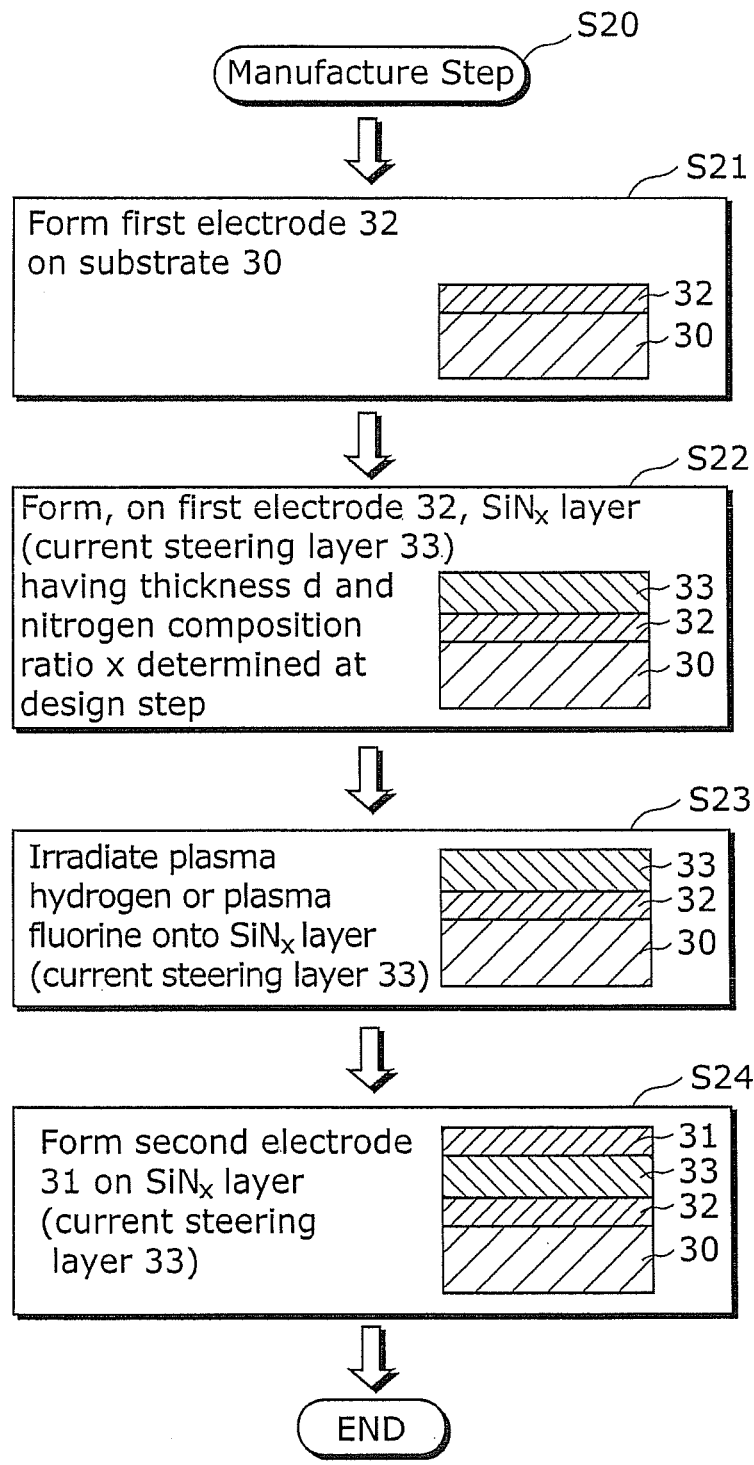
FIG. 38 is a flowchart of detailed steps in Manufacture Step S20 in FIG. 36.

The following describes the method of manufacturing the current steering element 2 according to the embodiment of the present invention with reference to FIGS. 36 to 38.

FIG. 36 is a flowchart of all steps in the method of manufacturing the current steering element 2 according to the present embodiment. The manufacturing method is a method of manufacturing the current steering element 2 that includes the first electrode 32, the second electrode 31, and the current steering layer 33 comprising $SiN_x$ provided between the first electrode 32 and the second electrode 31 (see FIG. 2) and that suppresses a current flowing when an electrical pulse having a positive polarity or a negative polarity is applied. The manufacturing method includes a design step S10 and a manufacture Step S20. At the design step S10, a thickness d (nm) of the current steering layer 33, a nitrogen composition ratio x of $SiN_x$, and a density D (where $D=D_0 \times 10^{22}$ atoms/cm$^3$) of added hydrogen or fluorine are determined. At the manufacture Step S20, the current steering element 2 is manufactured according to the thickness d and the nitrogen composition ratio x which are determined at the design step S10.

FIG. 37 is a flowchart of detailed steps in the design step S10 in FIG. 36. At the design step S10, first, a minimum current density $J_{min}$ (A/cm$^2$), a maximum current density $J_{off}$ (A/cm$^2$), and a voltage maximum value $V_0$ (V) are obtained or determined as required specification (Obtainment Step S11). The minimum current density $J_{min}$ is a minimum current density of a current to flow through the current steering element 2. The maximum current density $J_{off}$ is a maximum current density of a current flowable in the current steering element 2 in blocking state. The voltage maximum value $V_0$ is a maximum value of a voltage applicable to both ends of the current steering element 2, in other words, a maximum value of a voltage applicable between the first electrode 32 and the second electrode 31. Then, based on the obtained or determined current density $J_{min}$, current density $J_{off}$ and the voltage maximum value $V_0$, the thickness d and the nitrogen composition ratio x which satisfy the range expressed by the following Formulae (15) and (16) are determined (Determination Step S12).

$$(\ln(J_{min}(C \cdot \exp(\alpha \cdot d)\exp(\beta \cdot x))^{-1}/\gamma)^2 \leq V_0 \quad (15)$$

$$(\ln(J_{off}(C \cdot \exp(\alpha \cdot d)\exp(\beta \cdot x))^{-1})/\gamma)^2 - (\ln(J_{min}(C \cdot \exp(\alpha \cdot d)\exp(\beta \cdot x))^{-1})/\gamma)^2/2 \geq 0 \quad (16)$$

wherein $C=k1 \times D_0{}^{k2}$, $\alpha=-6.25 \times 10^{-1}$, $\beta=-11.7$, and $\gamma=9.76$.

Here, k1 and k2 are constants determined depending whether addition to the current steering layer 33 is hydrogen or fluorine. If hydrogen is added to the current steering layer 33, $k1=5.23 \times 10^{-4}$ and $k2=-5.26$ as determined in the above Formula (14).

At the determination step S12, the thickness d, the nitrogen composition ratio x, and the hydrogen density D are determined so that the thickness d satisfies 5 nm or more, the nitrogen composition x satisfies $0 < x \leq 0.85$, and the hydrogen density D satisfies $0.75 \times 10^{22}$ (atoms/cm$^3$) $\leq D \leq 2.0 \times 10^{22}$ (atoms/cm$^3$), for example.

FIG. 38 is a flowchart of detailed steps in the manufacture step S20 in FIG. 36. At the manufacture step S20, first, the first electrode 32 comprising tantalum nitride or α-tungsten is formed on the substrate 30 (S21). Next, on the formed first electrode 32, a SiN$_x$ layer (the current steering layer 33) having the thickness d and the nitrogen composition ratio x which are determined at the determination step S10 is formed (S22). Hydrogen or fluorine energized into plasma is irradiated to the SiN$_x$ layer (S23). On the resulting SiN$_x$ layer (the current steering layer 33), the second electrode 31 comprising tantalum nitride or α-tungsten is formed (S24). It should be noted that details (manufacturing conditions such as temperature and pressure) of each of the steps S21 to S24 have already been described as the "method of manufacturing the current steering element".

As described above, in the method of manufacturing the current steering element 2 according to the present embodiment, the thickness d and the nitrogen composition ratio x of the current steering layer 33 are previously determined at the design step S10, so that the minimum current density of a current to flow through the current steering element 2 is ensured (see Formula (15)) and a current density of a current in blocking state is surely smaller than an allowable value (see Formula (16)). Then, at the manufacture Step S20, the current steering element 2 is manufactured according to the determined thickness d and nitrogen composition ratio x. The memory cell, in which the current steering element 2 manufactured by the above method and the variable resistance element 1 are connected to each other, can ensure that data is surely written when the memory cell is selected to be written, and that data is not written when the memory cell is not selected. Therefore, it is possible to prevent write didturb even if an electrical pulse having different polarities is applied. Furthermore, it is possible to provide the memory element 3, and the memory 21 which can cause a large current to flow through the variable resistance element 1 and write data into the variable resistance element 1 without any problem.

INDUSTRIAL APPLICABILITY

The current steering element according to the present invention, and the memory element including the current steering element according to the present invention and the variable resistance element can prevent write didturb even if an electrical pulse having different polarities is applied. The current steering element according to the present invention can cause a large current to flow through the variable resistance element. In addition, the current steering element according to the present invention can cause data to be written into the current steering element without causing write didturb. Therefore, the current steering element according to the present invention has enough industrial applicability, especially when it is used in a nonvolatile memory cell in an electronic device such as a mobile information device or an information home appliance.

NUMERICAL REFERENCES 1 variable resistance element
2 current steering element
3 memory element
3a memory element (selected memory element)
4 bit line decoder
5 readout circuit
6, 7 word line decoder
11 crosspoint
20 memory element array
21 memory
30 substrate
31 second electrode
32 first electrode
33 current steering layer
BL0 to BL3 bit line
WL0 to WL3 word line

The invention claimed is:

1. A current steering element that controls a current flowing when an electrical pulse with positive and negative polarities is applied, said current steering element comprising:
   a first electrode;
   a second electrode; and
   a current steering layer provided between said first electrode and said second electrode,
   wherein said current steering layer comprises:
   SiN$_x$ (where $0 < x \leq 0.85$); and
   hydrogen, and
   when D (D=D$_0 \times 10^{22}$ atoms/cm$^3$) represents a density of the hydrogen, d (nm) represents a thickness of said current steering layer, V$_0$ (V) represents a maximum value applicable to both of said first electrode and said second electrode, and x, D, d, and V$_0$ satisfy Formulae (1) and (2):

$$(\ln(10000(C \cdot \exp(\alpha \cdot d)\exp(\beta \cdot x))^{-1})/\gamma)^2 \leq V_0 \quad (1)$$

$$(\ln(1000(C \cdot \exp(\alpha \cdot d)\exp(\beta \cdot x))^{-1})/\gamma)^2 - (\ln(10000(C \cdot \exp(\alpha \cdot d)\exp(\beta \cdot x))^{-1})/\gamma)^2/2 \geq 0 \quad (2)$$

wherein $C=k1 \times D_0{}^{k2}$, $\alpha=-6.25 \times 10^{-1}$, $\beta=-11.7$, $\gamma=9.76$, $k1=5.23 \times 10^{-4}$, and $k2=-5.26$.

2. The current steering element according to claim 1, wherein the density D of the hydrogen satisfies $0.75 \times 10^{22}$ (atoms/cm$^3$) $\leq D \leq 2.0 \times 10^{22}$ (atoms/cm$^3$).

3. The current steering element according to claim 1, wherein the thickness d is 5 nm or more.

4. The current steering element according to claim 3, wherein the thickness d ranges from 5 nm to 30 nm.

5. The current steering element according to claim 1, wherein the maximum V$_0$ of the voltage applicable between said first electrode and said second electrode is 5 V or less.

6. A memory element comprising:
   a nonvolatile variable resistance element having an electrical resistance value varying when an electrical pulse with one of a positive polarity and a negative polarity is applied; and said current steering element according to claim 1, said current steering element being connected in series to said nonvolatile variable resistance element to control a current flowing through said nonvolatile variable resistance element when the electrical pulse is applied to said nonvolatile variable resistance element.

7. A memory, comprising:

a plurality of bit lines;

a plurality of word lines arranged to be three-dimensionally crossed with said bit lines at crosspoints; and a plurality of memory elements including said memory element according to claim 6, wherein each of said memory elements is arranged at a corresponding one of the crosspoints, and the each of said memory elements having one end connected to a corresponding one of said bit lines and an other end connected to a corresponding one of said word lines at the corresponding one of the crosspoints.

* * * * *